US012476186B2

(12) United States Patent
Miyamoto et al.

(10) Patent No.: US 12,476,186 B2
(45) Date of Patent: Nov. 18, 2025

(54) THREE-DIMENSIONAL MEMORY DEVICE CONTAINING INTEGRATED CONTACT-AND-SUPPORT ASSEMBLIES AND METHODS OF MAKING THE SAME

(71) Applicant: SANDISK TECHNOLOGIES LLC, Addison, TX (US)

(72) Inventors: Masato Miyamoto, Yokkaichi (JP); Hiroyuki Ogawa, Yokkaichi (JP); Tomohiro Kubo, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 385 days.

(21) Appl. No.: 18/351,828

(22) Filed: Jul. 13, 2023

(65) Prior Publication Data
US 2024/0213145 A1 Jun. 27, 2024

Related U.S. Application Data

(60) Provisional application No. 63/476,448, filed on Dec. 21, 2022.

(51) Int. Cl.
*H01L 23/522* (2006.01)
*G11C 16/04* (2006.01)
(Continued)

(52) U.S. Cl.
CPC ...... *H01L 23/5226* (2013.01); *G11C 16/0483* (2013.01); *H01L 23/5283* (2013.01);
(Continued)

(58) Field of Classification Search
CPC . H01L 23/5226; H01L 23/5283; H10B 41/10; H10B 41/35; H10B 41/27;
(Continued)

(56) References Cited

U.S. PATENT DOCUMENTS 5,915,167 A 6/1999 Leedy
8,324,730 B2 * 12/2012 Koike ............... H01L 21/76864
438/653
(Continued)

FOREIGN PATENT DOCUMENTS

DE 102016101777 A1 * 7/2017 ....... H01L 21/76808
KR 10-2022-0151337 11/2022
KR 20220151337 A 11/2022

OTHER PUBLICATIONS

ISR—Notification of Transmittal of The International Search Report and Written Opinion of the International Searching Authority for International Patent Application No. PCT/US2023/077112, mailed Feb. 2, 2024, 8 pages.
(Continued)

*Primary Examiner* — Kwin Xie
(74) *Attorney, Agent, or Firm* — THE MARBURY LAW GROUP PLLC

(57) ABSTRACT

A semiconductor structure includes an alternating stack of insulating layers and electrically conductive layers, memory openings vertically extending through the alternating stack, memory opening fill structures including a vertical channel and memory elements located in the memory openings, a contact via cavity vertically extending through the alternating stack, and an integrated contact-and-support assembly located in the contact via cavity. The integrated contact-and-support assembly includes a dielectric support pillar and a conductive layer contact via structure electrically contacting a top surface of a first electrically conductive layer of the electrically conductive layers that surrounds the contact via cavity. A dielectric spacer is located in the contact via cavity, covering a sidewall of the first electrically conductive layer in the contact via cavity, and extending above the top surface of the first electrically conductive layer.

20 Claims, 71 Drawing Sheets

(51) Int. Cl.
*H01L 23/528* (2006.01)
*H10B 41/10* (2023.01)
*H10B 41/27* (2023.01)
*H10B 41/35* (2023.01)
*H10B 43/10* (2023.01)
*H10B 43/27* (2023.01)
*H10B 43/35* (2023.01)

(52) U.S. Cl.
CPC ............ *H10B 41/10* (2023.02); *H10B 41/27* (2023.02); *H10B 41/35* (2023.02); *H10B 43/10* (2023.02); *H10B 43/27* (2023.02); *H10B 43/35* (2023.02)

(58) Field of Classification Search
CPC ........ H10B 43/35; H10B 43/10; H10B 43/27; G11C 16/0483
USPC ........................................................ 257/314
See application file for complete search history.

(56) References Cited

U.S. PATENT DOCUMENTS

| | | | |
|---|---|---|---|
| 8,674,515 B2* | 3/2014 | Farooq | H01L 21/76898 |
| | | | 257/E21.585 |
| 8,884,357 B2* | 11/2014 | Wang | H10D 30/693 |
| | | | 257/324 |
| 9,786,681 B1 | 10/2017 | Ariyoshi | |
| 9,853,038 B1 | 12/2017 | Cui | |
| 10,304,852 B1 | 5/2019 | Cui et al. | |
| 10,355,009 B1 | 7/2019 | Kai et al. | |
| 10,381,362 B1 | 8/2019 | Cui et al. | |
| 10,388,666 B1 | 8/2019 | Kai et al. | |
| 10,453,798 B2 | 10/2019 | Tsutsumi et al. | |
| 10,453,854 B2 | 10/2019 | Kanno et al. | |
| 10,461,163 B2* | 10/2019 | Kanakamedala | H10B 43/50 |
| 10,490,569 B2 | 11/2019 | Mushiga et al. | |
| 10,580,783 B2 | 3/2020 | Cui et al. | |
| 10,608,010 B2 | 3/2020 | Terasawa et al. | |
| 10,700,089 B1 | 6/2020 | Hojo et al. | |
| 10,727,248 B2 | 7/2020 | Kaminaga | |
| 10,892,267 B2 | 1/2021 | Mushiga et al. | |
| 10,903,230 B2 | 1/2021 | Kaminaga et al. | |
| 11,282,783 B2 | 3/2022 | Otsu et al. | |
| 11,637,038 B2 | 4/2023 | Amano et al. | |
| 2012/0126425 A1* | 5/2012 | Farooq | H01L 25/50 |
| | | | 257/E23.174 |
| 2017/0287926 A1 | 10/2017 | Ariyoshi | |
| 2018/0174960 A1 | 6/2018 | Smith et al. | |
| 2018/0226423 A1 | 8/2018 | Kang et al. | |
| 2019/0148392 A1 | 5/2019 | Kanno et al. | |
| 2019/0148506 A1 | 5/2019 | Kanakamedala et al. | |
| 2019/0280001 A1 | 9/2019 | Terasawa et al. | |
| 2020/0006131 A1 | 1/2020 | Shimabukuro et al. | |
| 2020/0027801 A1* | 1/2020 | Chafik | H01L 22/34 |
| 2021/0210428 A1 | 7/2021 | Ohsawa et al. | |
| 2021/0210503 A1 | 7/2021 | Matsuno et al. | |
| 2021/0210504 A1 | 7/2021 | Otsu et al. | |
| 2021/0233851 A1* | 7/2021 | Chun | H10D 88/01 |
| 2022/0013504 A1* | 1/2022 | Dabral | H01L 23/60 |
| 2022/0230917 A1 | 7/2022 | Amano et al. | |

OTHER PUBLICATIONS

IPRP-WO—Notification Concerning Transmittal of International Preliminary Report On Patentability and Written Opinion of the International Searching Authority for International Patent Application No. PCT/US2023/077112, mailed Jul. 3, 2025, 7 pages.

Endoh et al., "Novel Ultra High-Density Memory with a Stacked-Surrounding Gate Transistor (S-SGT) Structured Cell," IEDM Proc. (2001) 33-36.

U.S. Appl. No. 17/355,883, filed Jun. 23, 2021, SanDisk Technologies LLC.

U.S. Appl. No. 17/411,689, filed Aug. 25, 2021, SanDisk Technologies LLC.

U.S. Appl. No. 17/411,726, filed Aug. 25, 2021, SanDisk Technologies LLC.

U.S. Appl. No. 17/516,588, filed Nov. 1, 2021, SanDisk Technologies LLC.

U.S. Appl. No. 17/525,233, filed Nov. 12, 2021, SanDisk Technologies LLC.

U.S. Appl. No. 17/654,465, filed Mar. 11, 2022, SanDisk Technologies LLC.

U.S. Appl. No. 17/662,926, filed May 11, 2022, SanDisk Technologies LLC.

U.S. Appl. No. 17/682,515, filed Feb. 28, 2022, SanDisk Technologies LLC.

U.S. Appl. No. 17/682,550, filed Feb. 28, 2022, SanDisk Technologies LLC.

U.S. Appl. No. 17/822,182, filed Aug. 25, 2022, SanDisk Technologies LLC.

U.S. Appl. No. 17/857,335, filed Jul. 5, 2022, SanDisk Technologies LLC.

U.S. Appl. No. 17/857,375, filed Jul. 5, 2022, SanDisk Technologies LLC.

* cited by examiner

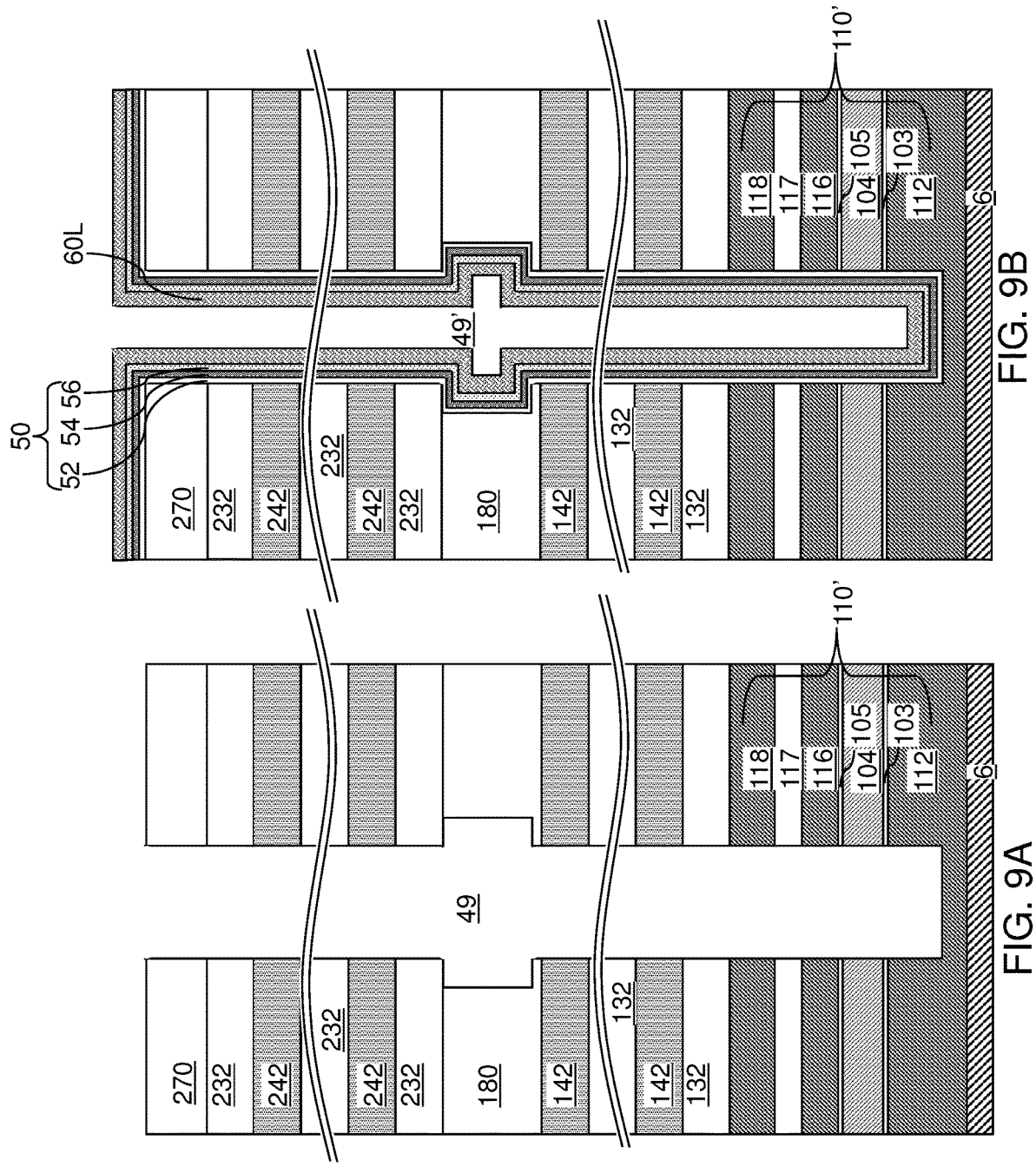

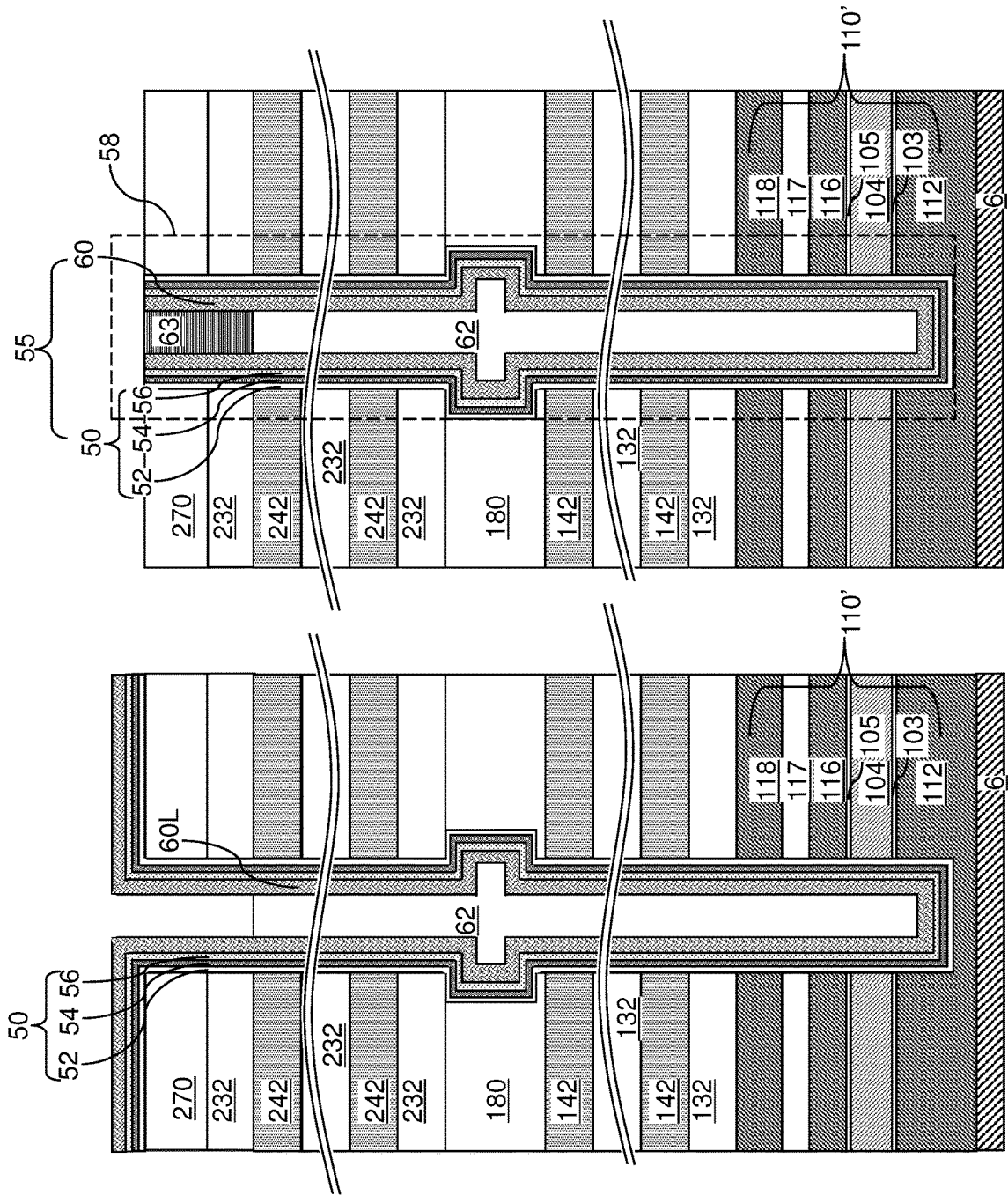

THREE-DIMENSIONAL MEMORY DEVICE CONTAINING INTEGRATED CONTACT-AND-SUPPORT ASSEMBLIES AND METHODS OF MAKING THE SAME

FIELD

The present disclosure relates generally to the field of semiconductor devices, and particularly to a three-dimensional memory device including integrated contact-and-support assemblies and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a semiconductor structure includes an alternating stack of insulating layers and electrically conductive layers, memory openings vertically extending through the alternating stack, memory opening fill structures including a vertical channel and memory elements located in the memory openings, a contact via cavity vertically extending through the alternating stack, and an integrated contact-and-support assembly located in the contact via cavity. The integrated contact-and-support assembly includes a dielectric support pillar and a conductive layer contact via structure electrically contacting a top surface of a first electrically conductive layer of the electrically conductive layers that surrounds the contact via cavity. A dielectric spacer is located in the contact via cavity, covering a sidewall of the first electrically conductive layer in the contact via cavity, and extending above the top surface of the first electrically conductive layer.

According to another aspect of the present disclosure, a method of forming a semiconductor structure includes forming an alternating stack of insulating layers and sacrificial material layers; forming memory stack structures through the alternating stack, wherein each of the memory stack structures comprises a respective vertical semiconductor channel and a respective vertical stack of memory elements formed at levels of the sacrificial material layers, forming a stepped via cavity through the alternating stack such that an annular surface of a first sacrificial material layer of the sacrificial material layers around the stepped via cavity is physically exposed, forming a sacrificial annular plate by selectively growing a sacrificial plate material from the physically exposed annular surface of the first sacrificial material layer, replacing the sacrificial material layers with electrically conductive layers and replacing the sacrificial annular plate with a conductive annular pad located on a first electrically conductive layer, and forming a conductive layer contact via structure that contacts the conductive annular pad.

According to another aspect of the present disclosure, a method of forming a semiconductor structure includes forming an alternating stack of insulating layers and sacrificial material layers, forming memory stack structures through the alternating stack, wherein each of the memory stack structures comprises a respective vertical semiconductor channel and a respective vertical stack of memory elements formed at levels of the sacrificial material layers; forming stepped surfaces by patterning the alternating stack; forming insulating spacers on vertically-extending surface segments of the stepped surfaces; forming an etch stop layer over the insulating spacers and horizontal surface segments of the stepped surfaces; forming a retro-stepped dielectric material portion over the etch stop layer; forming a via cavity through the retro-stepped dielectric material portion, the etch stop layer, and the alternating stack; isotropically expanding the via cavity by laterally recessing the retro-stepped dielectric material portion and the insulating layers selective to the sacrificial material layers to form a finned via cavity; conformally depositing a dielectric material at peripheral portions of the finned via cavity; anisotropically etching the dielectric material to form a stepped via cavity, wherein a remaining portion of the dielectric material comprises a finned dielectric support pillar; replacing the sacrificial material layers with electrically conductive layers; and forming a conductive layer contact via structure that contacts a top surface of a first electrically conductive layer of the electrically conductive layers.

BRIEF DESCRIPTION OF THE DRAWINGS

FIGS. 9A-9D are sequential vertical cross-sectional views of an inter-tier memory opening during formation of a memory opening fill structure according to the first embodiment of the present disclosure.

DETAILED DESCRIPTION

Figure 1A:
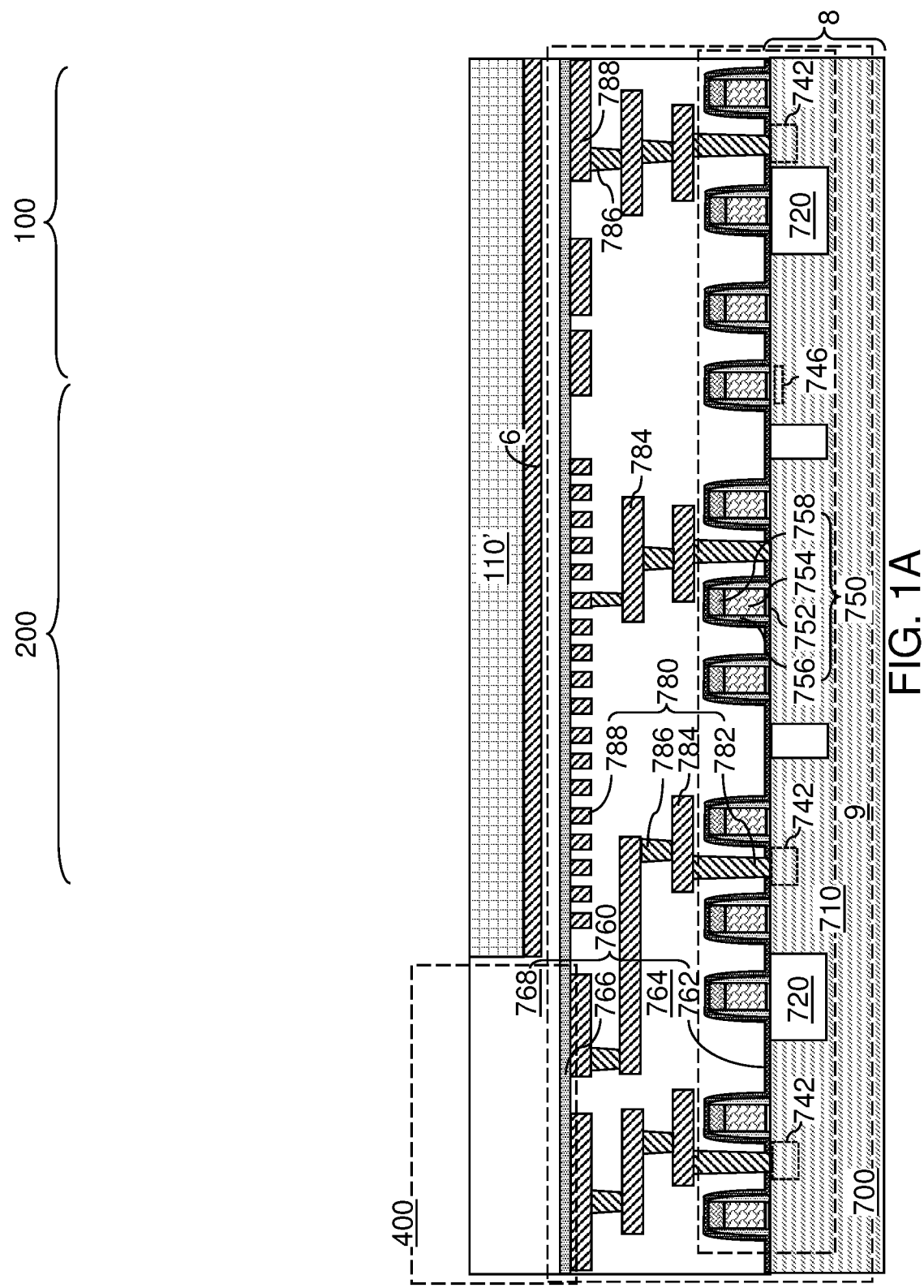
FIG. 1A is a vertical cross-sectional view of a first exemplary structure after formation of semiconductor devices, lower level dielectric layers, lower-level metal interconnect structures, and in-process source-level material layers according to a first embodiment of the present disclosure.

The present disclosure is directed to a three-dimensional memory device including integrated contact-and-support assemblies and methods of manufacturing the same, the various aspects of which are described in detail herebelow.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the element and a surface of the second element. As used herein, a first element is "electrically connected to" a second element if there exists a conductive path consisting of at least one conductive material between the element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device.

The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1B:
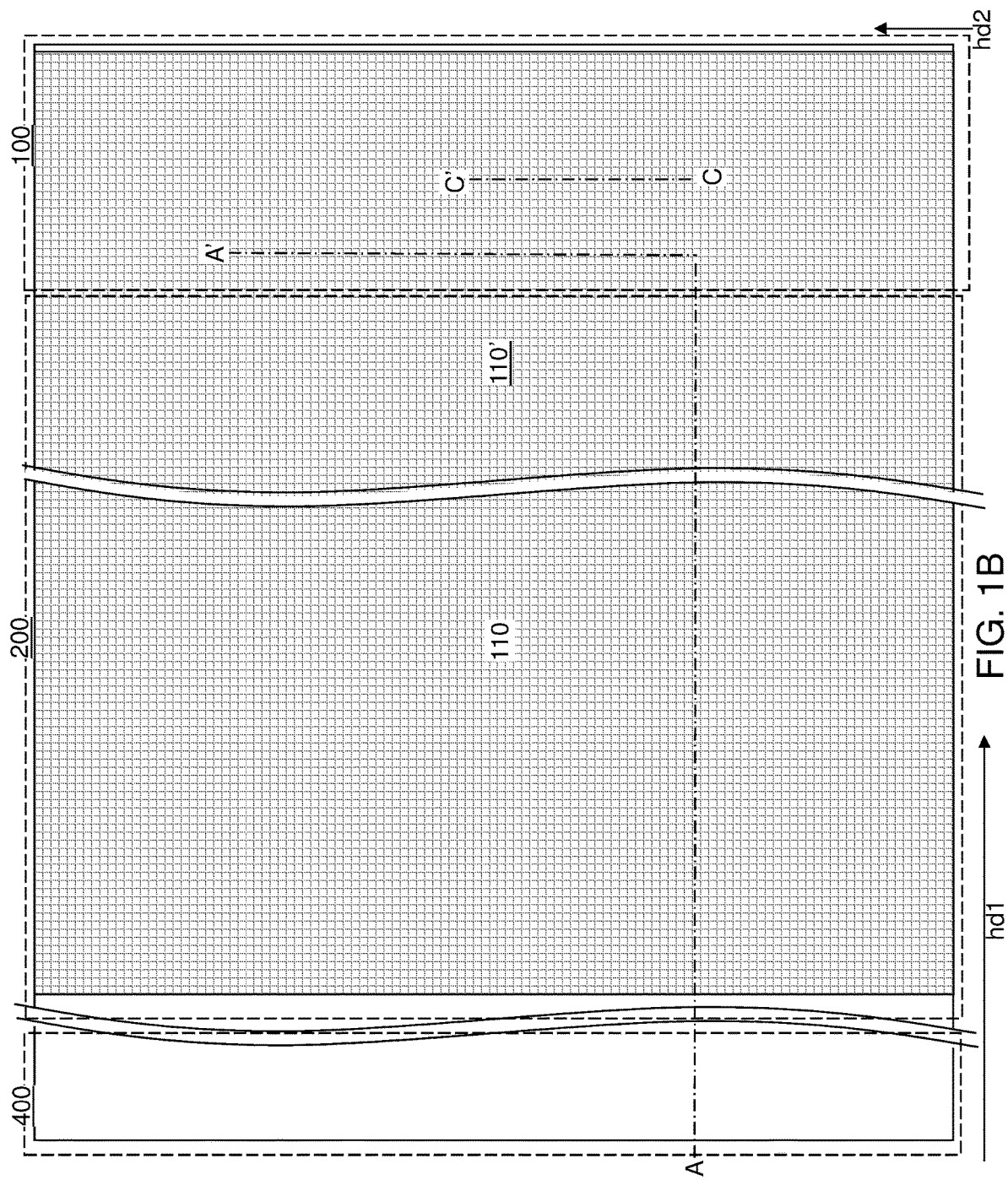
FIG. 1B is a top-down view of the first exemplary structure of FIG. 1A. The vertical plane A-A' is the plane of the vertical cross-sectional view of FIG. 1A.
Figure 1C:
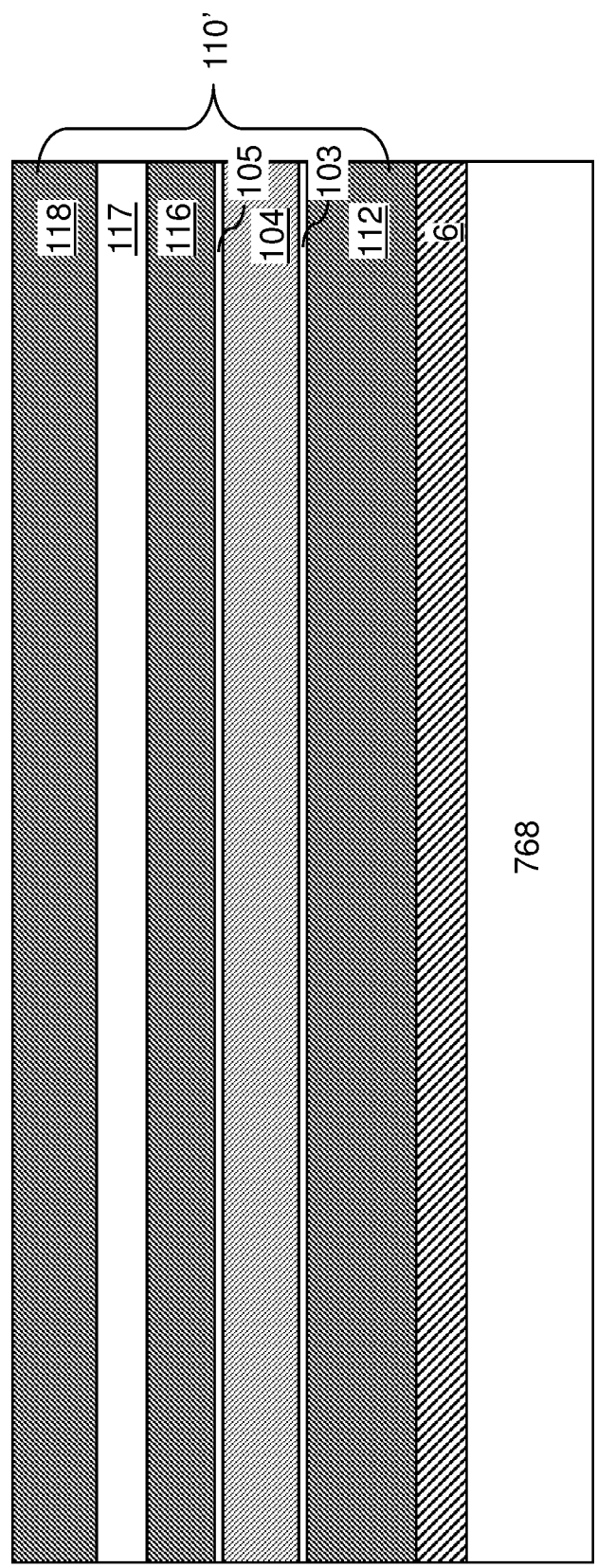
FIG. 1C is a vertical cross-sectional view of the first exemplary structure along the vertical plane C-C' of FIG. 1B.

Referring to FIGS. 1A-1C, an first exemplary structure according to an embodiment of the present disclosure is illustrated. The first exemplary structure includes a semiconductor substrate 8 and a peripheral circuitry 710 formed thereupon. The first exemplary structure includes a memory array region 100 in which a three-dimensional memory array is to be subsequently formed, a staircase region 200 in which stepped surfaces of electrically conductive layers and contact via structures are to be subsequently formed, and a connection region 400 in which peripheral contact via structures are to be subsequently formed.

The substrate, such as a semiconductor substrate 8 includes a substrate semiconductor layer 9 at least at an upper portion thereof. The semiconductor substrate may comprise a silicon wafer and the substrate semiconductor layer 9 may comprise an upper portion of the silicon wafer containing various doped wells and/or an epitaxial silicon layer. Shallow trench isolation structures 720 can be formed in an upper portion of the substrate semiconductor layer 9 to provide electrical isolation among the semiconductor devices. The peripheral circuitry 710 includes field effect transistors including respective transistor active regions 742 (i.e., source regions and drain regions), channel regions 746, and gate structures 750. The field effect transistors may be arranged in a CMOS configuration. Each gate structure 750 can include, for example, a gate dielectric 752, a gate electrode 754, a dielectric gate spacer 756 and a gate cap dielectric 758.

The peripheral circuitry 710 can include additional semiconductor devices in addition to p-type field effect transistors and n-type field effect transistors, which can be employed to control operation of a memory structure to be subsequently formed. The peripheral circuitry 710 includes a driver circuitry, which is also referred to as a peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 can include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring among the various nodes of the semiconductor devices and landing pads for through-memory-level contact via structures to be subsequently formed. The lower-level metal interconnect structures 780 are embedded within the dielectric layer stack of the lower-level dielectric material layers 760, and comprise a lower-level metal line structure located under and optionally contacting a bottom surface of the silicon nitride layer 766.

For example, the lower-level metal interconnect structures 780 can be embedded within the first dielectric material layers 764. The first dielectric material layers 764 may be a plurality of dielectric material layers in which various elements of the lower-level metal interconnect structures 780 are sequentially embedded. Each dielectric material layer among the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 can comprise, or consist essentially of, dielectric material layers having dielectric constants that do not exceed the dielectric constant of undoped silicate glass (silicon oxide) of 3.9. The lower-level metal interconnect structures 780 can include various device contact via structures 782 (e.g., source and drain electrodes which contact the respective source and drain nodes of the device or gate electrode contacts), intermediate lower-level metal line structures 784, and lower-level metal via structures 786 and landing pads 788 for through-memory-level contact via structures to be subsequently formed.

The at least one second dielectric material layer 768 may include a single dielectric material layer or a plurality of dielectric material layers. Each dielectric material layer among the at least one second dielectric material layer 768 may include any of doped silicate glass, undoped silicate glass, and organosilicate glass. In one embodiment, the at least one second dielectric material layer 768 can comprise, or consist essentially of, dielectric material layers having dielectric constants that do not exceed the dielectric constant of undoped silicate glass (silicon oxide) of 3.9.

The peripheral circuitry 710 can include peripheral devices for the memory-level assembly to be subsequently formed. The lower-level metal interconnect structures 780 are embedded in the lower-level dielectric layers 760. The combination of the lower-level dielectric layers 760 and the lower-level metal interconnect structures 780 overlie the peripheral circuitry 710.

The lower-level metal interconnect structures 780 can be electrically connected to active nodes (e.g., transistor active regions 742 or gate electrodes 754) of the peripheral circuitry 710 (e.g., CMOS devices), and are located at the level of the lower-level dielectric layers 760. Through-memory-level contact via structures can be subsequently formed directly on the lower-level metal interconnect structures 780 to provide electrical connection to memory devices to be subsequently formed.

In-process source-level material layers 110' including a layer stack of material layers can be formed over lower-level dielectric layers 760. The in-process source-level material layers 110' can include various layers that are subsequently modified to form source-level material layers. The source-level material layers, upon formation, include a source contact layer that functions as a common source region for vertical field effect transistors of a three-dimensional memory device. In one embodiment, the in-process source-level material layer 110' can include, from bottom to top, a lower source-level material layer 112, a lower sacrificial liner 103, a source-level sacrificial layer 104, an upper sacrificial liner 105, an upper source-level material layer 116, a source-level insulating layer 117, and an optional source-select-level conductive layer 118.

The lower source-level material layer 112 and the upper source-level material layer 116 can include a doped semiconductor material such as doped polysilicon or doped amorphous silicon. The doped semiconductor material of the lower source-level material layer 112 is herein referred to as a first doped semiconductor material, and the doped semiconductor material of the upper source-level material layer 116 is herein referred to as a second doped semiconductor material, which may be the same or different from the first doped semiconductor material. The conductivity type of the lower source-level material layer 112 and the upper source-level material layer 116 can be the opposite of the conductivity of vertical semiconductor channels to be subsequently formed. For example, if the vertical semiconductor channels to be subsequently formed have a doping of a first conductivity type, the lower source-level material layer 112 and the upper source-level material layer 116 have a doping of a second conductivity type that is the opposite of the first conductivity type. The thickness of each of the lower source-level material layer 112 and the upper source-level material layer 116 can be in a range from 10 nm to 300 nm, such as from 20 nm to 150 nm, although lesser and greater thicknesses can also be employed.

The source-level sacrificial layer 104 includes a sacrificial material that can be removed selective to the lower sacrificial liner 103 and the upper sacrificial liner 105. In one embodiment, the source-level sacrificial layer 104 can include a dielectric material such as silicon nitride, or a semiconductor material such as undoped amorphous silicon or a silicon-germanium alloy with an atomic concentration of germanium greater than 20%. The thickness of the source-level sacrificial layer 104 can be in a range from 30 nm to 400 nm, such as from 60 nm to 200 nm, although lesser and greater thicknesses can also be employed.

The lower sacrificial liner 103 and the upper sacrificial liner 105 include materials that can function as an etch stop material during removal of the source-level sacrificial layer 104. For example, the lower sacrificial liner 103 and the upper sacrificial liner 105 can include silicon oxide, silicon nitride, and/or a dielectric metal oxide. In one embodiment, each of the lower sacrificial liner 103 and the upper sacrificial liner 105 can include a silicon oxide layer having a thickness in a range from 2 nm to 30 nm, although lesser and greater thicknesses can also be employed.

The source-level insulating layer 117 includes a dielectric material such as silicon oxide. The thickness of the source-level insulating layer 117 can be in a range from 20 nm to 400 nm, such as from 40 nm to 200 nm, although lesser and greater thicknesses can also be employed. The optional source-select-level conductive layer 118 can include a conductive material that can be employed as a source-select-level gate electrode. For example, the optional source-select-level conductive layer 118 can include a doped semiconductor material such as doped polysilicon or doped amorphous silicon that can be subsequently converted into doped polysilicon by an anneal process. The thickness of the optional source-level conductive layer 118 can be in a range from 30 nm to 200 nm, such as from 60 nm to 100 nm, although lesser and greater thicknesses can also be employed.

The in-process source-level material layers 110' can be formed directly above a subset of the semiconductor devices on the semiconductor substrate 8 (e.g., silicon wafer). As used herein, a first element is located "directly above" a second element if the element is located above a horizontal plane including a topmost surface of the second element and an area of the element and an area of the second element has an areal overlap in a plan view (i.e., along a vertical plane or direction perpendicular to the top surface of the substrate 8.

The in-process source-level material layers 110' may be patterned to provide openings in areas in which through-memory-level contact via structures and through-dielectric contact via structures are to be subsequently formed. Patterned portions of the in-process source-level material layers 110' are present in each memory array region 100 in which three-dimensional memory stack structures are to be subsequently formed. The at least one second dielectric material layer 768 can include a blanket layer portion underlying the in-process source-level material layers 110' and a patterned portion that fills gaps among the patterned portions of the in-process source-level material layers 110'.

The in-process source-level material layers 110' can be patterned such that an opening extends over a staircase region 200 in which contact via structures contacting word line electrically conductive layers are to be subsequently formed. In one embodiment, the staircase region 200 can be laterally spaced from the memory array region 100 along a first horizontal direction hd1. A horizontal direction that is perpendicular to the first horizontal direction hd1 is herein referred to as a second horizontal direction hd2.

Figure 2:
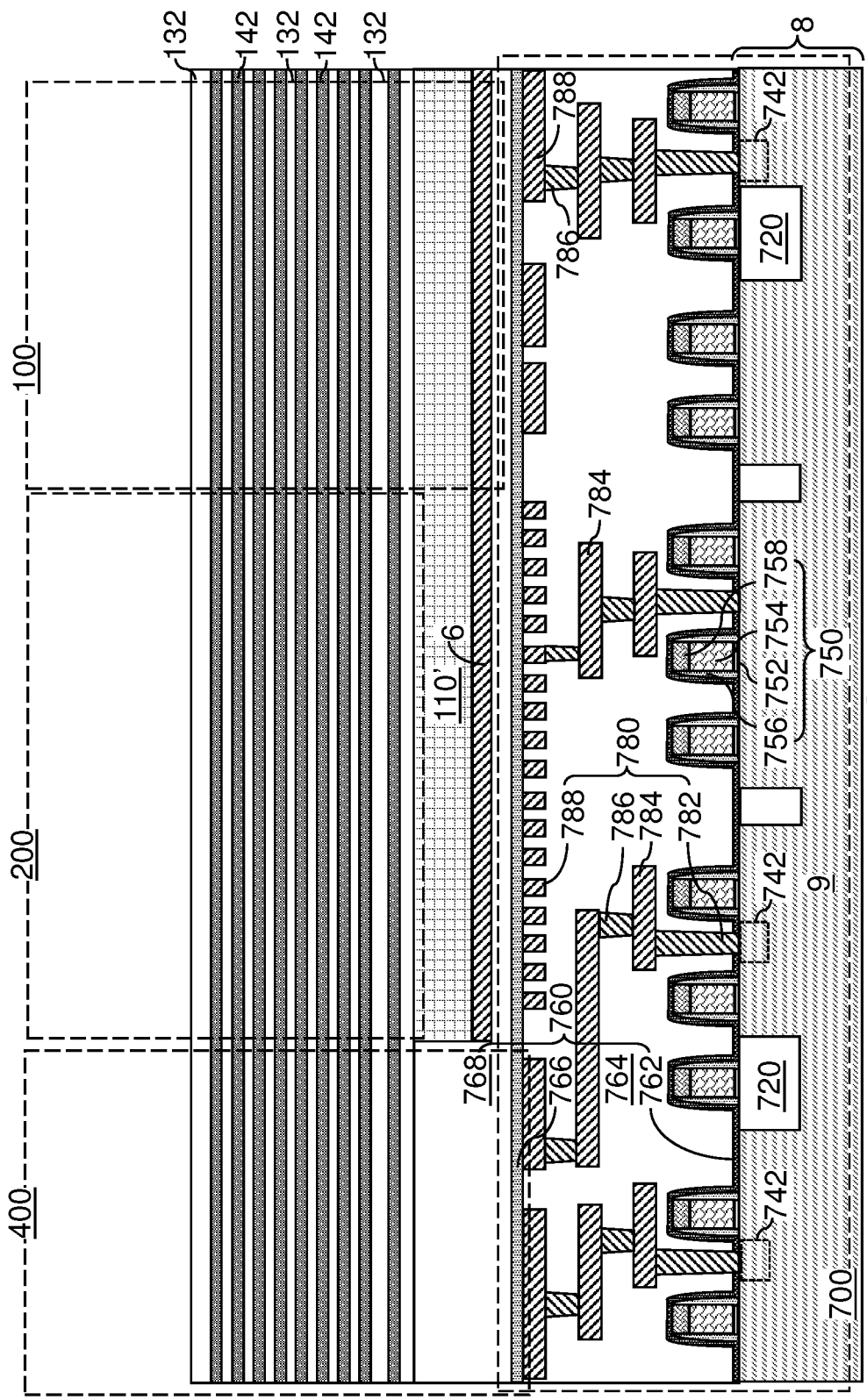
FIG. 2 is a vertical cross-sectional view of the first exemplary structure after formation of a first vertically alternating sequence of first insulating layers and first spacer material layers according to the first embodiment of the present disclosure.

Referring to FIG. 2, an alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first vertically alternating sequence. The level of the first vertically alternating sequence is herein referred to as a first-tier level, and the level of the alternating stack to be subsequently formed immediately above the first-tier level is herein referred to as a second-tier level, etc.

The first vertically alternating sequence can include first insulating layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While the present disclosure is described employing embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the in-process source-level material layers. As used herein, a "sacrificial material" refers to a material that is removed during a subsequent processing step.

As used herein, an alternating stack of elements and second elements refers to a structure in which instances of the elements and instances of the second elements alternate. Each instance of the elements that is not an end element of the alternating plurality is adjoined by two instances of the second elements on both sides, and each instance of the second elements that is not an end element of the alternating plurality is adjoined by two instances of the elements on both ends. The elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the elements and an instance of the second elements may form a unit that is repeated with periodicity within the alternating plurality.

The first vertically alternating sequence (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first vertically alternating sequence (132, 142) can have a uniform thickness that is substantially invariant within each respective first sacrificial material layer 142.

A first insulating cap layer 170 is subsequently formed over the alternating stack (132, 142). The first insulating cap layer 170 includes a dielectric material, which can be any dielectric material that can be employed for the first insulating layers 132. In one embodiment, the first insulating cap layer 170 includes the same dielectric material as the first insulating layers 132. The thickness of the insulating cap layer 170 can be in a range from 20 nm to 300 nm, although lesser and greater thicknesses can also be employed.

Figure 3:
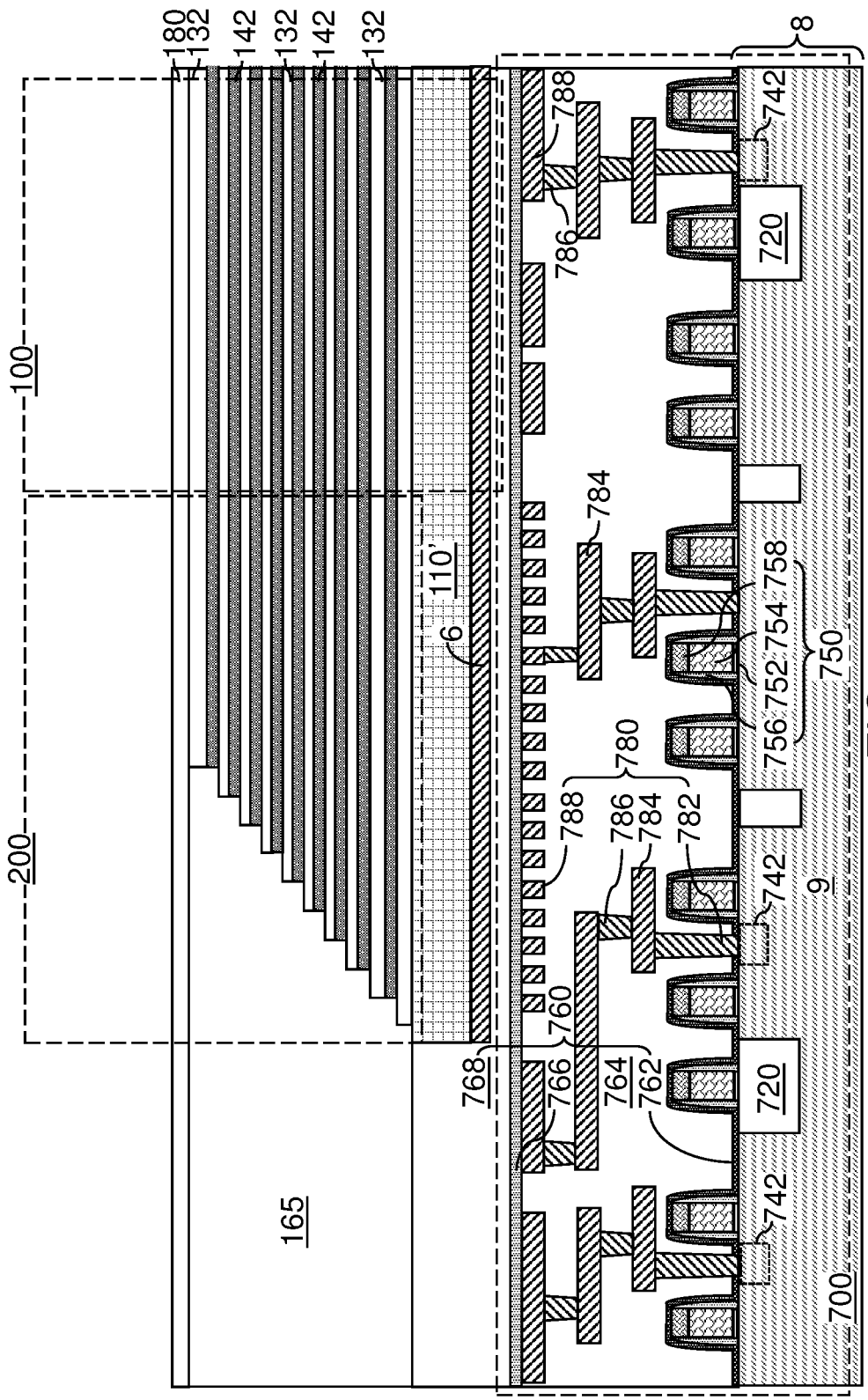
FIG. 3 is a vertical cross-sectional view of the first exemplary structure after patterning first stepped surfaces, a first retro-stepped dielectric material portion, and an inter-tier dielectric layer according to the first embodiment of the present disclosure.

Referring to FIG. 3, the first insulating cap layer 170 and the first vertically alternating sequence (132, 142) can be patterned to form first stepped surfaces in the staircase region 200. The staircase region 200 can include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces can be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 can be physically exposed at the first stepped surfaces. The cavity overlying the first stepped surfaces is herein referred to as a first stepped via cavity.

A dielectric fill material (such as undoped silicate glass or doped silicate glass) can be deposited to fill the first stepped via cavity. Excess portions of the dielectric fill material can be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first vertically alternating sequence (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 can include a doped silicate glass having a greater etch rate than the material of the first insulating layers 132 (which can include an undoped silicate glass). For example, the inter-tier dielectric layer 180 can include phosphosilicate glass. The thickness of the inter-tier dielectric layer 180 can be in a range from 30 nm to 300 nm, although lesser and greater thicknesses can also be employed.

Figure 4A:
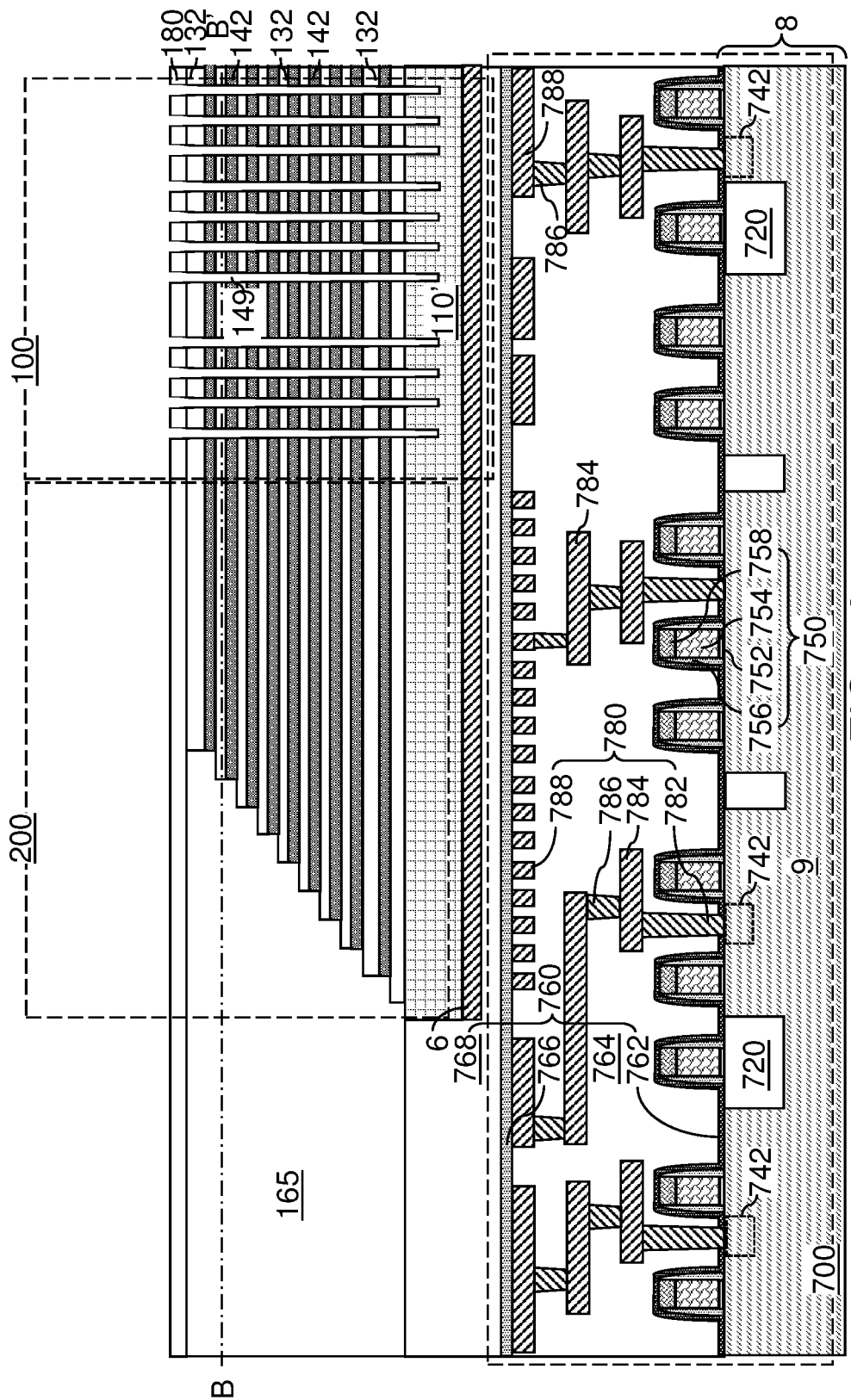
FIG. 4A is a vertical cross-sectional view of the first exemplary structure after formation of first-tier memory openings according to the first embodiment of the present disclosure.
Figure 4B:
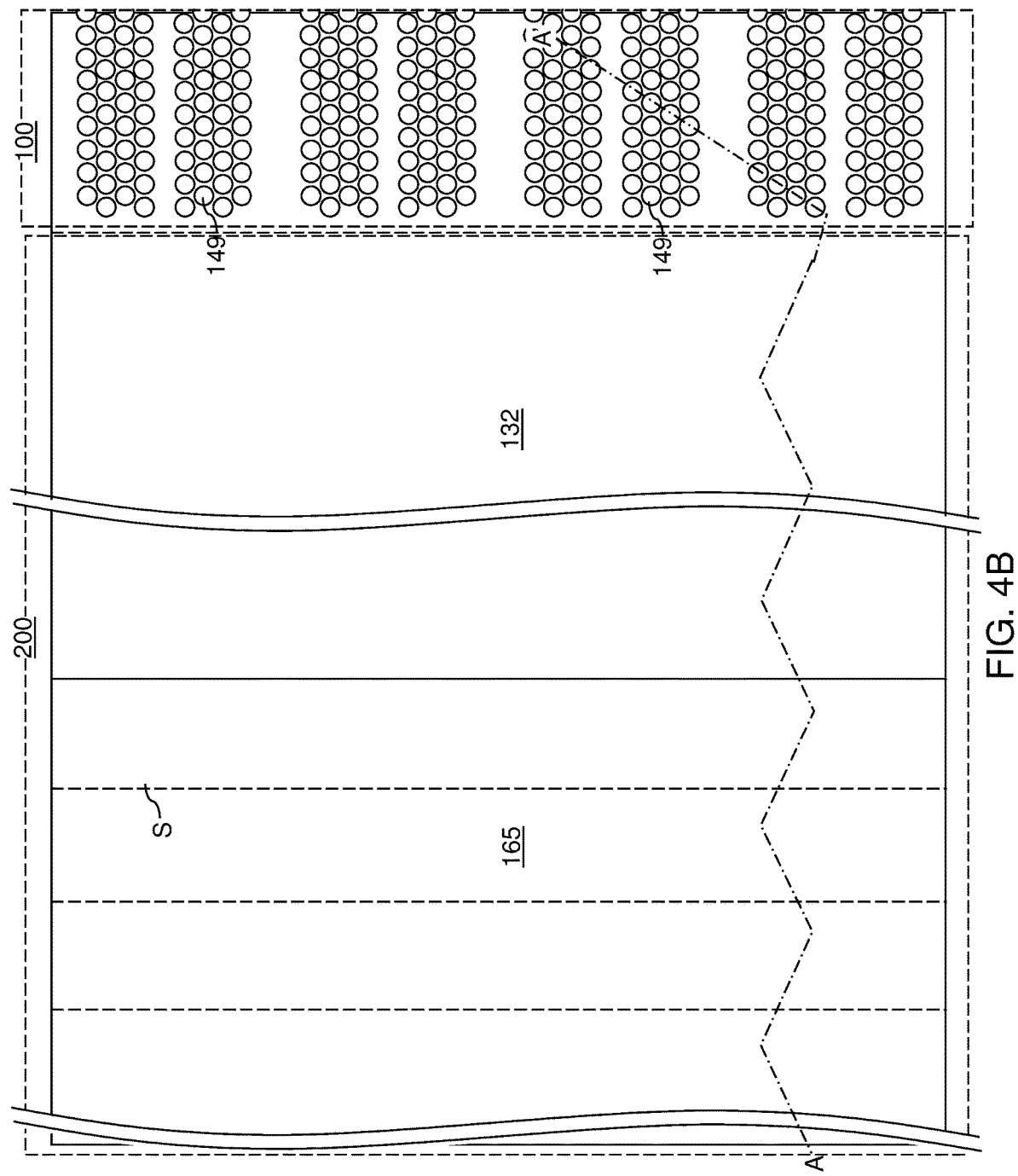
FIG. 4B is a top-down view of the first exemplary structure of FIG. 4A. The zig-zag vertical plane A-A' corresponds to the plane of the vertical cross-sectional view of FIG. 4A.

Referring to FIGS. 4A and 4B, first-tier memory openings 149 can be formed through the inter-tier dielectric layer 180 and the first-tier structure (132, 142, 170, 165) and partly through the in-process source-level material layers 110'. For example, a photoresist layer (not shown) can be applied over the inter-tier dielectric layer 180, and can be lithographically patterned to form openings therethrough. The pattern of openings in the photoresist layer can be transferred through the inter-tier dielectric layer 180 and the first-tier structure (132, 142, 170, 165) and partly through the in-process source-level material layers 110' by a first anisotropic etch process to form the first-tier memory openings 149.

The first-tier memory openings 149 are formed in the memory array region 100 through each layer within the first alternating stack (132, 142), and are subsequently employed to form memory stack structures therein. The bottom surfaces of the first-tier memory openings 149 can be a recessed surface of the source-level sacrificial layer 104. Thus, each first-tier memory opening 149 can have a bottom surface between a horizontal plane including the bottom surface of the source-level sacrificial layer 104 and a horizontal plane including the top surface of the source-level sacrificial layer 104. In one embodiment, bottom surface of the first-tier memory openings 149 may be formed within the lower source-level material layer 112.

In one embodiment, the first-tier memory openings 149 can be formed as clusters that are laterally spaced among one another along the second horizontal direction hd2. Each cluster of first-tier memory openings 149 can include a respective two-dimensional array of first-tier memory openings 149 having a first pitch along one horizontal direction and a second pitch along another horizontal direction. In one embodiment, the direction of the first memory structure pitch can be the first horizontal direction (e.g., word line direction) hd1 and the direction of the second memory structure pitch can be the second horizontal direction (e.g., bit line direction) hd2, or vice versa.

The inter-tier dielectric layer 180 can comprise a dielectric material (such as borosilicate glass) having a greater etch rate than the first insulating layers 132 (that can include undoped silicate glass). In one embodiment, the bottom surface of each first-tier memory opening 149 can be formed between the top surface and the bottom surface of the source-level sacrificial layer 104. In this case, surfaces of the source-level sacrificial layer 104 can be exposed at a bottom portion of each first-tier memory opening 149. Locations of steps S in the first vertically alternating sequence (132, 142) are illustrated as dotted lines in FIG. 4B.

Figure 5:
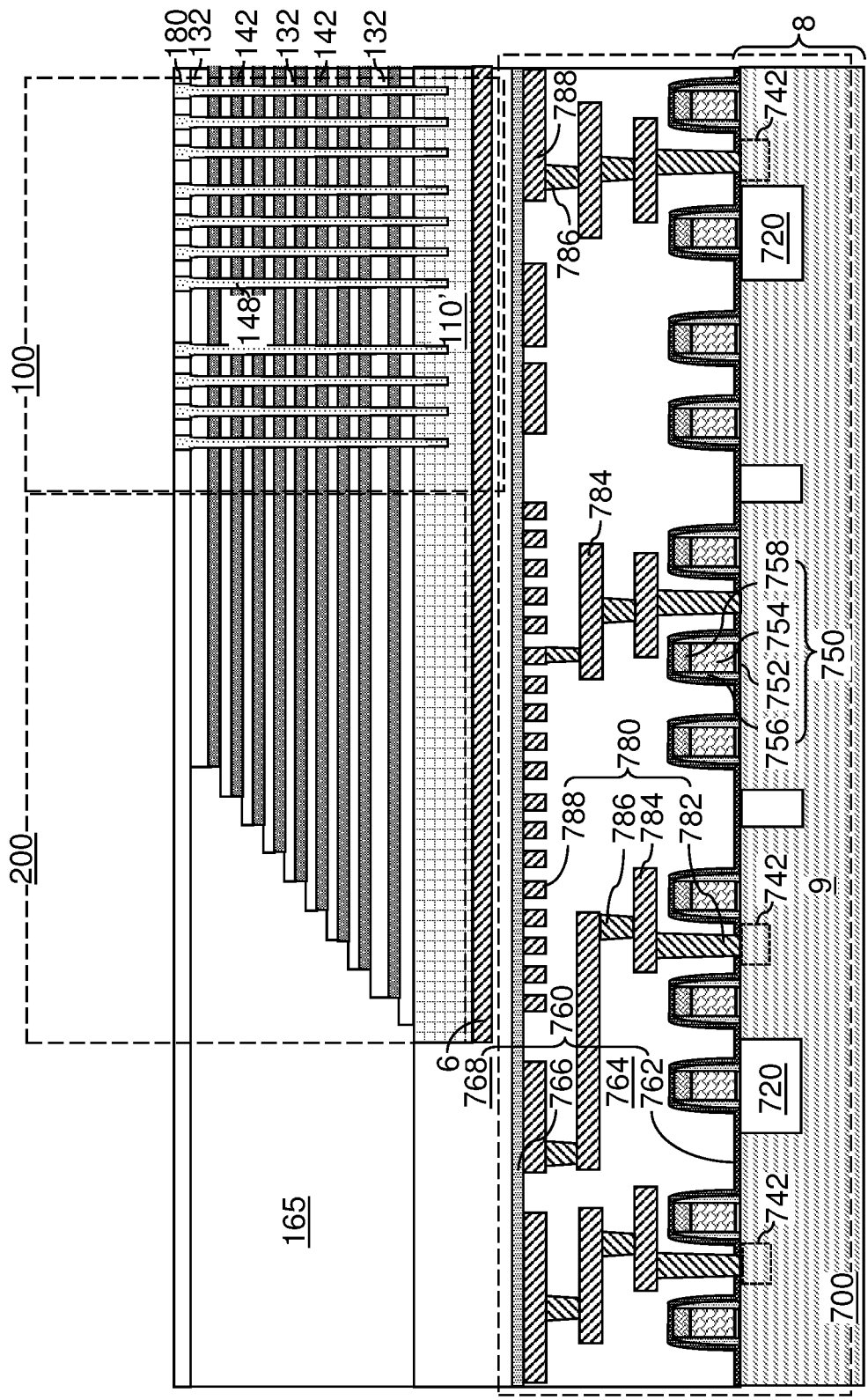
FIG. 5 is a vertical cross-sectional view of the first exemplary structure after formation of sacrificial memory opening fill portions according to the first embodiment of the present disclosure.

Referring to FIG. 5, sacrificial first-tier memory opening fill portions 148 can be formed in the first-tier memory openings 149. For example, a sacrificial fill material is deposited concurrently deposited in each of the first-tier memory openings 149. The sacrificial fill material includes a material that can be subsequently removed selective to the materials of the first insulating layers 132 and the first sacrificial material layers 142.

In one embodiment, the sacrificial fill material can include a semiconductor material such as silicon (e.g., a-Si or polysilicon), a silicon-germanium alloy, germanium, a III-V compound semiconductor material, or a combination thereof. Optionally, a thin etch stop layer (such as a silicon oxide layer or a silicon nitride layer having a thickness in a range from 1 nm to 3 nm) may be employed prior to depositing the sacrificial first-tier fill material. The sacrificial fill material may be formed by a non-conformal deposition or a conformal deposition method.

In another embodiment, the sacrificial fill material can include a silicon oxide material having a higher etch rate than the materials of the first insulating layers 132, the first insulating cap layer 170, and the inter-tier insulating layer 180. For example, the sacrificial fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop layer (such as a silicon nitride layer having a thickness in a range from 1 nm to 3 nm) may be employed prior to depositing the sacrificial first-tier fill material. The sacrificial fill material may be formed by a non-conformal deposition or a conformal deposition method.

In yet another embodiment, the sacrificial fill material can include a carbon-containing material (such as amorphous carbon or diamond-like carbon) that can be subsequently removed by ashing, or a silicon-based polymer that can be subsequently removed selective to the materials of the first alternating stack (132, 142).

Portions of the deposited sacrificial fill material can be removed from above the topmost layer of the first vertically alternating sequence (132, 142), such as from above the inter-tier dielectric layer 180. For example, the sacrificial fill material can be recessed to a top surface of the inter-tier dielectric layer 180 employing a planarization process. The planarization process can include a recess etch, chemical mechanical planarization (CMP), or a combination thereof. The top surface of the inter-tier dielectric layer 180 can be employed as an etch stop layer or a planarization stop layer.

Remaining portions of the sacrificial fill material comprise sacrificial first-tier memory opening fill portions 148. Specifically, each remaining portion of the sacrificial material in a first-tier memory opening 149 constitutes a sacrificial first-tier memory opening fill portion 148. The top surfaces of the sacrificial first-tier memory opening fill portions 148 can be coplanar with the top surface of the inter-tier dielectric layer 180. Each of the sacrificial first-tier memory opening fill portions 148 may, or may not, include cavities therein.

Figure 6:
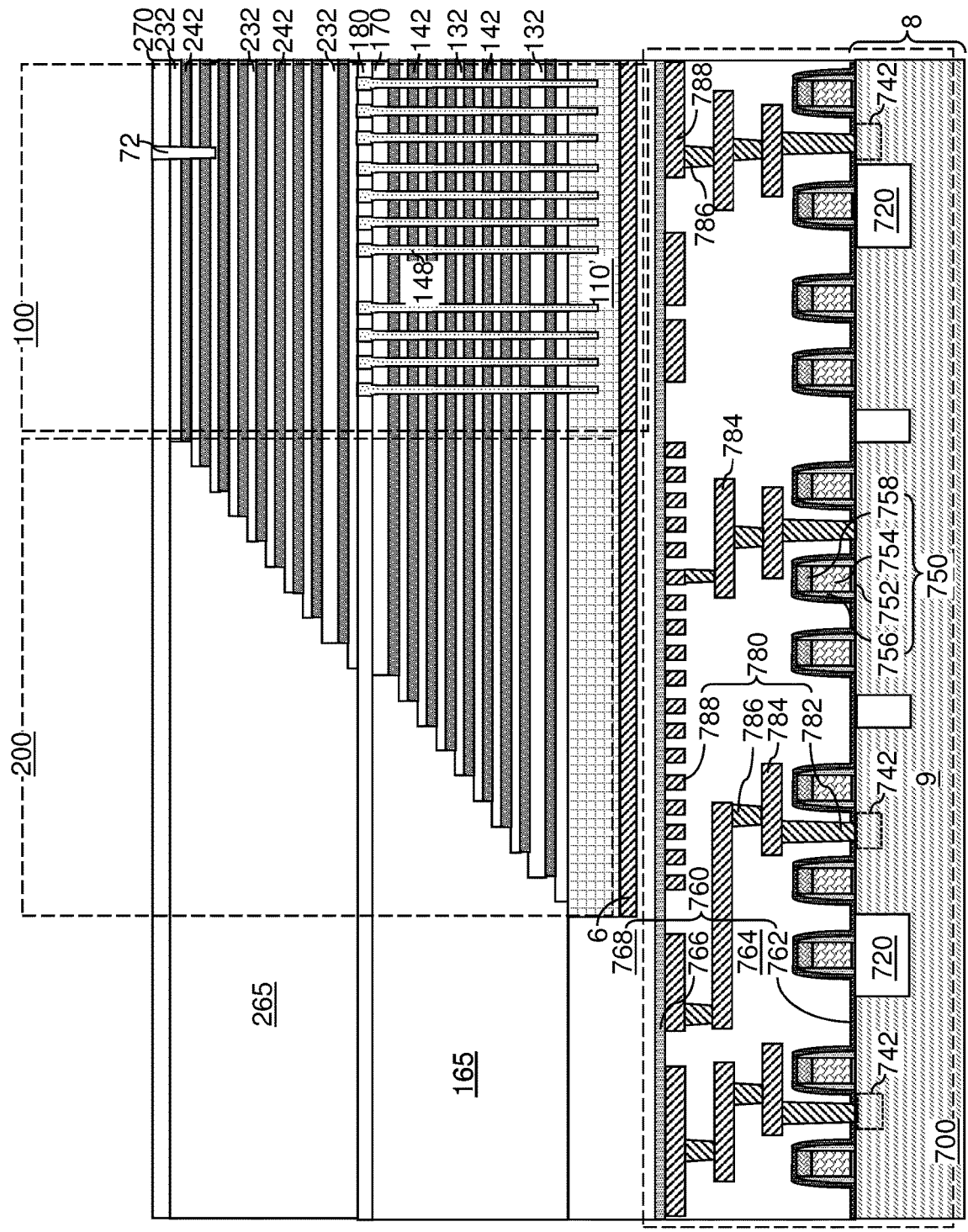
FIG. 6 is a vertical cross-sectional view of the first exemplary structure after formation of a second vertically alternating sequence of second insulating layers and second spacer material layers, second stepped surfaces, a second retro-stepped dielectric material portion, and drain-select-level isolation structures according to the first embodiment of the present disclosure.

Referring to FIG. 6, a second-tier structure can be formed over the first-tier structure (132, 142, 170, 165, 148). The second-tier structure can include an additional vertically alternating sequence of additional insulating layers and additional spacer material layers, which can be additional sacrificial material layers. The second vertically alternating sequence is also referred to as a second alternating stack. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second alternating stack (232, 242) can have a uniform thickness that is substantially invariant within each respective second sacrificial material layer 242.

Second stepped surfaces can be formed in the second stepped area of the staircase region 200 employing a same set of processing steps as the processing steps employed to form the first stepped surfaces in the first stepped area with suitable adjustment to the pattern of at least one masking layer. A second retro-stepped dielectric material portion 265 can be formed over the second stepped surfaces in the staircase region 200.

A second insulating cap layer 270 can be subsequently formed over the second alternating stack (232, 242) and the second retro-stepped dielectric material portion 265. The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

Optionally, drain-select-level isolation structures 72 can be formed through the second insulating cap layer 270 and through a subset of layers in an upper portion of the second vertically alternating sequence (232, 242). The second sacrificial material layers 242 that are cut by the select-drain-level shallow trench isolation structures 72 correspond to the levels in which drain-select-level electrically conductive layers are subsequently formed. The drain-select-level isolation structures 72 include a dielectric material such as silicon oxide. The drain-select-level isolation structures 72 can laterally extend along a first horizontal direction hd1, and can be laterally spaced apart along a second horizontal direction hd2 that is perpendicular to the first horizontal direction hd1.

Generally speaking, at least one vertically alternating sequence of insulating layers (132, 232) and spacer material layers (such as sacrificial material layers (142, 242)) can be formed over the in-process source-level material layers 110', and at least one retro-stepped dielectric material portion (165, 265) can be formed over the staircase regions on the at least one alternating stack (132, 142, 232, 242). Each of the insulating layers (132, 232) and spacer material layers (such as sacrificial material layers (142, 242) can be formed as a respective single continuous material layer. In this case, the insulating layers (132, 232) may be referred to as continuous insulating layers, and the spacer material layers may be referred to as continuous spacer material layers (such as continuous sacrificial material layers).

Figure 7A:
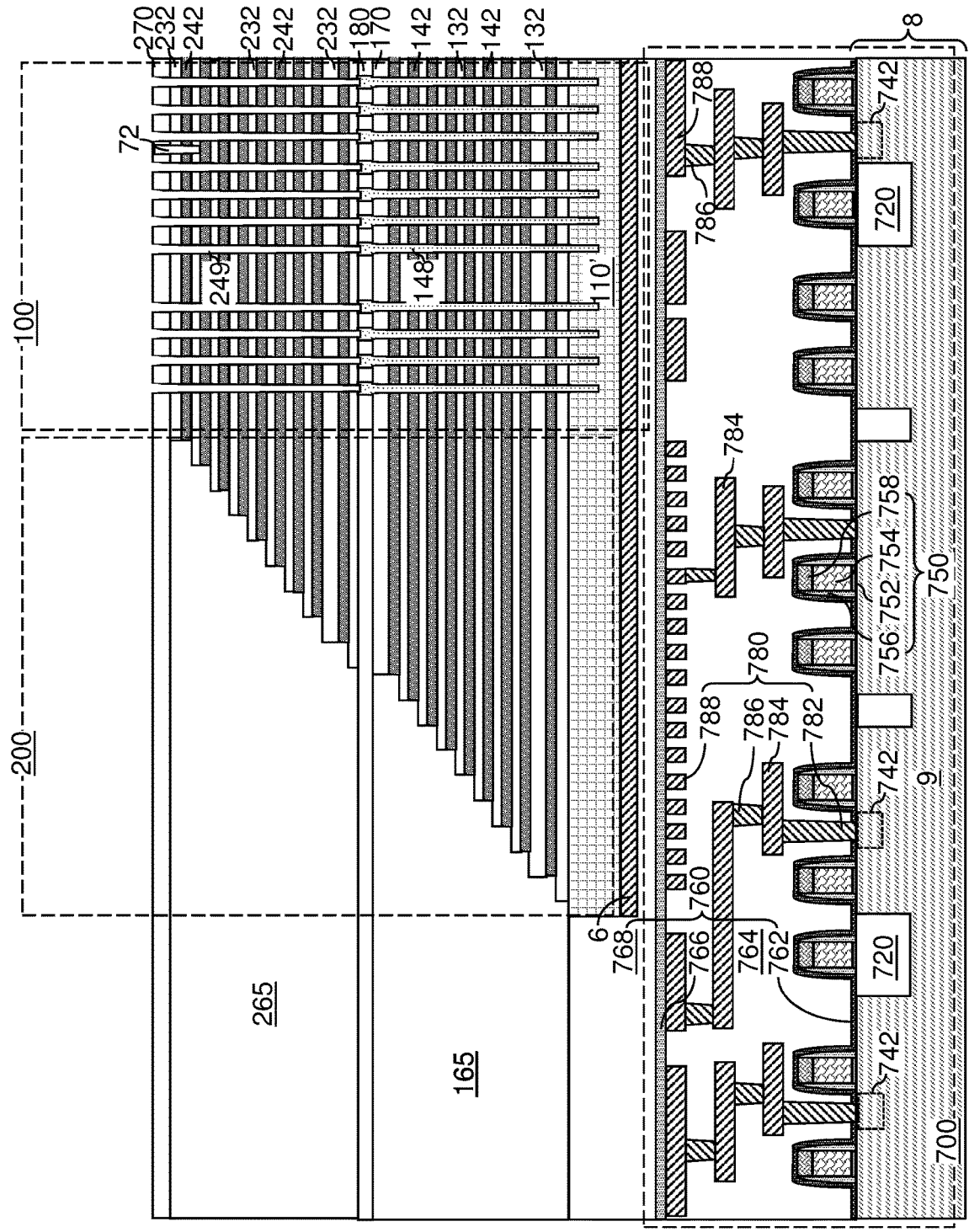
FIG. 7A is a vertical cross-sectional view of the first exemplary structure after formation of second-tier memory openings according to the first embodiment of the present disclosure.
Figure 7B:
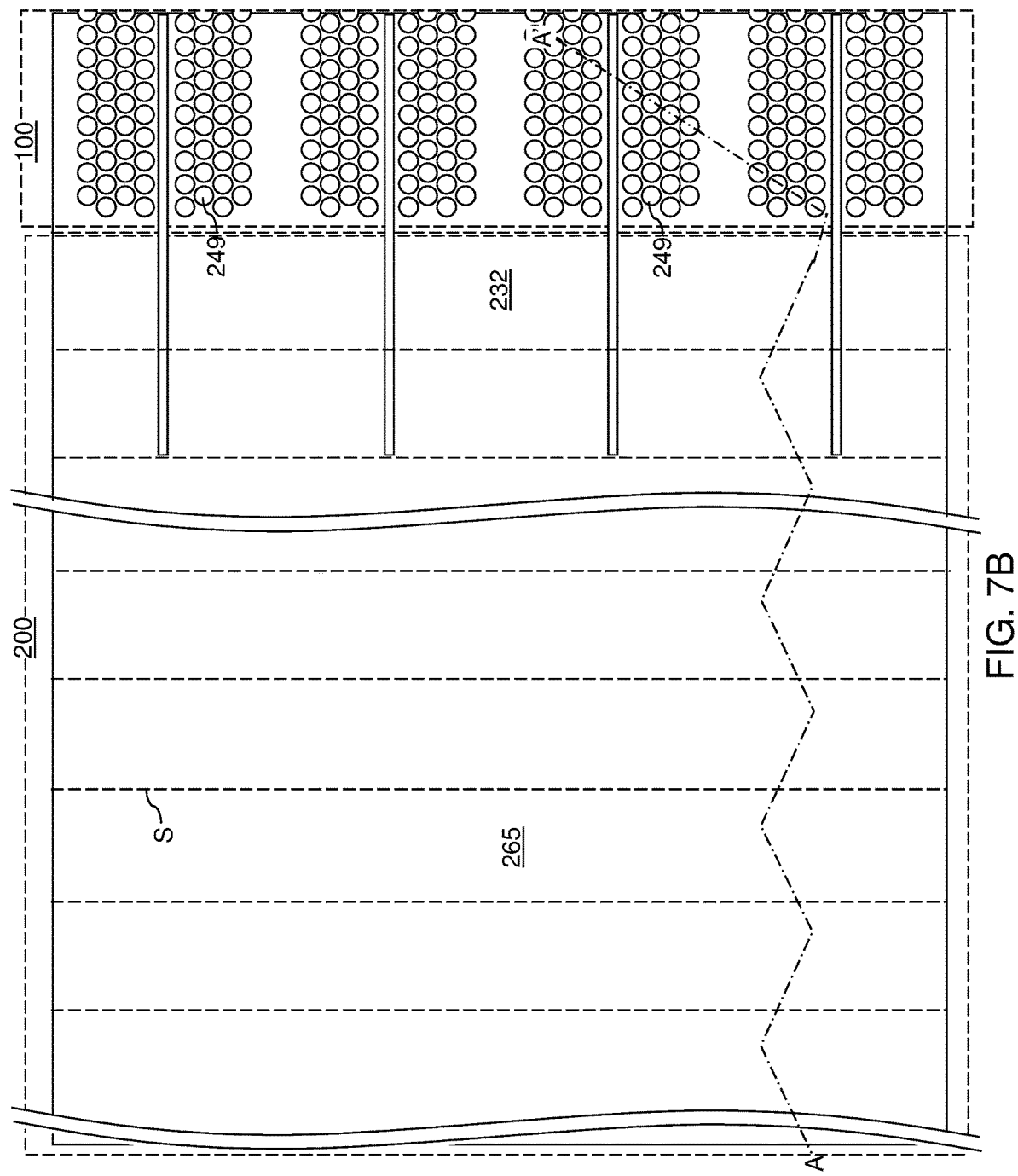
FIG. 7B is a horizontal cross-sectional of the first exemplary structure along the horizontal plane B-B' of FIG. 7A. The zig-zag vertical plane A-A' corresponds to the plane of the vertical cross-sectional view of FIG. 7A.

Referring to FIGS. 7A and 7B, second-tier memory openings 249 can be formed through the second-tier structure (232, 242, 265, 270, 72). A photoresist layer (not shown) can be applied over the second insulating cap layer 270, and can be lithographically patterned to form openings therethrough. The pattern of the openings can be the same as the pattern of the various first-tier memory openings 149, which is the same as the sacrificial first-tier memory opening fill portions 148. Thus, the lithographic mask employed to pattern the first-tier memory openings 149 can be employed to pattern the photoresist layer. The pattern of openings in the photoresist layer can be transferred through the second-tier structure (232, 242, 265, 270, 72) by a second anisotropic etch process to form the second-tier memory openings 249.

The second-tier memory openings 249 are formed directly on a top surface of a respective one of the sacrificial first-tier memory opening fill portions 148. Locations of steps S in the first vertically alternating sequence (132, 142) and the second vertically alternating sequence (232, 242) are illustrated as dotted lines in FIG. 7B.

Figure 8:
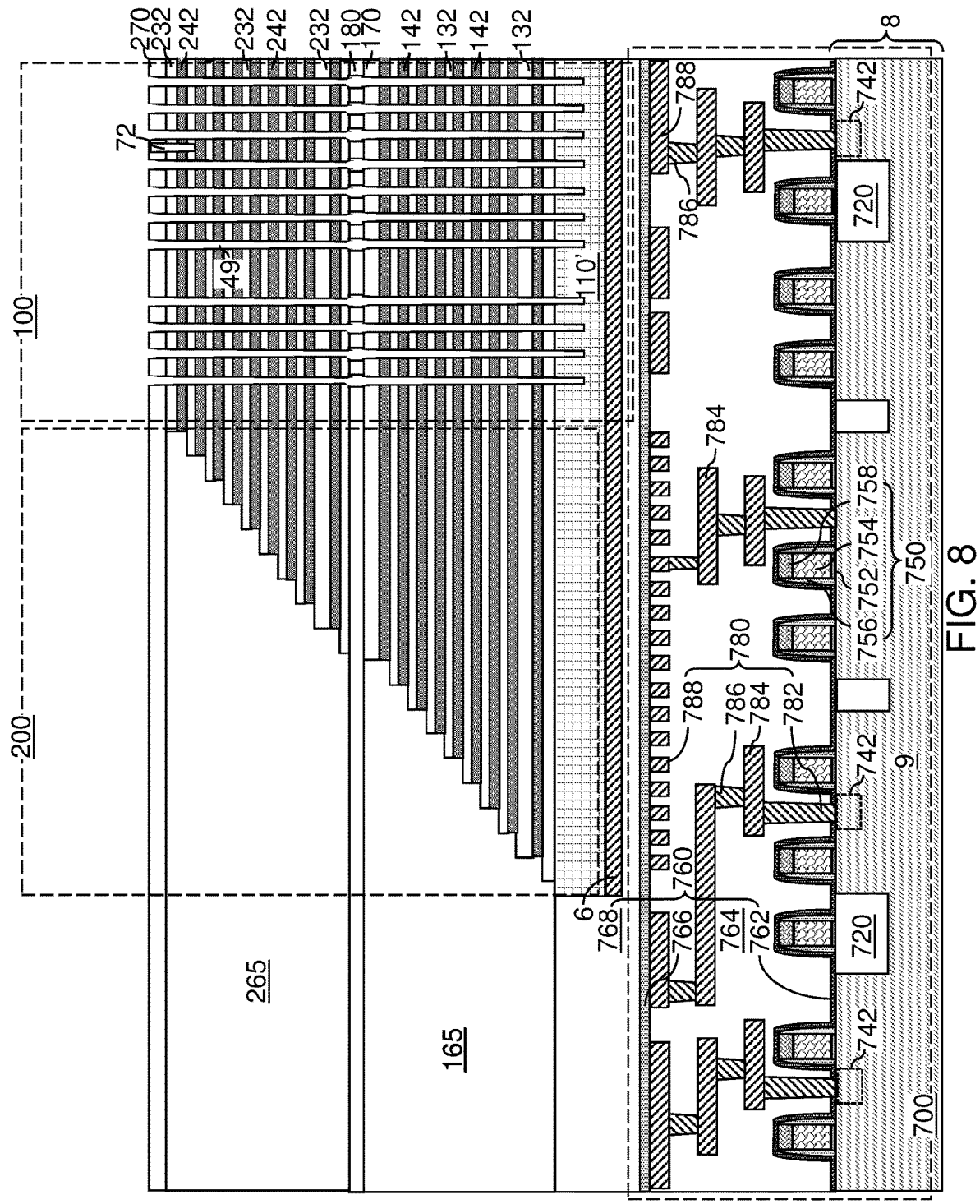
FIG. 8 is a vertical cross-sectional view of the first exemplary structure after formation of inter-tier memory openings according to the first embodiment of the present disclosure.

Referring to FIGS. 8A and 8B, the sacrificial fill material can be removed from underneath the second-tier memory openings 249 employing an etch process that etches the sacrificial fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, is formed in each volume from which a sacrificial first-tier memory opening fill portion 148 is removed.

FIGS. 9A-9D provide sequential cross-sectional views of a memory opening 49 during formation of a memory opening fill structure 58. The same structural change occurs in each memory openings 49. Referring to FIG. 9A, a memory opening 49 in the exemplary device structure of FIGS. 8A and 8B is illustrated. The memory opening 49 extends through the first-tier structure and the second-tier structure.

Referring to FIG. 9B, a stack of layers including a blocking dielectric layer 52, a charge storage layer 54, a tunneling dielectric layer 56, and a semiconductor channel material layer 60L can be sequentially deposited in the memory openings 49. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 can include a dielectric semiconductor compound such as silicon oxide, silicon oxynitride, silicon nitride, or a combination thereof.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer. As used herein, a first surface and a second surface are "vertically coincident" if there exists the second surface that overlies or underlies the first surface and if there exists a vertical plane that intersects both the first surface and the second surface. Alternatively, the sacrificial material layers (142, 242) can be laterally recessed with respect to the sidewalls of the insulating layers (132, 232), and a combination of a deposition process and an anisotropic etch process can be employed to form the charge storage layer 54 as a plurality of memory material portions that are vertically spaced apart. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed. The stack of the blocking dielectric layer 52, the charge storage layer 54, and the tunneling dielectric layer 56 constitutes a memory film 50 that stores memory bits.

The semiconductor channel material layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L includes amorphous silicon or polysilicon. The semiconductor channel material layer 60L can be formed by a conformal deposition method such as low pressure chemical vapor deposition (LPCVD). The thickness of the semiconductor channel material layer 60L can be in a range from 2 nm to 10 nm, although lesser and greater thicknesses can also be employed. A cavity 49' is formed in the volume of each memory opening 49 that is not filled with the deposited material layers (52, 54, 56, 60L).

Referring to FIG. 9C, in case the cavity 49' in each memory opening is not completely filled by the semiconductor channel material layer 60L, a dielectric core layer can be deposited in the cavity 49' to fill any remaining portion of the cavity 49' within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating. The horizontal portion of the dielectric core layer overlying the second insulating cap layer 270 can be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 9D, a doped semiconductor material can be deposited in cavities overlying the dielectric cores 62. The doped semiconductor material has a doping of the opposite conductivity type of the doping of the semiconductor channel material layer 60L. Thus, the doped semiconductor material has a doping of the second conductivity type. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 can be removed by a planarization process such as a chemical mechanical planarization (CMP) process.

Each remaining portion of the doped semiconductor material having a doping of the second conductivity type constitutes a drain region 63. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Each remaining portion of the semiconductor channel material layer 60L constitutes a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, a plurality of memory elements comprises portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 110', the first-tier structure (132, 142, 170, 165), the second-tier structure (232, 242, 270, 265, 72), the inter-tier dielectric layer 180, and the memory opening fill structures 58 collectively constitute a memory-level assembly.

Figure 10A:
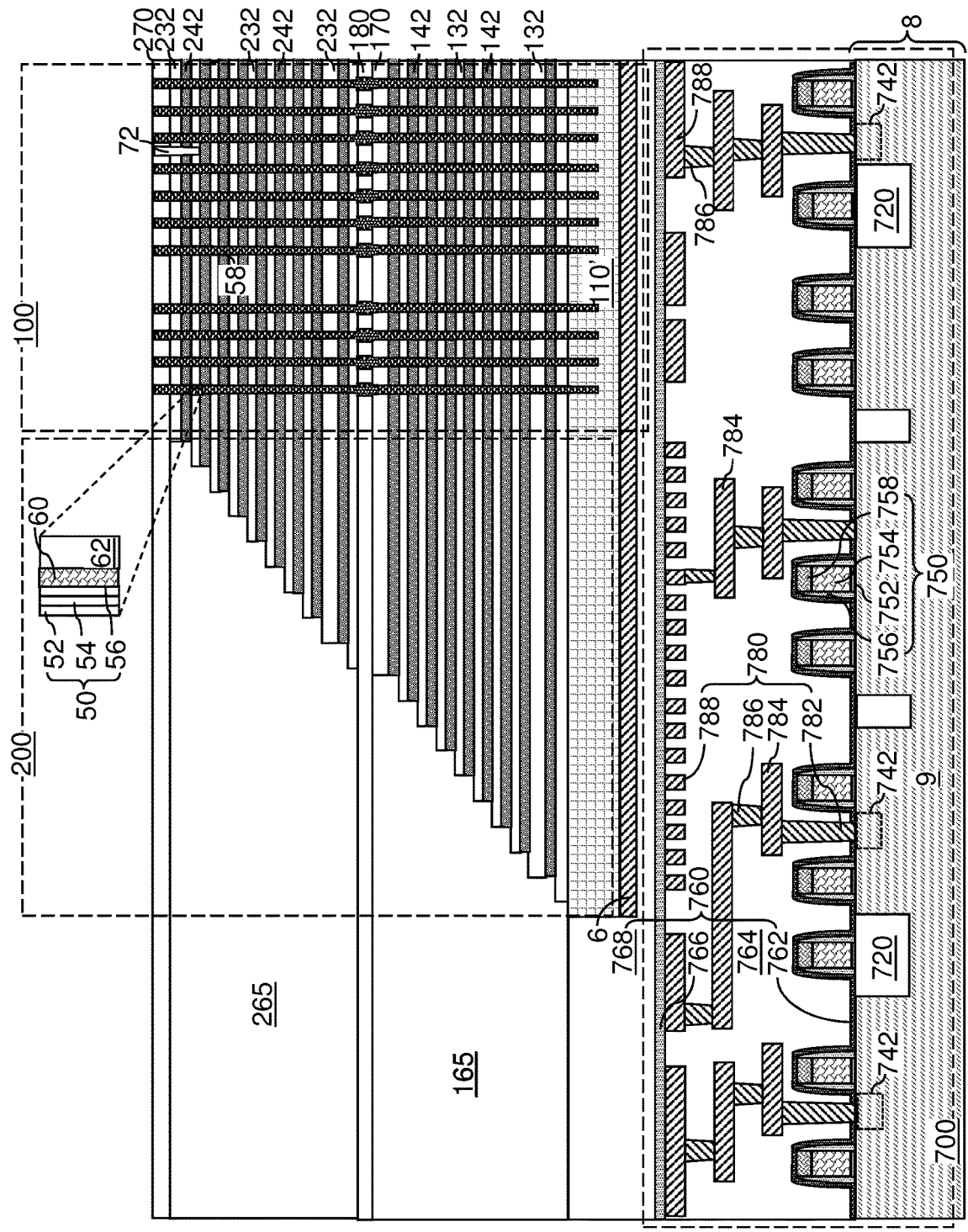
FIG. 10A is a vertical cross-sectional view of the first exemplary structure after formation of memory opening fill structures according to the first embodiment of the present disclosure.
Figure 10B:
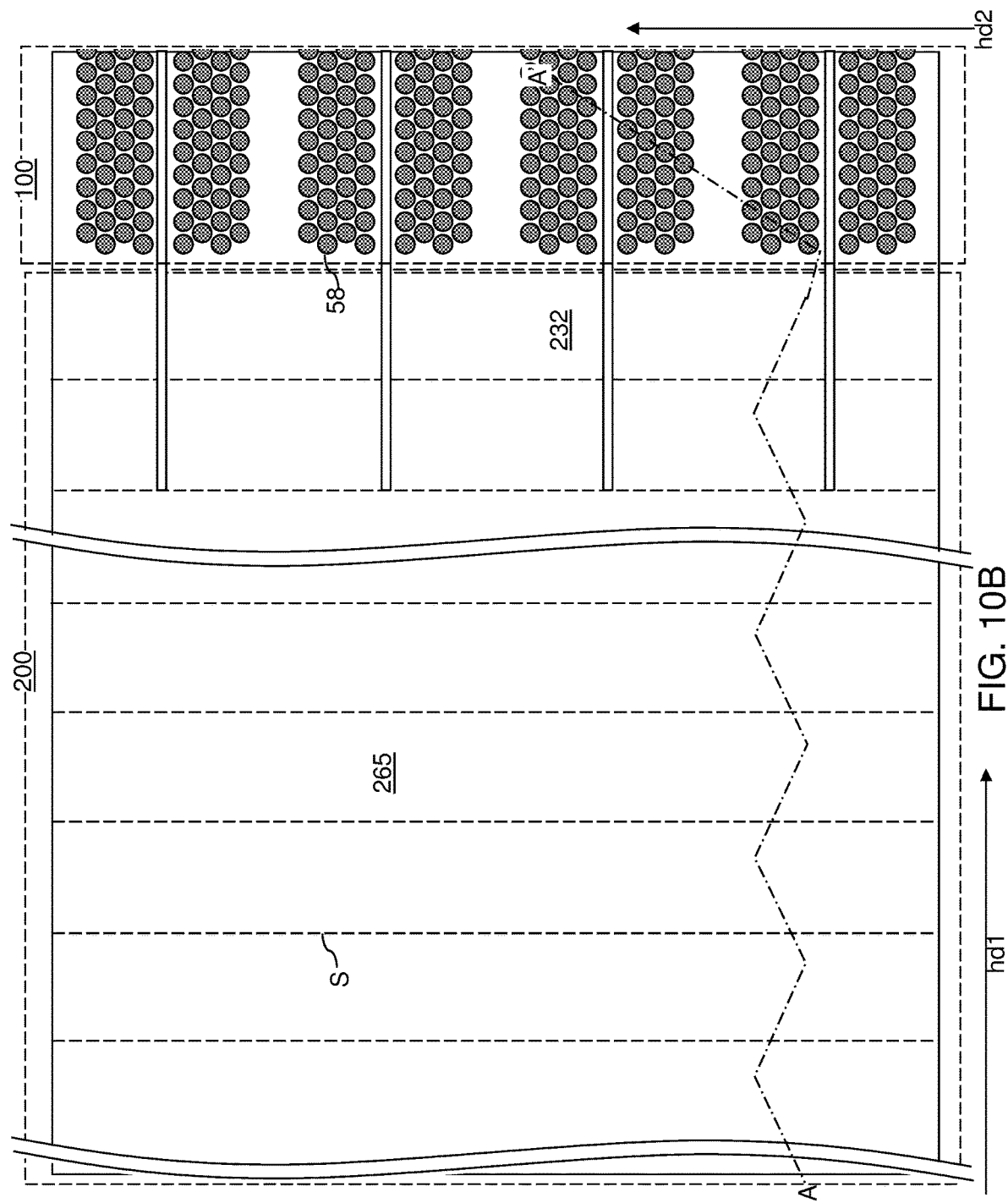
FIG. 10B is a horizontal cross-sectional of the first exemplary structure along the horizontal plane B-B' of FIG. 10A. The zig-zag vertical plane A-A' corresponds to the plane of the vertical cross-sectional view of FIG. 10A.

Referring to FIGS. 10A and 10B, the first exemplary structure is shown after formation of memory opening fill structures 58 in the memory openings 49.

Figure 11A:
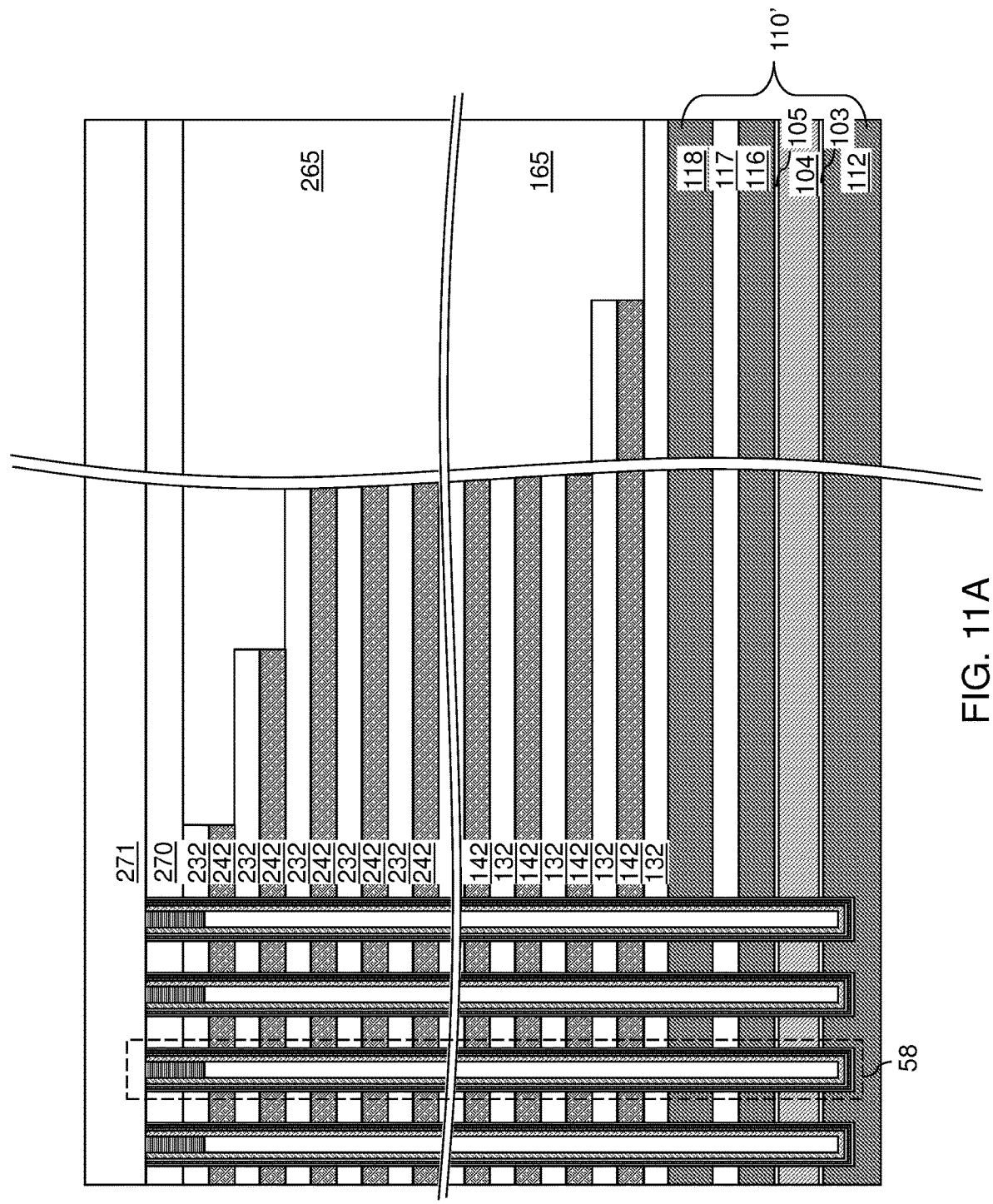
FIGS. 11A-11G are sequential vertical cross-sectional views of a staircase region of the first exemplary structure during formation of in-process integrated contact-and-support assemblies according to the first embodiment of the present disclosure.

FIGS. 11A-11G are sequential vertical cross-sectional views of a staircase region of the first exemplary structure during formation of in-process integrated contact-and-support assemblies Referring to FIG. 11A, an optional dielectric cover layer 271 can be formed over the second insulating cap layer 270. The optional dielectric cover layer 271, if employed, comprises a dielectric cover material, such as undoped silicate glass or a doped silicate glass.

Figure 11B:
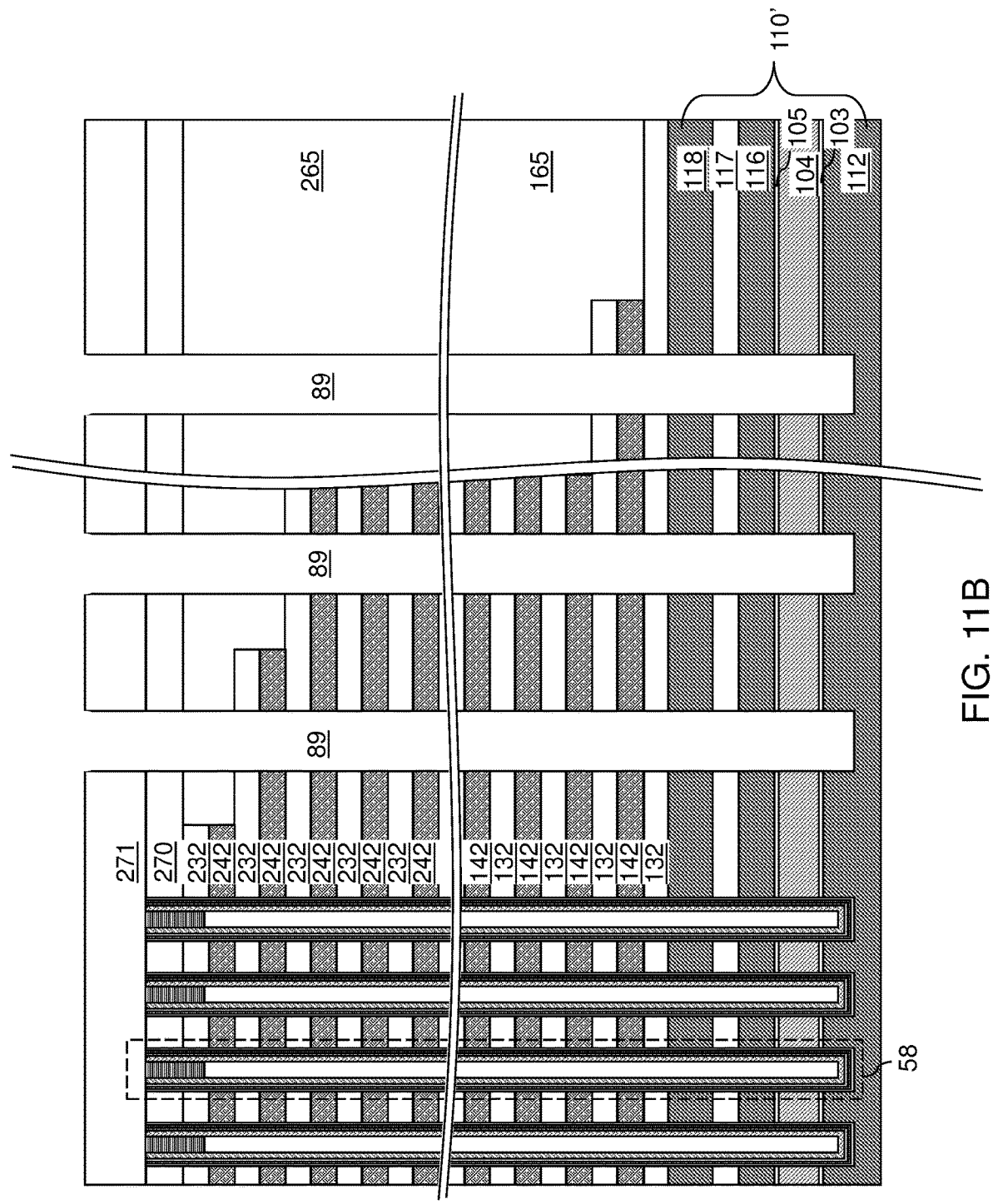

Referring to FIG. 11B, a photoresist layer (not shown) can be applied over the optional dielectric cover layer 271 and the second insulating cap layer 270, and can be lithographically patterned to form openings over the horizontal surface segments of the stepped surfaces in the staircase region 200. In one embodiment, each of the openings in the photoresist layer can be located within the area of a respective horizontally-extending surface segment within the stepped surfaces in the staircase region 200. The lateral dimension of each opening in the photoresist layer (such as a diameter) may be in a range from 30 nm to 600 nm, such as from 60 nm to 300 nm, although lesser and greater lateral dimensions may also be employed.

An anisotropic etch process can be performed to transfer the pattern of the openings in the photoresist layer through the optional dielectric cover layer 271, the second insulating cap layer 270, the retro-stepped dielectric material portions (165, 265), horizontally-extending surface segments of the stepped surfaces, and the alternating stacks {(132, 142), (232, 242)}, and into the in-process sacrificial material layers 110'. Via cavities are formed through the alternating stack {(132, 142), (232, 242)} and into the at least one semiconductor material layer (112, 114, 116) of the in-process source-level material layers 110', and thus, are herein referred to as through-stack via cavities 89. The photoresist layer can be subsequently removed, for example, by ashing. Each of the through-stack via cavities 89 may have a respective straight sidewall that vertically extends from the above the second insulating cap layer 270 to the lower source-level semiconductor layer 112.

Figure 11C:
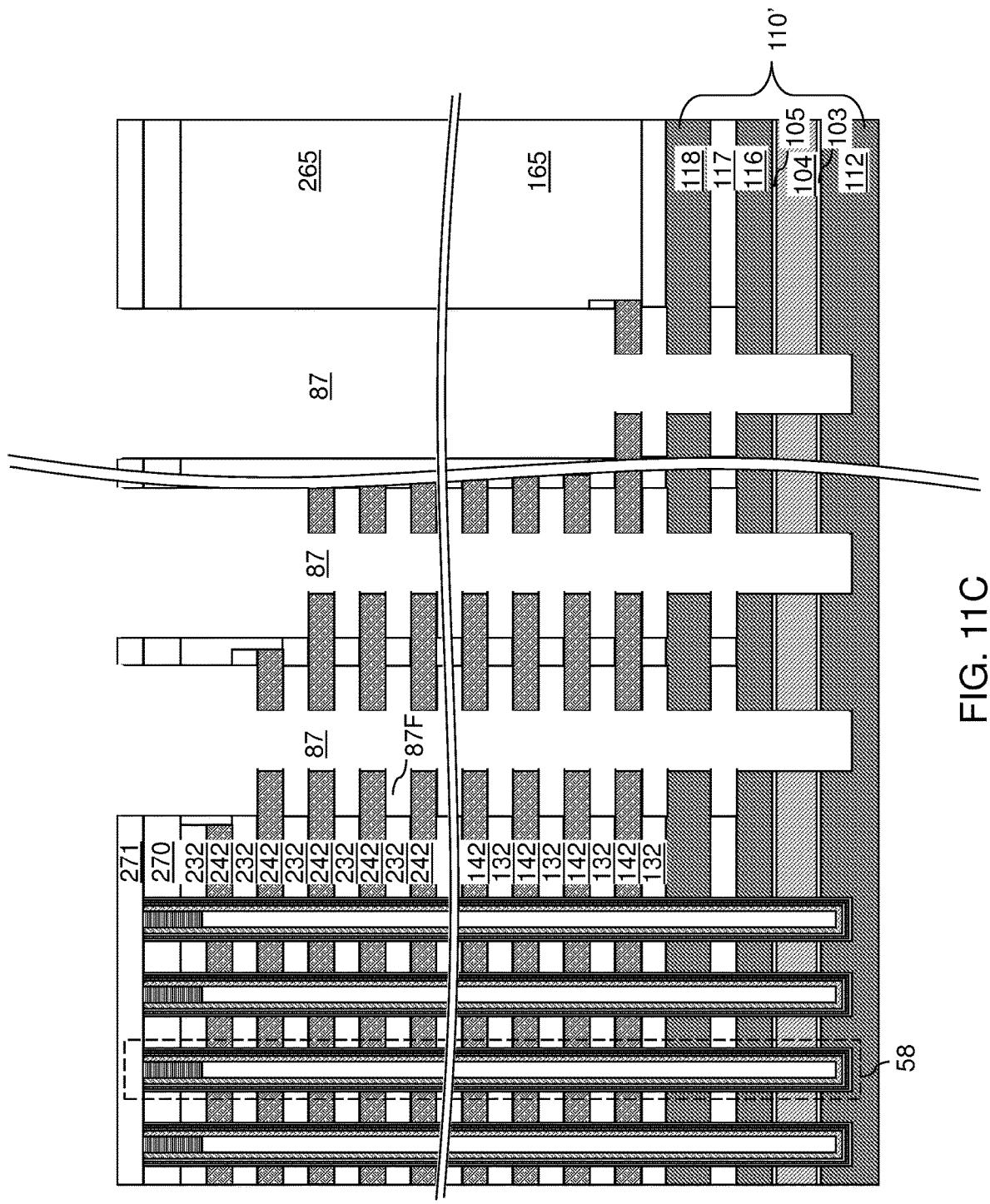

Referring to FIG. 11C, an isotropic recess etch process can be performed to isotropically recess the materials of the insulating layers (132, 232), the source-level insulating layer 117, the retro-stepped material portions (165, 265), the insulating cap layers (170, 270), the inter-tier dielectric layer 180, and the optional dielectric cover layer 271 selective to the materials of the sacrificial material layers (142, 242) and various semiconductor material layers (112, 104, 116, 118). In one embodiment, the insulating layers (132, 232), the source-level insulating layer 117, the retro-stepped material portions (165, 265), the insulating cap layers (170, 270), the inter-tier dielectric layer 180, and the optional dielectric cover layer 271 may comprise a respective semiconductor oxide material, such as undoped silicate glass (i.e., silicon oxide) or a doped silicate glass, and the isotropic recess etch process may comprise a wet etch process employing dilute hydrofluoric acid. The recess distance of the isotropic recess etch process may be in a range from 10 nm to 200 nm, such as from 20 nm to 100 nm, although lesser and greater recess distances may also be employed.

The through-stack via cavities 89 are laterally expanded at levels of the insulating layers (132, 232) and the source-level insulating layer 117, and above a respective horizontally-extending surface segment of the stepped surfaces, i.e., at levels of the retro-stepped dielectric material portions (165, 265), the insulating cap layers (170, 270), and the optional dielectric cover layer 271. The optional dielectric cover layer 271 may be collaterally thinned by the isotropic recess etch process. Each through-stack via cavity 89 is converted into a respective finned via cavity 87 including at least one fin cavity 87F formed at the level(s) of a respective set of at least one insulating layer (132, 232) and an optional additional fin cavity formed at the level of the source-level insulating layer 117 (if present). Each fin cavity 87F may have a volume of a respective cylindrical annulus. Generally, finned via cavities 87 can be formed by isotropically expanding the through-stack via cavities 89 by laterally recessing at least the retro-stepped dielectric material portions (165, 265) and the insulating layers (132, 232) selective to the sacrificial material layers (142, 242).

Figure 11D:
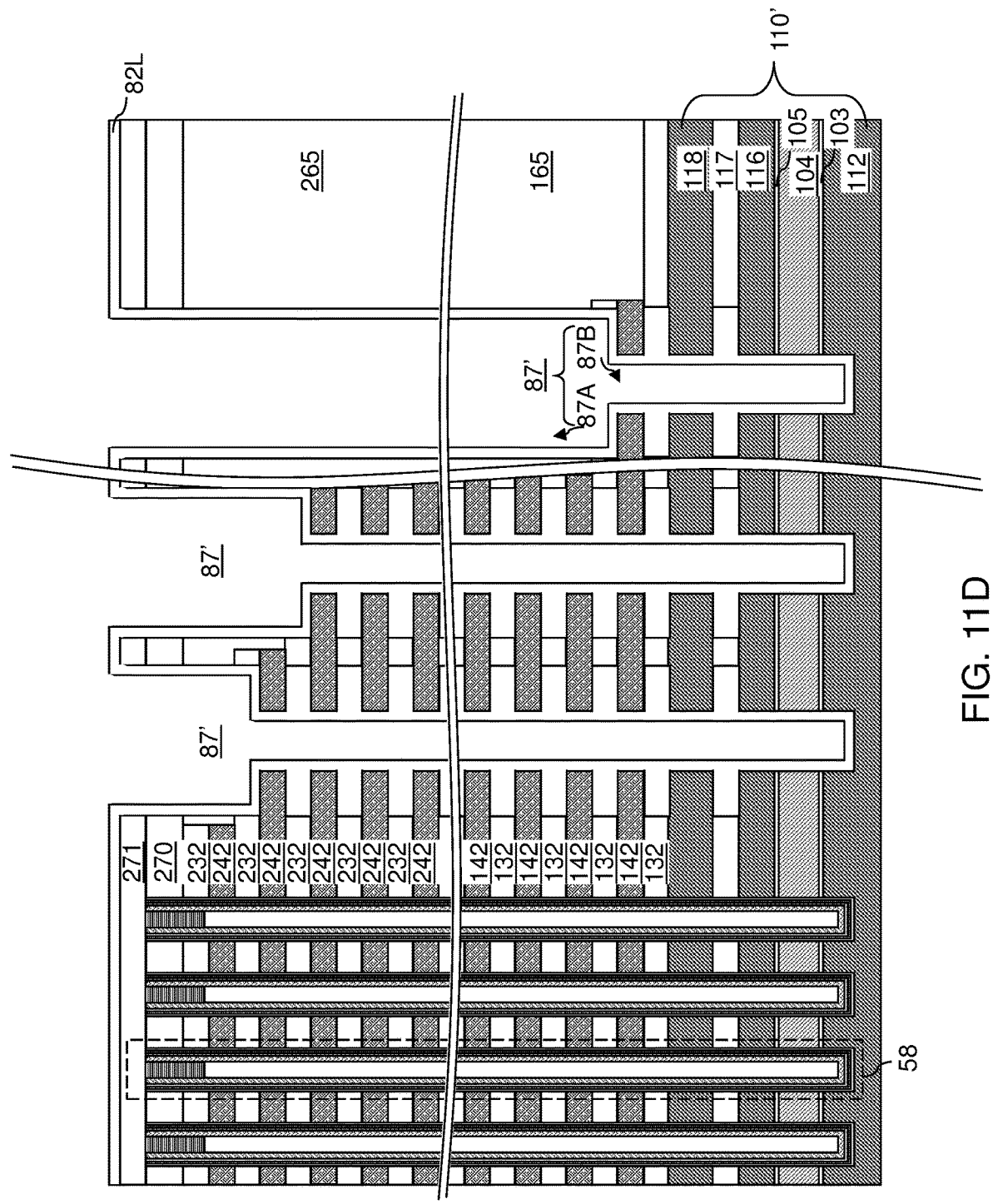

Referring to FIG. 11D, a dielectric material, such as silicon oxide can be conformally deposited to form a dielectric material layer 82L. The dielectric material layer 82L can fill peripheral portions (e.g., the entire volume of the fin cavities 87F) of the finned via cavities 87. In one embodiment, the thickness of the dielectric material layer 82L may be greater than one half of the thickness of the sacrificial material layers (142, 242). In one embodiment, the dielectric material layer 82L can be deposited by a chemical vapor deposition process. The thickness of the dielectric material layer 82L may be in a range from 10 nm to 100 nm, such as from 20 nm to 50 nm, although lesser and greater thicknesses may also be employed. The dielectric material liner 82L can be deposited directly on all physically exposed sidewalls of the sacrificial material layers (142, 242), the sidewalls of the insulating layers (132, 232) around the finned via cavities 87, and on physically exposed sidewalls of the retro-stepped dielectric material portions (165, 265), the insulating cap layers (170, 270), the inter-tier dielectric layer 180, and the optional dielectric cover layer 271. Each unfilled volume of the finned via cavities 87 constitutes a stepped via cavity 87' including an upper portion having a greater lateral extent and a lower portion having a lesser lateral extent. The upper portion of each stepped via cavity 87' may comprise a first cylindrical cavity 87A, and the lower portion of each stepped via cavity 87' may comprise a second cylindrical cavity 87B.

Figure 11E:
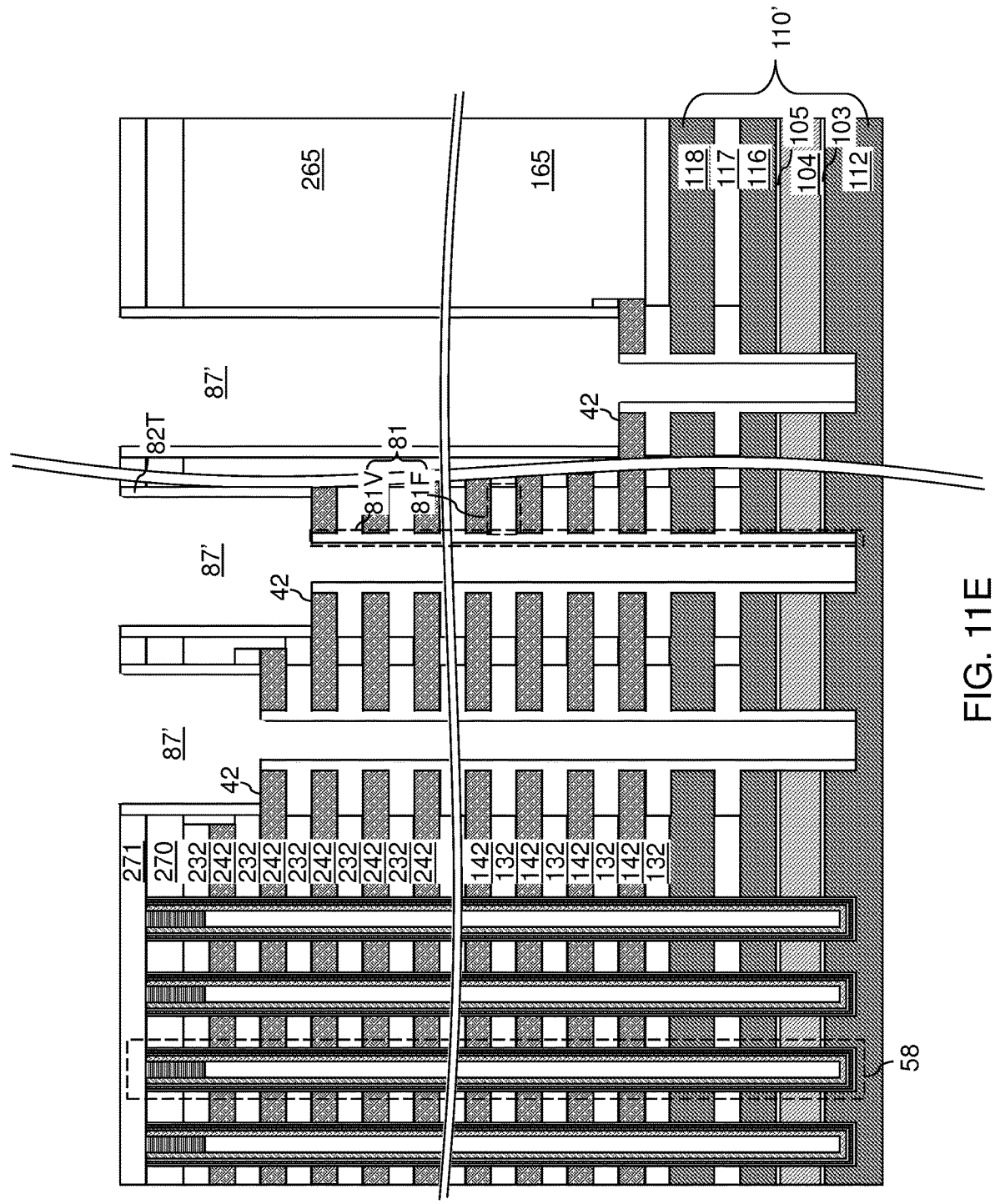

Referring to FIG. 11E, an anisotropic etch process can be performed to remove horizontally-extending portions of the dielectric material layer 82L. Each remaining portion of the dielectric material layer 82L that is located in the first cylindrical cavity 87A that overlies a respective horizontally-extending surface segment of the stepped surfaces may have a tubular configuration, and is herein referred to as a tubular dielectric liner 82T. Each remaining portion of the dielectric material layer 82L that is located in the second cylindrical cavity 87B that underlies the horizontally-extending surface segment of the stepped surfaces constitutes a dielectric support pillar 81. According to an aspect of the present disclosure, each dielectric support pillar 81 may comprise: a vertically-extending dielectric material portion 81V that extends through at least one sacrificial material layer (142, 242), and at least one annular dielectric fin portions 81F laterally protruding outward from the vertically-extending dielectric material portion 81V filling a respective fin cavity 87F. Each annular dielectric fin portion 81F may be located at a level of a respective insulating layer (132, 232), and may contact a cylindrical sidewall of the respective insulating layer (132, 232). In one embodiment, the vertically-extending dielectric material portion 81V comprises a tubular material portion having an inner cylindrical sidewall that vertically extends continuously through at least one sacrificial material layer (142, 242). An annular horizontal top surface 42 of a respective first sacrificial material layer (142 or 242) is physically exposed at the bottom of the first cylindrical cavity 87A after anisotropically etching the dielectric material layer 82L.

Figure 11F:
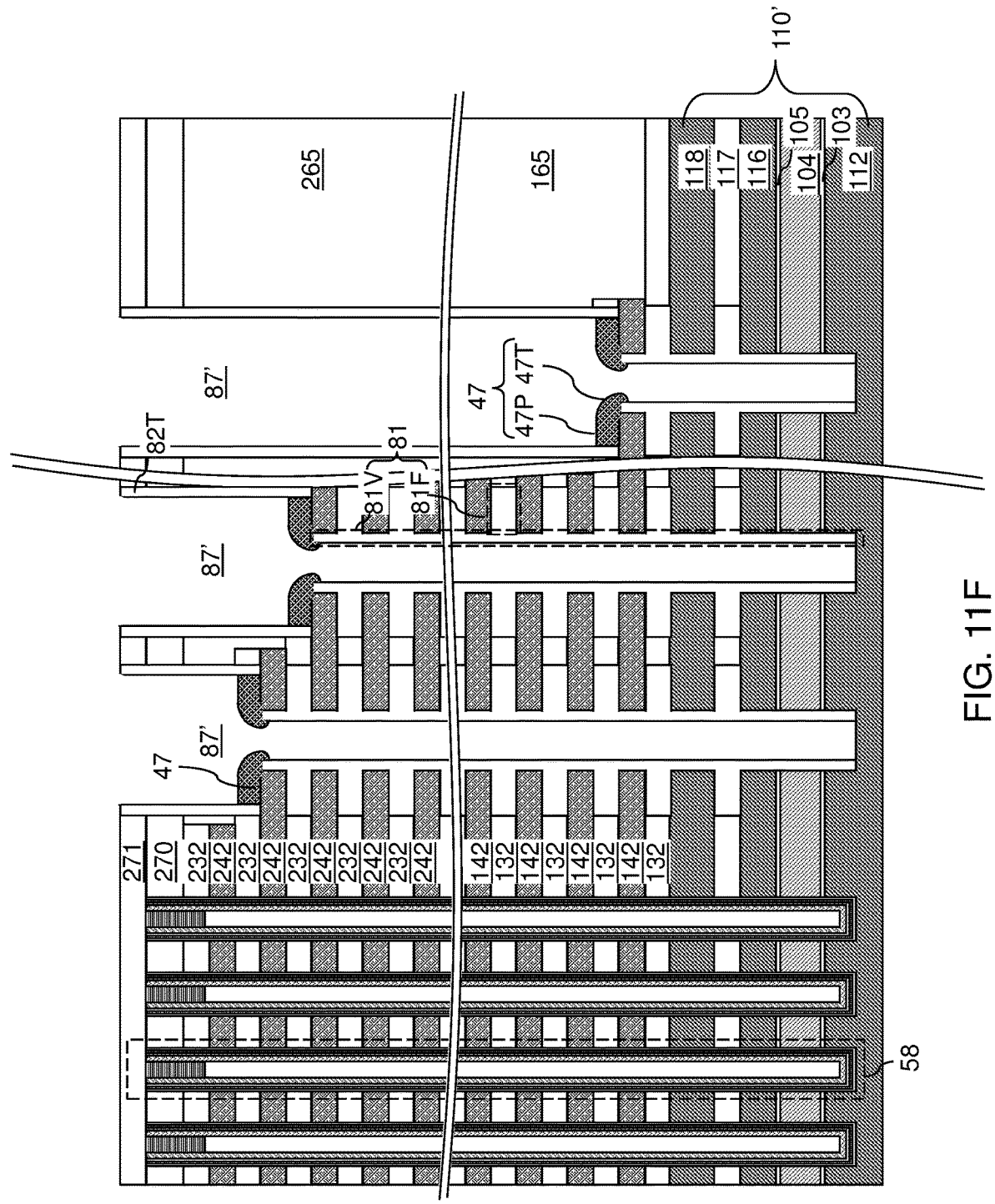

Referring to FIG. 11F, a selective deposition process can be performed to selectively deposit a sacrificial material on physically exposed surfaces (e.g., on the respective annular horizontal top surfaces 42) of the sacrificial material layers (142, 242) while suppressing growth of the sacrificial material from the physically exposed surfaces of the remaining portions of the dielectric material layer 82L, i.e., while suppressing growth of the sacrificial material from the physically exposed surfaces of the tubular dielectric liners 82T and the dielectric support pillars 81. A sacrificial annular plate 47 can be grown from each physically exposed annular horizontal top surfaces 42 of the electrically conductive layers (142, 242). The sacrificial material of the sacrificial annular plates 47 is herein referred to as a sacrificial plate material. Generally, the sacrificial plate material may be the same as or may be different from the sacrificial material of the sacrificial material layers (142, 242).

In an illustrative example, the sacrificial material layers (142, 242) may comprise and/or may consist essentially of a first silicon nitride material, and the sacrificial annular plates 47 may comprise and/or may consist essentially of a second silicon nitride material. The second silicon nitride material may be the same as or may be different from the first silicon nitride material. For example, one of the first silicon nitride material and the second silicon nitride material may be stoichiometric, and another of the first silicon nitride material and the second silicon nitride material may be non-stoichiometric, e.g., silicon-rich. Alternatively, both the first and the second silicon nitride material may be stoichiometric (i.e., comprise $Si_3N_4$).

Generally, the selective deposition process may be use a precursor gas for the sacrificial plate material that has a longer time over the surfaces of the insulating layers (132, 232) relative to the surfaces 42 of the sacrificial material layers (142, 242).

Generally, the sacrificial annular plates 47 can be formed by selectively growing the sacrificial plate material from the physically exposed annular surfaces 42 of the sacrificial material layers (142, 242) while suppressing growth of the sacrificial plate material from physically exposed surfaces the tubular dielectric liners 82T and the dielectric support pillars 81. Each sacrificial annular plate 47 can be isotropically grown from a physically exposed surface 42 of a respective sacrificial material layer (142, 242). Thus, segments of the physically exposed surfaces of the sacrificial annular plates 47 may be equidistant from a most proximal interface between the respective sacrificial material plate 47 and the surface 42 of the respective sacrificial material layer (142, 242). The distance between the physically exposed surfaces of the sacrificial annular plates 47 and an interface with a surface 42 of the respective one of the sacrificial material layers (142, 242) may be in a range from 4 nm to 100 nm, such as from 6 nm to 50 nm, although lesser and greater distances may also be employed. In one embodiment, each of the sacrificial annular plates 47 may comprise an annular planar surface segment 47P parallel to respective horizontal plane and a convex tapered annular surface segment 47T that is adjoined to an inner periphery of the annular planar surface segment 47P and having a convex vertical cross-sectional profile and an annular top-down profile. The duration of the selective deposition process can be selected such that each sacrificial annular plate 47 includes a central hole 47H therethrough.

Figure 11G:
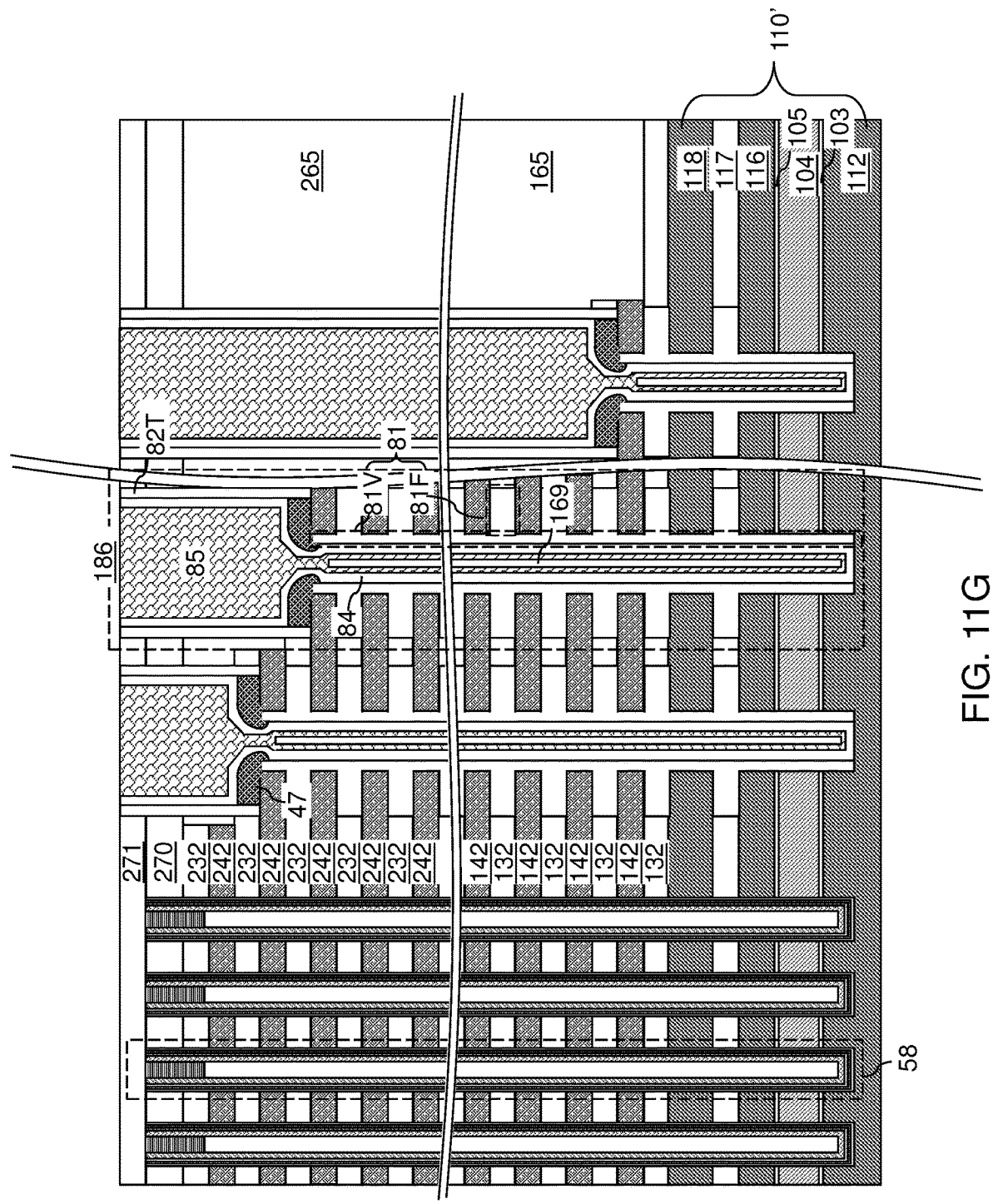

Referring to FIG. 11G, a dielectric liner 84 can be formed directly on physically exposed surfaces of the tubular dielectric liners 82T, the dielectric support pillars 81, and the sacrificial annular plates 47 by performing a conformal deposition process. The dielectric liner 84 comprises a dielectric material, such as silicon oxide or a dielectric metal oxide. The dielectric liner 84 can be formed, for example, by chemical vapor deposition or atomic layer deposition. The thickness of the dielectric liner 84 may be in a range from 2 nm to 50 nm, such as from 4 nm to 25 nm, although lesser and greater thicknesses may also be employed.

A sacrificial via fill material can be deposited in the stepped via cavities 87' by a conformal or non-conformal deposition process. The sacrificial via fill material comprises a material that can be removed selective to the material of the dielectric liner 84. The sacrificial via fill material may comprise a semiconductor material (such as amorphous silicon, polysilicon, or a silicon-germanium alloy), a carbon-based material (such as amorphous carbon, diamond-like carbon, or a doped derivative therefrom), an organosilicate glass material, or a polymer material.

Portions of the sacrificial via fill material and the dielectric liner 84 that overlie the horizontal plane including the top surface of the dielectric cover layer 271 can be removed by performing a planarization process. The planarization process may comprise a chemical mechanical polishing (CMP) process and/or a recess etch process. Each remaining portion of the sacrificial via fill material is herein referred to as a sacrificial via fill material potion 85. In one embodiment, an encapsulated cavity (i.e., an air gap) 169 may be present within one or more of the sacrificial via fill material portions 85, such as portions 85 located in the second cylindrical cavity 87B. Alternatively, the air gap may be omitted.

Each combination of all material portions filling a respective finned via cavity 87 is herein referred to as an in-process integrated contact-and-support assembly 186. Each in-process integrated contact-and-support assembly 186 comprises a dielectric support pillar 81, a tubular dielectric liner 82T, a sacrificial via fill material portion 85, a dielectric liner 84, and an optional encapsulated cavity 169.

Figure 12A:
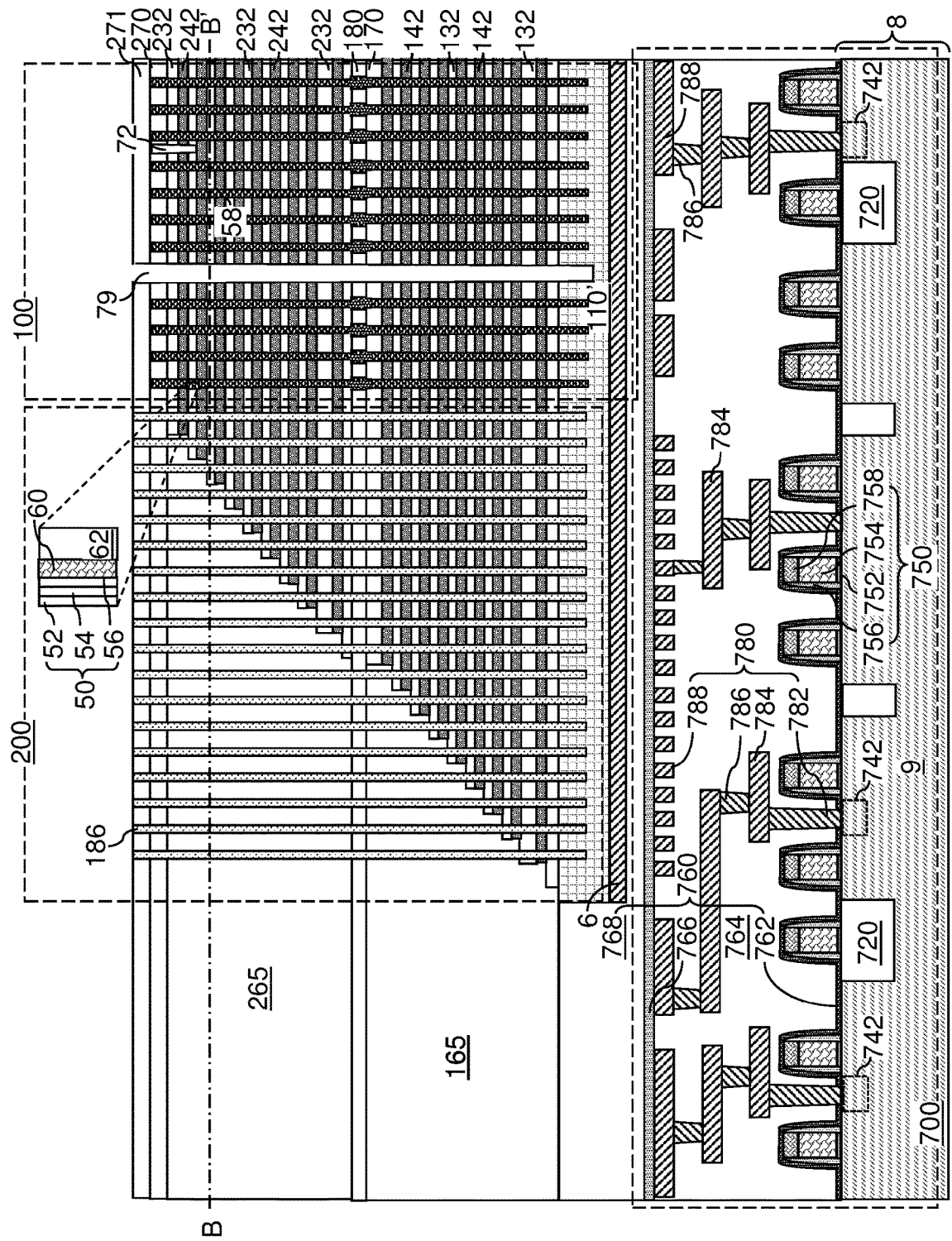
FIG. 12A is a vertical cross-sectional view of the first exemplary structure after formation of backside trenches according to the first embodiment of the present disclosure.
Figure 12B:
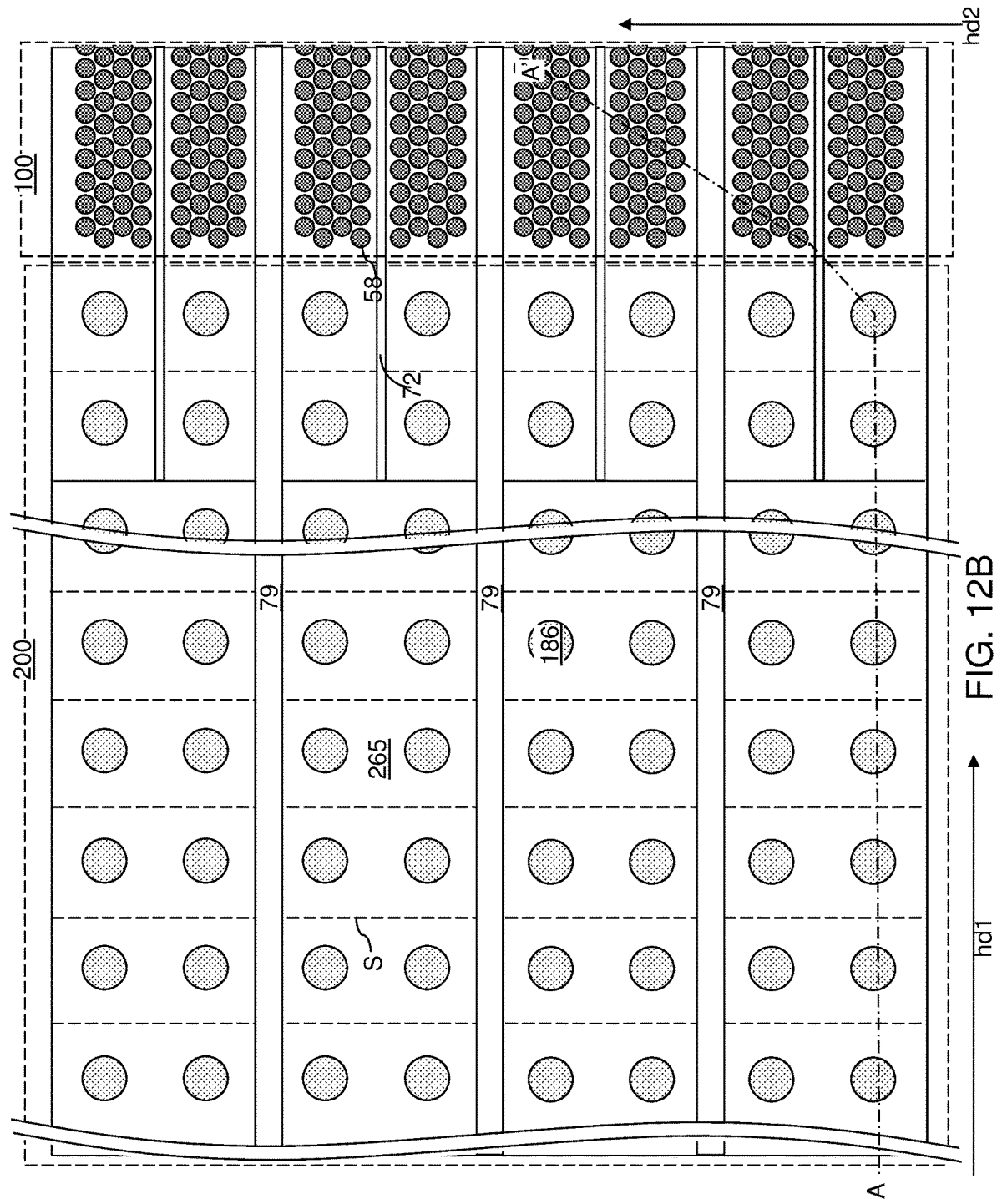
FIG. 12B is a horizontal cross-sectional of the first exemplary structure along the horizontal plane B-B' of FIG. 12A. The zig-zag vertical plane A-A' corresponds to the plane of the vertical cross-sectional view of FIG. 12A.

Referring to FIGS. 12A and 12B, a photoresist layer (not shown) can be applied over the dielectric cover layer 271, and can be lithographically patterned to form openings within areas extending across the memory array region 100 and the staircase region 200. The openings in the photoresist layer can laterally extend along the first horizontal direction hd1 between each neighboring cluster of memory opening fill structures 58. Backside trenches 79 can be formed by transferring the pattern in the photoresist layer through the dielectric cover layer 271, the second alternating stack (232, 242, 270, 265, 72), the first alternating stack (132, 142, 170, 165), and the in-process source-level material layers 110'. Portions of the dielectric cover layer 271, the second alternating stack (232, 242, 270, 265, 72), the first alternating stack (132, 142, 170, 165), and the in-process source-level material layers 110' that underlie the openings in the photoresist layer can be removed to form backside trenches 79. In one embodiment, the backside trenches 79 can be formed between clusters of memory opening fill structures 58. The clusters of the memory opening fill structures 58 can be laterally spaced apart along the second horizontal direction hd2 by the backside trenches 79.

Generally, at least one vertically alternating sequence of continuous insulating layers (132, 232) and continuous spacer material layers (such as the continuous sacrificial material layers (142, 242)) can be divided into alternating stacks {(132, 146), (232, 246)} of insulating layers (132, 232) and spacer material layers (such as sacrificial material layers (142, 242)) by forming backside trenches 79 that laterally extend along a first horizontal direction hd1 and laterally spaced apart along a second horizontal direction hd2. The dielectric cover layer 271 is divided into a plurality of dielectric cover layers 271 by the backside trenches 79.

Figure 13A:
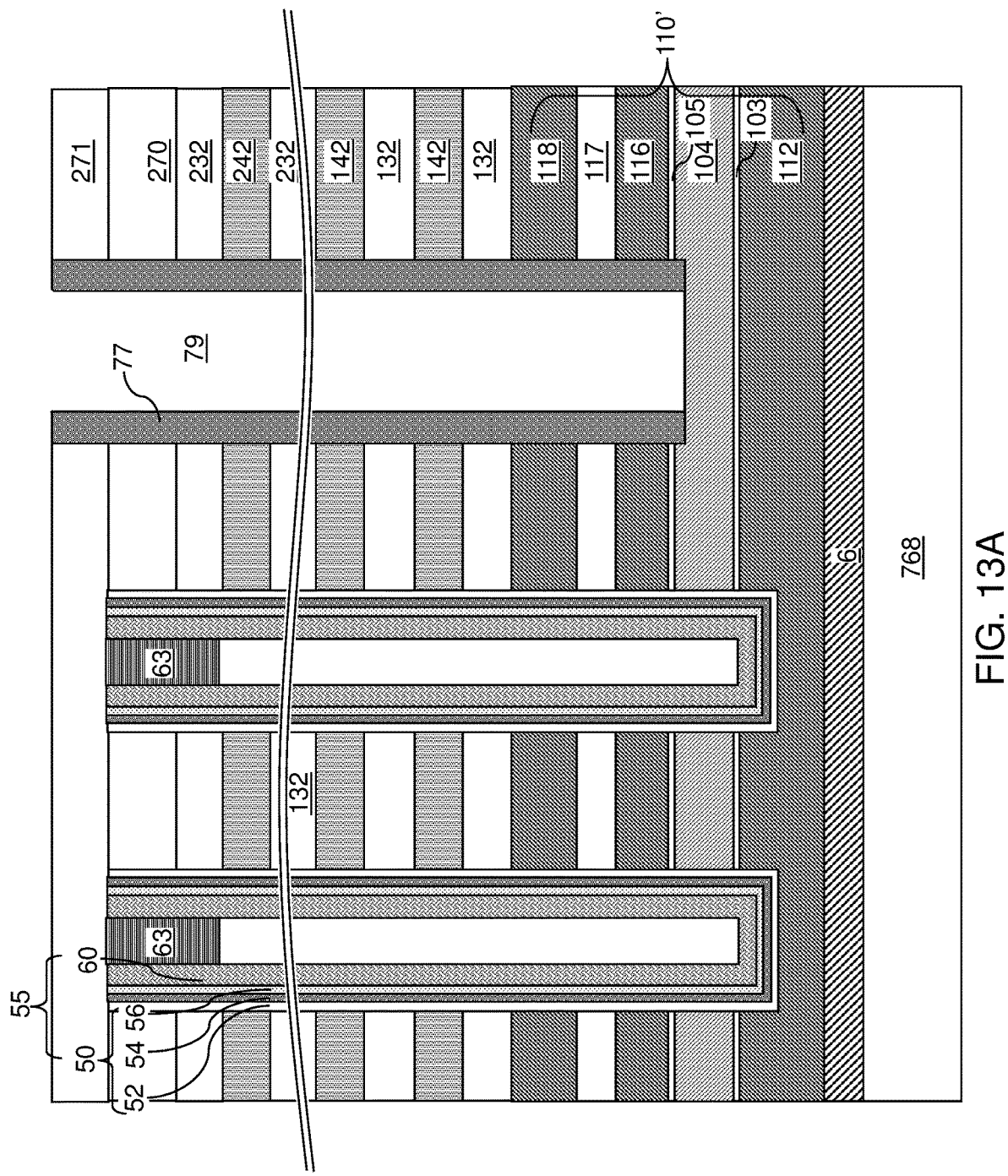
FIGS. 13A-13E illustrate sequential vertical cross-sectional views of a region of the first exemplary structure during formation of a source-level material layers according to the first embodiment of the present disclosure.

Referring to FIG. 13A, a backside trench spacer 77 can be formed on sidewalls of each backside trench 79. For example, a conformal spacer material layer can be deposited in the backside trenches 79 and over the dielectric cover layer 271, and can be anisotropically etched to form the backside trench spacers 77. The backside trench spacers 77 include a material that is different from the material of the source-level sacrificial layer 104. For example, the backside trench spacers 77 can include silicon oxide, a dielectric metal oxide, or silicon nitride.

Figure 13B:
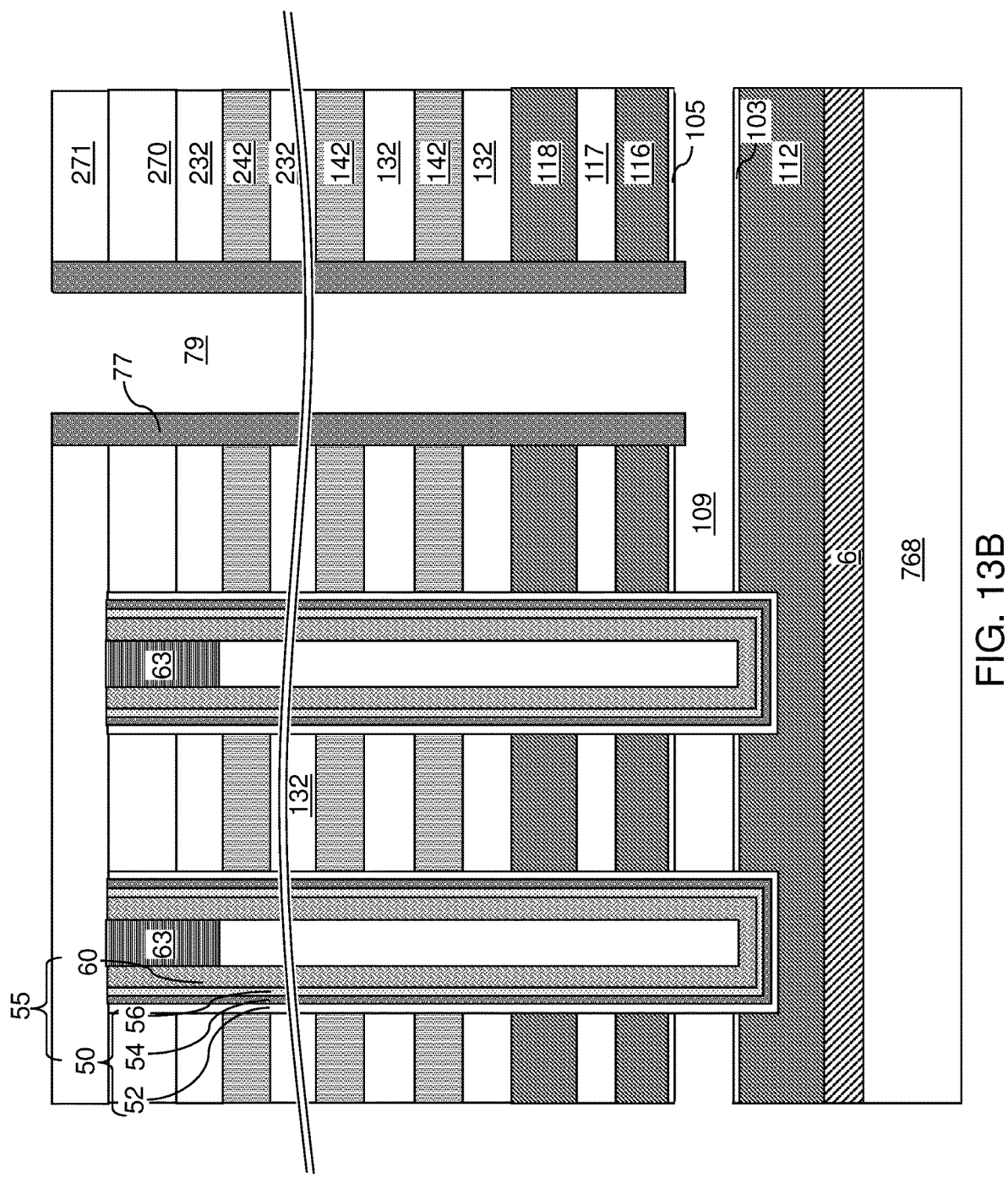

Referring to FIG. 13B, an etchant that etches the material of the source-level sacrificial layer 104 selective to the materials of the first alternating stack (132, 142), the second alternating stack (232, 242), the first and second insulating cap layers (170, 270), the upper dielectric liner layer 105, and the lower dielectric liner layer 103 can be introduced into the backside trenches 79 in an isotropic etch process. For example, if the source-level sacrificial layer 104 includes undoped amorphous silicon or undoped polysilicon, the backside trench spacers 77 include silicon nitride, and the upper and lower dielectric liner layers (105, 103) include silicon oxide, a wet etch process employing hot trimethyl-2 hydroxyethyl ammonium hydroxide ("hot TMY") or tetramethyl ammonium hydroxide (TMAH) can be employed to remove the source-level sacrificial layer 104 selective to the backside trench spacers 77 and the upper and lower dielectric liner layers (105, 103). Alternatively, if the source-level sacrificial material layer 104 includes silicon nitride, the backside trench spacers 77 include silicon oxide or a dielectric metal oxide, and the upper and lower dielectric liner layers (105, 103) include silicon oxide, a wet etch process employing hot phosphoric acid can be employed to remove the source-level sacrificial layer 104 selective to the backside trench spacers 77 and the upper and lower dielectric liner layers (105, 103). A source cavity 109 is formed in the volume from which the source-level sacrificial layer 104 is removed.

Figure 13C:
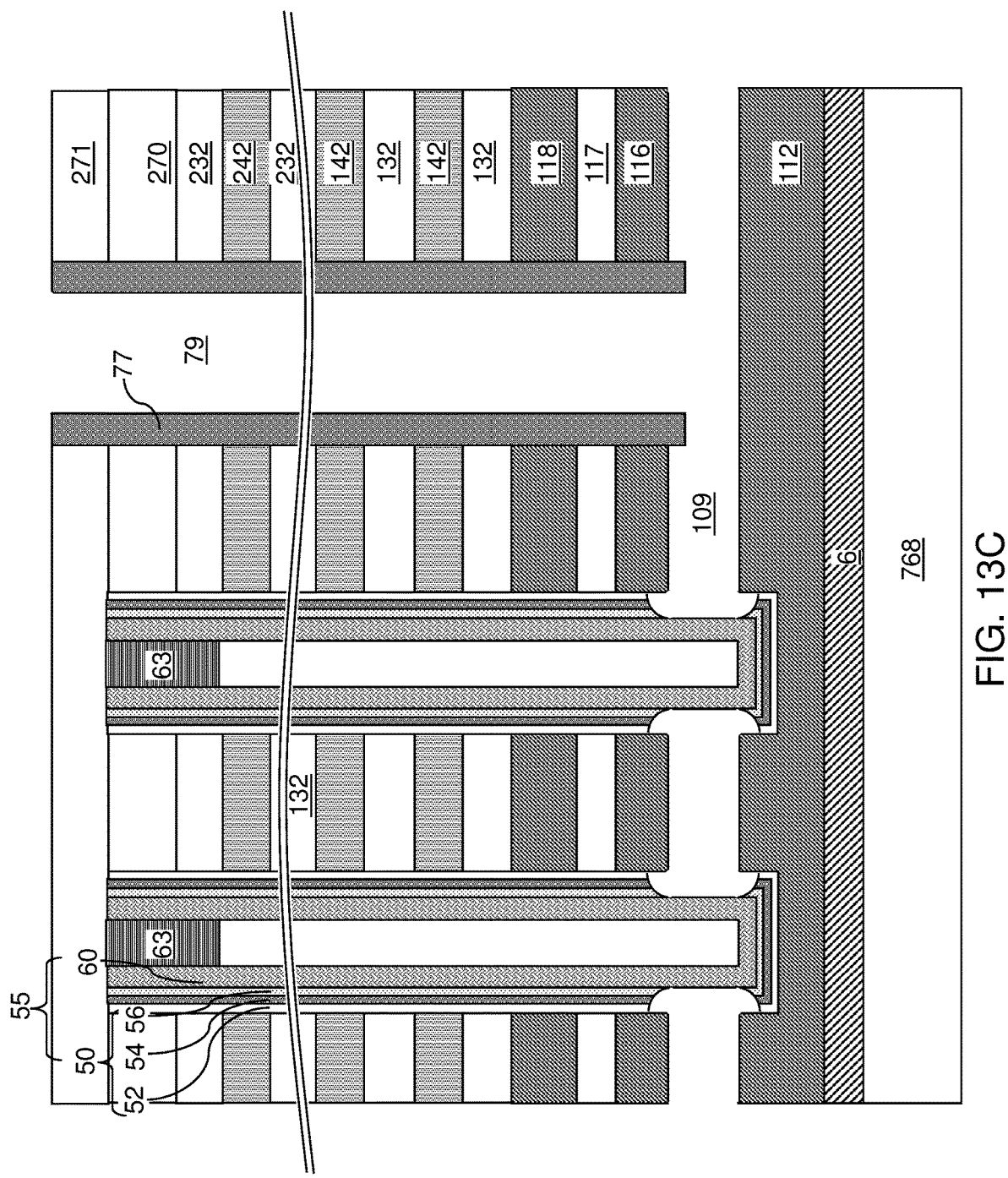

Referring to FIG. 13C, a sequence of isotropic etchants, such as wet etchants, can be applied through the backside trenches 79 and the source cavity 109 to the physically exposed portions of the memory films 50 to sequentially etch the various component layers of the memory films 50 from outside to inside, and to physically expose bottom surfaces and cylindrical side surfaces of the vertical semiconductor channels 60 at the level of the source cavity 109. The upper and lower dielectric liner layers (105, 103) can be collaterally etched during removal of the portions of the memory films 50 located at the level of the source cavity 109. The source cavity 109 can be expanded in volume by removal of the portions of the memory films 50 at the level of the source cavity 109 and the upper and lower dielectric liner layers (105, 103). A top surface of the lower source-level material layer 112 and a bottom surface of the upper source-level material layer 116 can be physically exposed to the source cavity 109. An outer sidewall of each vertical semiconductor channel 60 is physically exposed to the source cavity 109 after removing the physically exposed portions of the memory films 50. A dielectric material stack 150 is formed underneath each physically exposed cylindrical surface of the vertical semiconductor channels 60. Each dielectric material stack 150 is a remaining portion of the memory films 50, and includes the same dielectric material stack as the memory films 50.

Thus, the upper source-level material layer 116 can act as an etch stop during the selective etching of the memory film 50 through the source cavity 109 and can prevent lateral expansion of the source cavity 109. This prevents a short circuit between the source-select-level conductive layer 118 and a source contact layer that is subsequently formed in the source cavity 109 during a subsequent step.

Figure 13D:
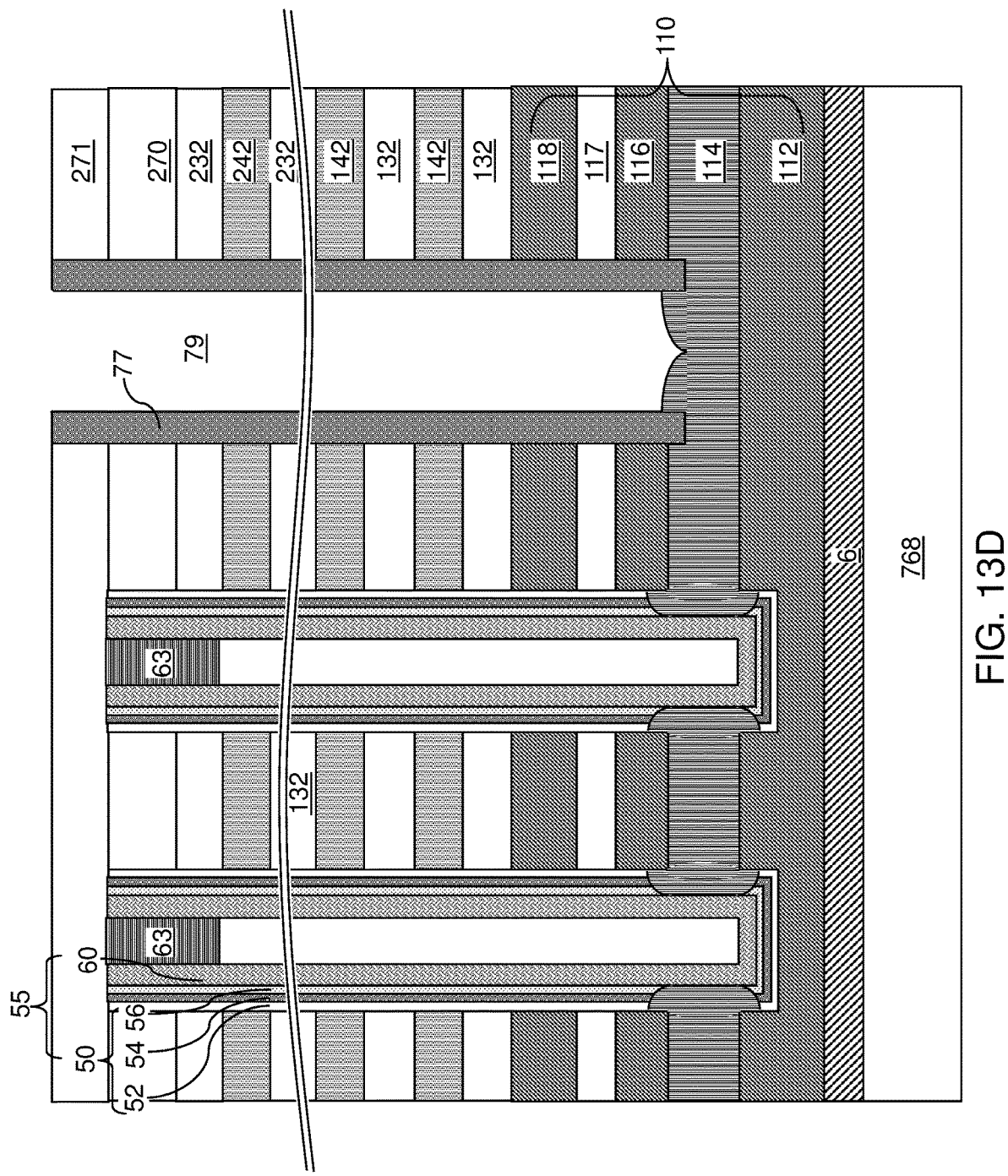

Referring to FIG. 13D, a source contact layer 114 can be formed by a selective deposition process that deposits a doped semiconductor material having a doping of the second conductivity type, which is herein referred to as a third doped semiconductor material. The doped semiconductor material can include amorphous silicon, polysilicon, or a silicon-germanium alloy. The third doped semiconductor material of the source contact layer 114 can grow from physically exposed semiconductor surfaces around the source cavity 109. The average atomic concentration of dopants of the second conductivity type in the source contact layer 114 can be in a range from $5.0 \times 10^{19}/cm^3$ to $2.0 \times 10^{21}/cm^3$, although lesser and greater dopant concentrations can also be employed.

The in-process source-level material layers 110' are replaced with source-level material layers 110. The source-level material layers 110 include a layer stack including, from bottom to top, the lower source-level material layer 112, the source contact layer 114, the upper source-level material layer 116, the source-level insulating layer 117, and the optional source-select-level conductive layer 118. The combination of the lower source-level material layer 112, the source contact layer 114, the upper source-level material layer 116 constitutes a source layer (112, 114, 116). Upon replacement of the source-level sacrificial layer 104 with a source contact layer 114, the in-process source-level material layers 110' are converted into source-level material layers 110 including a source layer (112, 114, 116).

Figure 13E:
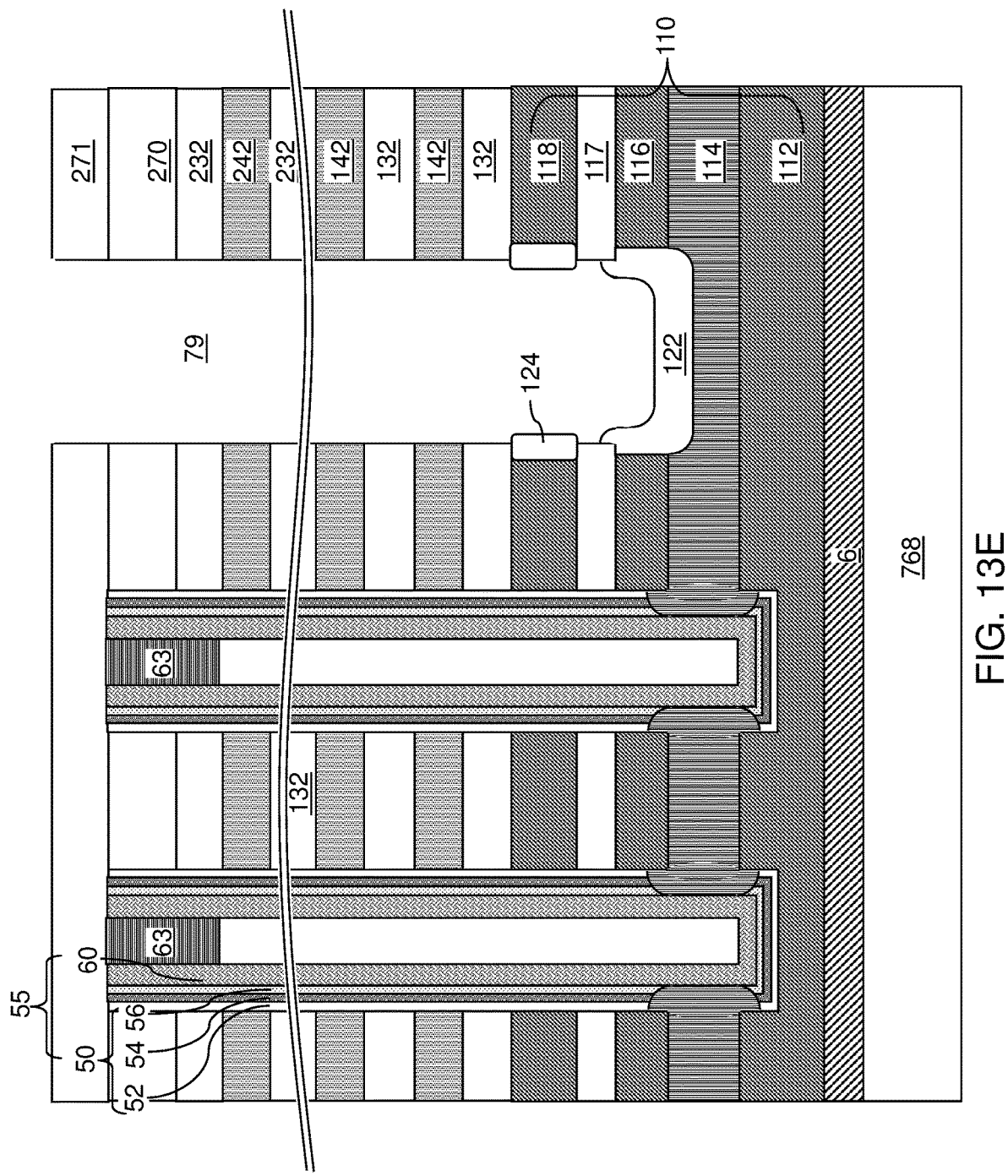
Figure 14:
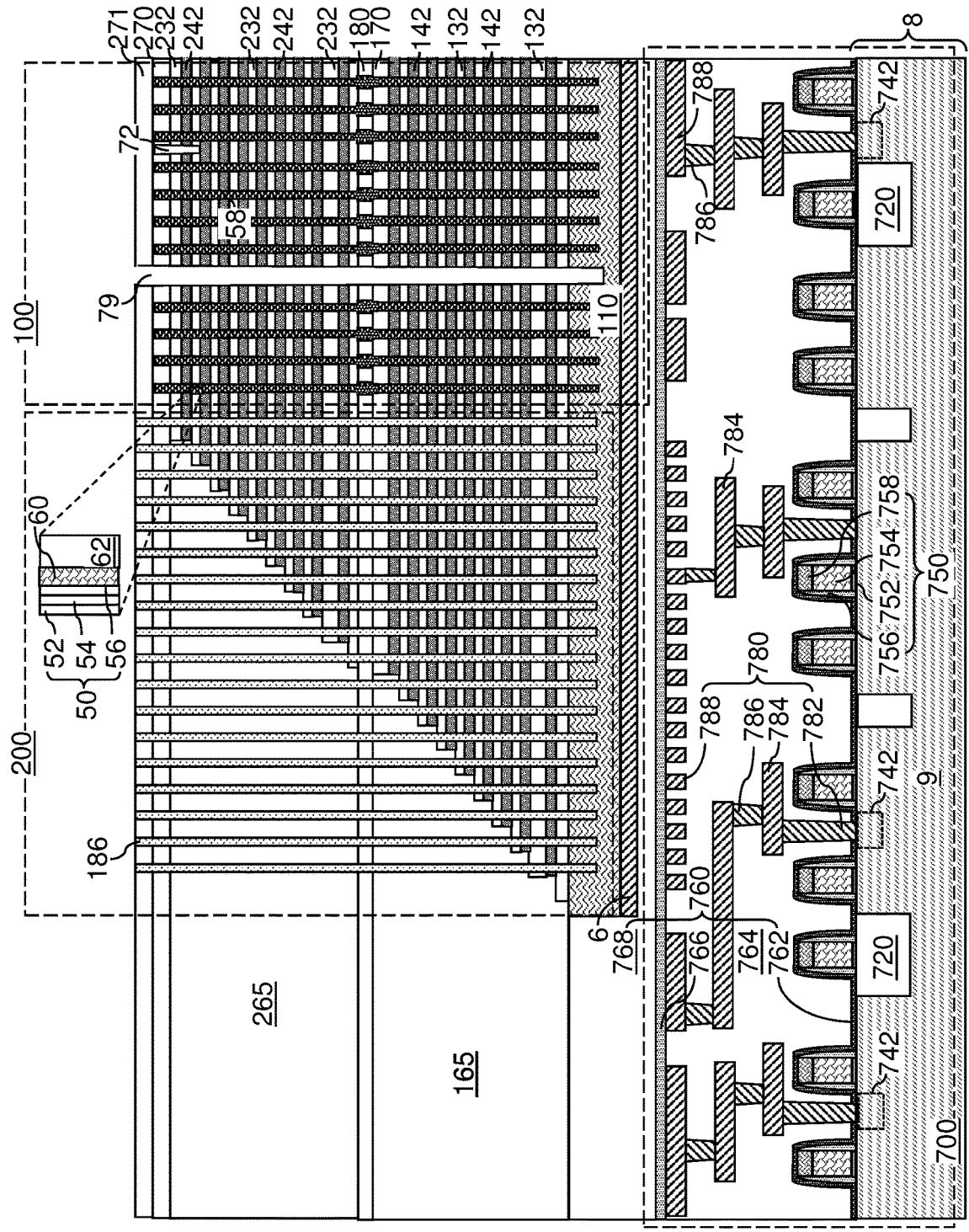
FIG. 14 is a vertical cross-sectional view of the first exemplary structure after formation of the source-level material layers according to the first embodiment of the present disclosure.

Referring to FIGS. 13E and 14, the backside trench spacers 77 can be removed selective to the semiconductor materials of the source contact layer 114. For example, if the backside trench spacers 77 include silicon nitride, a wet etch process employing hot phosphoric acid can be employed to remove the backside trench spacers 77. If the backside trench spacers 77 include silicon oxide, a wet etch process employing dilute hydrofluoric acid can be employed to remove the backside trench spacers 77. Sidewalls of the first and second alternating stacks (132, 142, 232, 242), the upper source-level material layer 116, the source-level insulating layer 117, and the optional source-select-level conductive layer 118 can be physically exposed after removal of the backside trench spacers 77.

A thermal oxidation process can be performed to convert physically exposed surface portions of various semiconductor materials into semiconductor oxide portions. Specifically, physically exposed surface portions of the source contact layer 114, the upper source-level material layer 116, and the source-select-level conductive layer 118 (if present) are converted into thermal semiconductor oxide material portions. As used herein, a "thermal semiconductor oxide" refers to a material that is formed by thermal oxidation of a semiconductor material. Unlike a semiconductor oxide material formed by chemical vapor deposition, thermal semiconductor oxide materials do not include carbon or hydrogen above a trace level unless the semiconductor material from which the semiconductor oxide material is derived includes carbon prior to a thermal oxidation process.

The thermal oxidation process forms a semiconductor oxide plate 122 at the bottom of each backside trench 79 and semiconductor oxide rails 124 on sidewalls of the source-select-level conductive layer 118. The semiconductor oxide rails 124 are not illustrated in FIG. 14 for clarity. The semiconductor oxide plate 122 includes various thermal semiconductor oxide material portions formed by thermal conversion of surface portions of the source contact layer 114 and the upper source-level material layer 116.

The layer stack including the lower source-level material layer 112, the source contact layer 114, and the upper source-level material layer 116 constitutes a source layer (112, 114, 116), which is a buried source layer that functions as a common source region that is connected each of the vertical semiconductor channels 60 and has a doping of the second conductivity type. The average dopant concentration in the buried source layer (112, 114, 116) can be in a range from $5.0 \times 10^{19}/cm^3$ to $2.0 \times 10^{21}/cm^3$, although lesser and greater dopant concentrations can also be employed.

Figure 15:
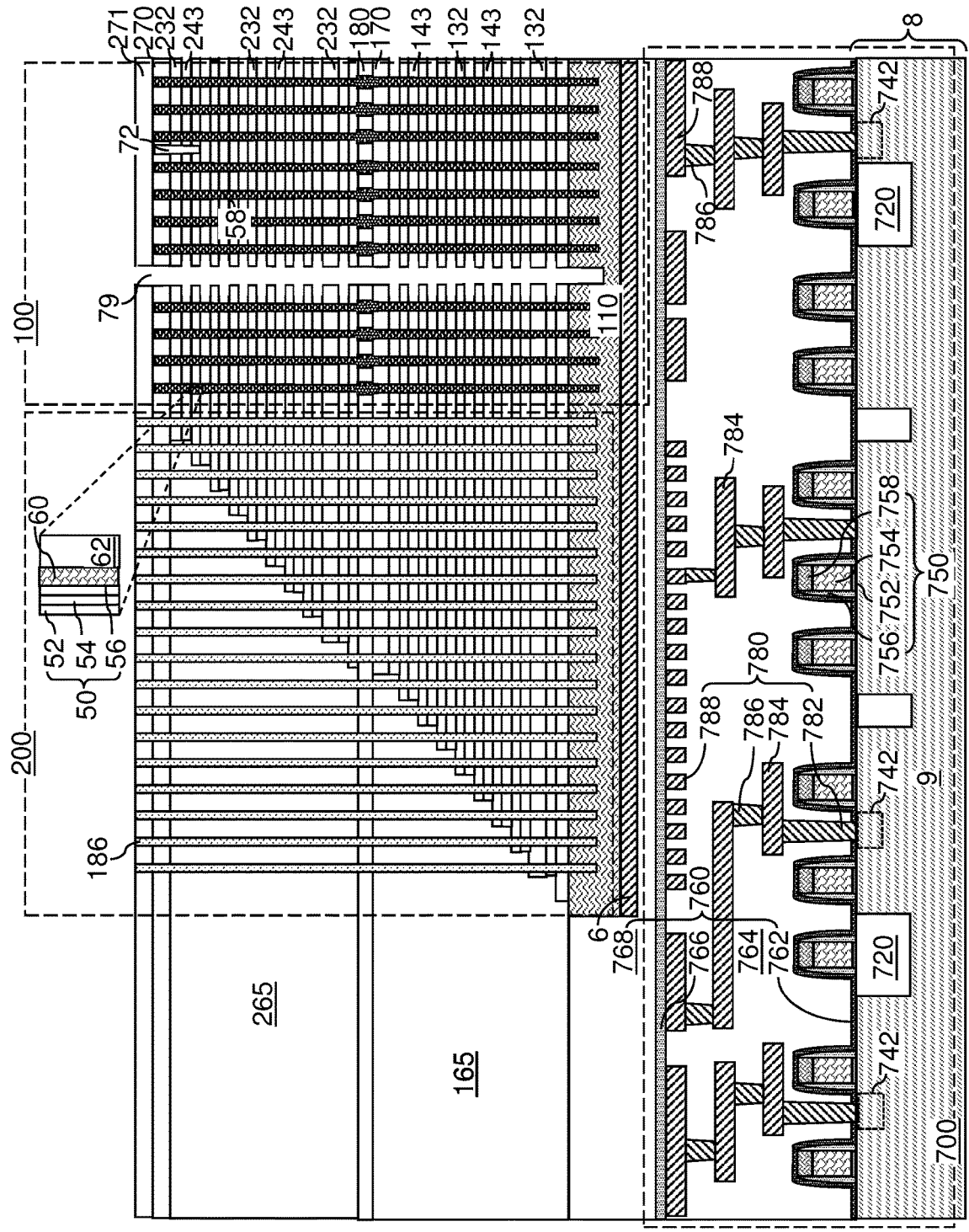
FIG. 15 is a vertical cross-sectional view of the first exemplary structure after formation of backside recesses according to the first embodiment of the present disclosure.

Referring to FIG. 15, an etchant that selectively etches the materials of the first and second sacrificial material layers (142, 242) with respect to the materials of the first and second insulating layers (132, 232), the first and second retro-stepped dielectric material portions (165, 265), and the material of the outermost layer of the memory films 50 can be introduced into the backside trenches 79, for example, employing an isotropic etch process. For example, the first and second sacrificial material layers (142, 242) can include silicon nitride, the materials of the first and second insulating layers (132, 232), the first and second insulating cap layers (170, 270), the first and second retro-stepped dielectric material portions (165, 265), and the material of the outermost layer of the memory films 50 can include silicon oxide materials. First backside recesses 143 are formed in volumes from which the first sacrificial material layers 142 are removed. Second backside recesses 243 are formed in volumes from which the second sacrificial material layers 242 are removed.

The isotropic etch process can be a wet etch process employing a wet etch solution, or can be a gas phase (dry) etch process in which the etchant is introduced in a vapor phase into the backside trenches 79. For example, if the first and second sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials employed in the art.

Each of the first and second backside recesses (143, 243) can be a laterally extending cavity having a lateral dimension that is greater than the vertical extent of the cavity. In other words, the lateral dimension of each of the first and second backside recesses (143, 243) can be greater than the height of the respective backside recess (143, 243). A plurality of first backside recesses 143 can be formed in the volumes from which the material of the first sacrificial material layers 142 is removed. A plurality of second backside recesses 243 can be formed in the volumes from which the material of the second sacrificial material layers 242 is removed. Each of the first and second backside recesses (143, 243) can extend substantially parallel to the top surface of the substrate 8. A backside recess (143, 243) can be vertically bounded by a top surface of an underlying insulating layer (132 or 232) and a bottom surface of an overlying insulating layer (132 or 232). In one embodiment, each of the first and second backside recesses (243, 243) can have a uniform height throughout.

Figure 16A:
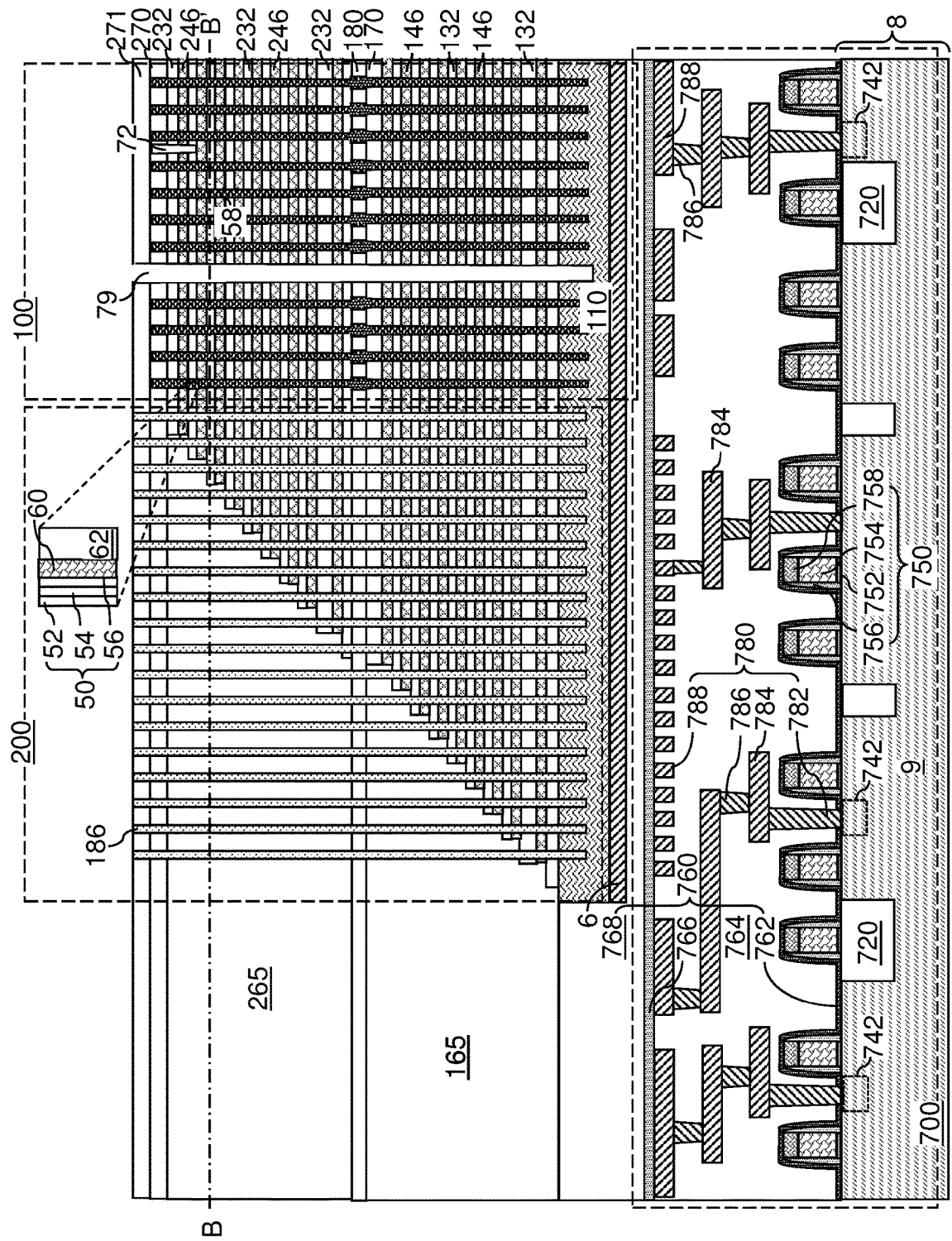
FIG. 16A is a vertical cross-sectional view of the first exemplary structure after formation of electrically conductive layers in the backside recesses according to the first embodiment of the present disclosure.
Figure 16B:
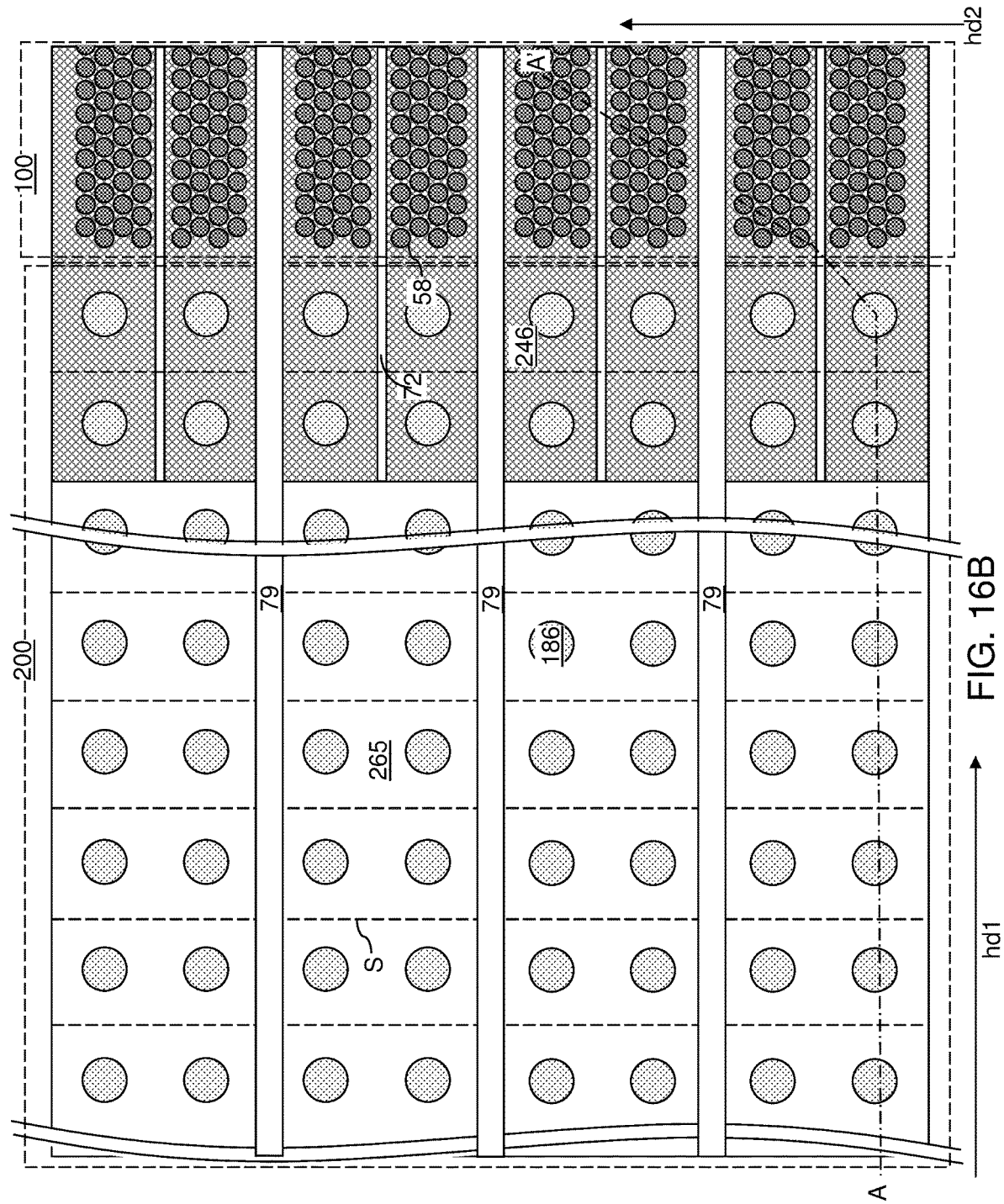
FIG. 16B is a horizontal cross-sectional view of the first exemplary structure along the horizontal plane B-B' of FIG. 16A. The zig-zag vertical plane A-A' corresponds to the plane of the vertical cross-sectional view of FIG. 16A.

Referring to FIGS. 16A and 16B, a backside blocking dielectric layer (not shown) can be optionally deposited in the backside recesses and the backside trenches 79 and over the dielectric cover layer 271. At least one conductive material can be deposited in the plurality of backside recesses (243, 243), on the sidewalls of the backside trench 79, and over the dielectric cover layer 271. The at least one conductive material can include at least one metallic material, i.e., an electrically conductive material that includes at least one metallic element.

A plurality of electrically conductive layers 146 can be formed in the plurality of first backside recesses 143, a plurality of second electrically conductive layers 246 can be formed in the plurality of second backside recesses 243, and a continuous metallic material layer (not shown) can be formed on the sidewalls of each backside trench 79 and over the dielectric cover layer 271. Thus, the first and second sacrificial material layers (142, 242) can be replaced with the first and second conductive material layers (146, 246), respectively. Specifically, each first sacrificial material layer 142 can be replaced with an optional portion of the backside blocking dielectric layer and an electrically conductive layer 146, and each second sacrificial material layer 242 can be replaced with an optional portion of the backside blocking dielectric layer and a second electrically conductive layer 246. A backside cavity is present in the portion of each backside trench 79 that is not filled with the continuous metallic material layer.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses can be a combination of titanium nitride layer and a tungsten fill material. In one embodiment, the metallic material can be deposited by chemical vapor deposition or atomic layer deposition.

The deposited metallic material of the continuous metallic material layer can be etched back from the sidewalls of each backside trench 79 and from above the dielectric cover layer 271, for example, by an anisotropic or isotropic etch. Each remaining portion of the deposited metallic material in the first backside recesses constitutes an electrically conductive layer 146. Each remaining portion of the deposited metallic material in the second backside recesses constitutes a second electrically conductive layer 246. Each electrically conductive layer (146, 246) can be a conductive line structure.

A subset of the second electrically conductive layers 246 located at the levels of the drain-select-level isolation structures 72 constitutes drain select gate electrodes. A subset of the electrically conductive layer (146, 246) located underneath the drain select gate electrodes can function as combinations of a control gate and a word line located at the same level. The control gate electrodes within each electrically conductive layer (146, 246) are the control gate electrodes for a vertical memory device including the memory stack structure 55. The source-select-level conductive layer 118 functions as a source select gate electrode.

Each of the memory opening fill structures 58 (which contains a respective memory stack structures 55) comprises a vertical stack of memory elements located at each level of the electrically conductive layers (146, 246). A subset of the electrically conductive layers (146, 246) can comprise word lines for the memory elements. The semiconductor devices in the underlying peripheral device region 700 can comprise word line switch devices configured to control a bias voltage to respective word lines. The memory-level assembly includes all structures located above the topmost surface of the lower-level metal interconnect structures 780, and is located over, and is vertically spaced from, the substrate semiconductor layer 9. The memory-level assembly includes at least one alternating stack (132, 146, 232, 246) and memory stack structures 55 vertically extending through the at least one alternating stack (132, 146, 232, 246). Each alternating stack (132, 146, 232, 246) includes alternating layers of respective insulating layers (132 or 232) and respective electrically conductive layers (146 or 246). The at least one alternating stack (132, 146, 232, 246) comprises staircase regions that include terraces in which each underlying electrically conductive layer (146, 246) extends farther along the first horizontal direction hd1 than any overlying electrically conductive layer (146, 246) in the memory-level assembly.

Alternating stacks {(132, 146), (232, 246)} of insulating layers (132, 232) and electrically conductive layers (146, 246) are formed, which are laterally spaced apart from each other by the backside trenches 79 along the second horizontal direction hd2. The source layer (112, 114, 116) comprises: a lower source-level material layer 112 comprising a first doped semiconductor material; an upper source-level material layer 116 comprising a second doped semiconductor material; and a source contact layer 114 comprising a third doped semiconductor material located between the upper source-level material layer 116 and the lower source-level material layer 112. In one embodiment, each of the vertical semiconductor channels 60 is in contact with the source contact layer 114. In one embodiment, each of the memory opening fill structures 58 comprises a respective memory film 50 that laterally surrounds the respective vertical semiconductor channel 60, has a respective annular concave bottom surface contacting the source contact layer 114, and has a respective cylindrical outer surface contacting the upper source-level material layer 116 and each insulating layer within a respective one of the alternating stacks {(132, 146), (232, 246)}.

Figure 17:
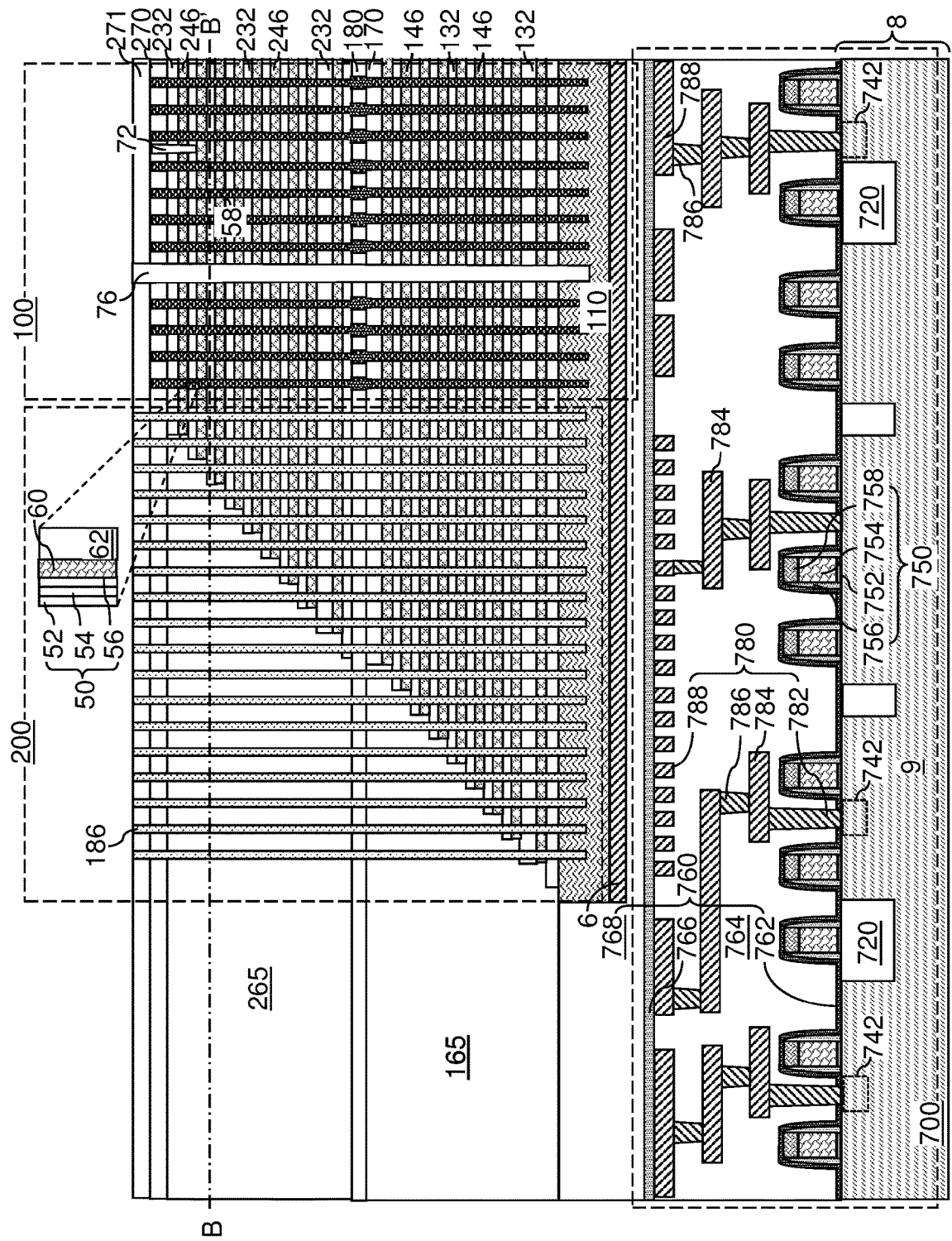
FIG. 17 is a vertical cross-sectional view of the first exemplary structure after formation of backside trench fill structures according to the first embodiment of the present disclosure.

Referring to FIG. 17, a dielectric fill material such as silicon oxide can be conformally deposited in the backside trenches 79. The dielectric fill material may be deposited by a conformal deposition process such as a low pressure chemical vapor deposition (LPCVD) process. The duration of the deposition process employed to deposit the dielectric fill material may be selected such that the dielectric fill material fills the backside trenches 79. A recess etch process may be subsequently performed to remove portions of the dielectric fill material that are deposited over the dielectric cover layer 271. For example, the recess etch process may comprise an isotropic etch process such as a wet etch process. Each remaining portion of the dielectric fill material that fills the backside trenches 79 constitutes a dielectric trench fill structure 76.

FIGS. 18A-18F are sequential vertical cross-sectional views of the staircase region 200 of the first exemplary structure during formation of integrated contact-and-support assemblies 187, drain contact via structures 88, and connection via structures 286 according to the first embodiment of the present disclosure.

Figure 18A:
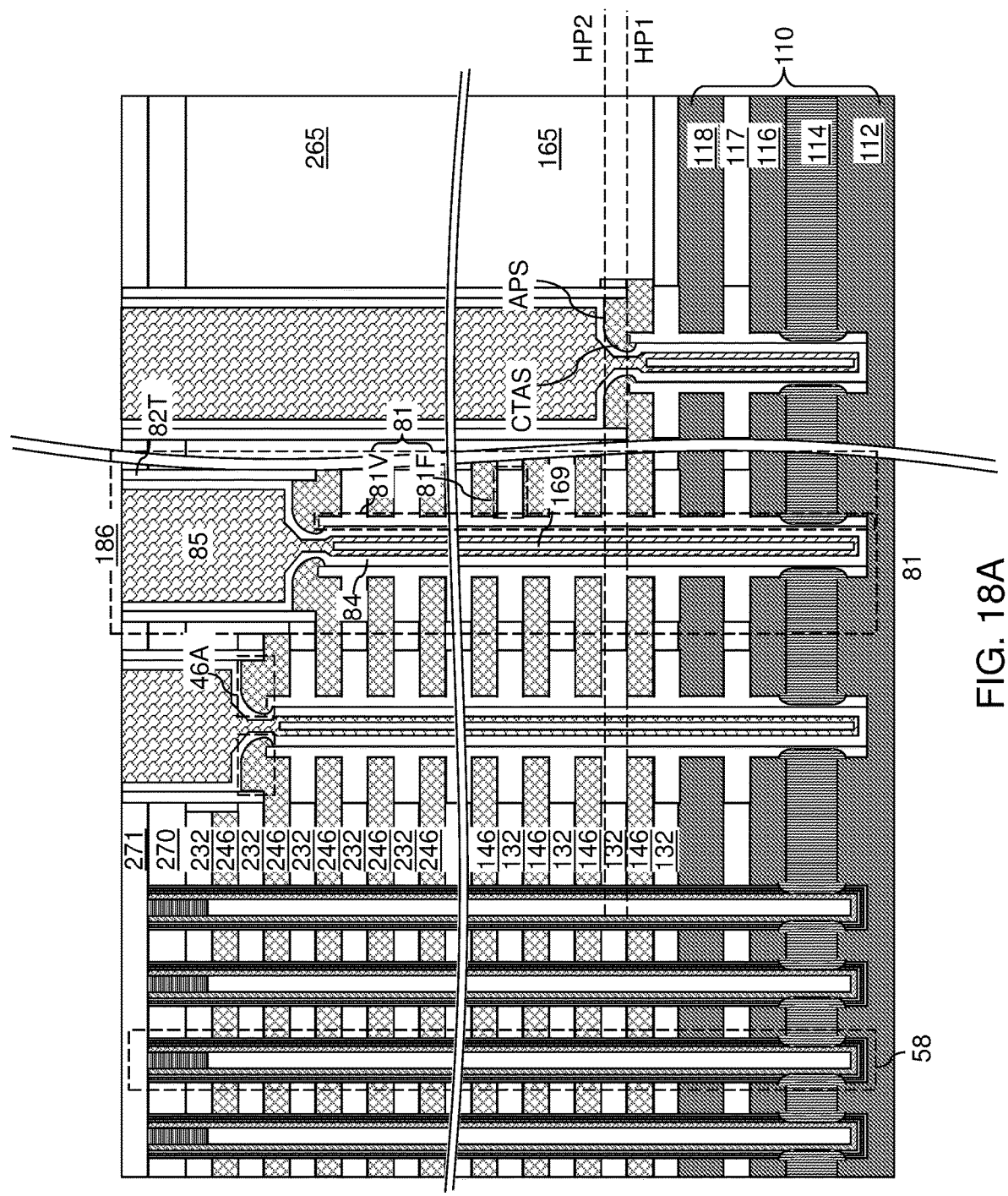
FIGS. 18A-18F are sequential vertical cross-sectional views of the staircase region of the first exemplary structure during formation of integrated contact-and-support assemblies, drain contact via structures, and connection via structures according to the first embodiment of the present disclosure.

Referring to FIG. 18A, the staircase region 200 of the first exemplary structure is illustrated at the processing steps of FIGS. 17A and 17B. Generally, the sacrificial annular plates 47 are removed together with the sacrificial material layers (142, 242) during formation of the backside recesses (143, 243). Pad cavities which are connected to respective backside recesses (143, 242) are formed after removal of the sacrificial annular plates 47. The sacrificial annular plates 47 are replaced with conductive annular pad portions 46A which are formed in the pad cavities during formation of the electrically conductive layer (146, 246). Each electrically conductive layer (146, 246) can comprise a respective conductive annular pad portion 46A that protrudes above a respective first horizontal plane HP1 including the top surface of the portion the respective electrically conductive layer (146, 246) which fills a respective backside recess (143, 243) in the memory array region 100. In one embodiment, each conductive annular pad portion 46A may comprise a contoured top surface including an annular planar surface segment APS contained within a respective second horizontal plane HP2 that overlies the respective first horizontal plane HP1, and may further comprise a convex tapered annular surface segment CTAS that is adjoined to an inner periphery of the annular planar surface segment APS and having a convex vertical cross-sectional profile and an annular top-down profile. The annular planar surface segment APS may extend vertically from the second horizontal plate HP2 down to at least the first horizontal plane HP1. Each conductive annular pad portion 46A is located above an annular portion of the respective electrically conductive layer (146, 246) that laterally surrounds the opening through the respective electrically conductive layer (146 or 246) that is filled by the integrated contact-and-support assembly 186.

Figure 18B:
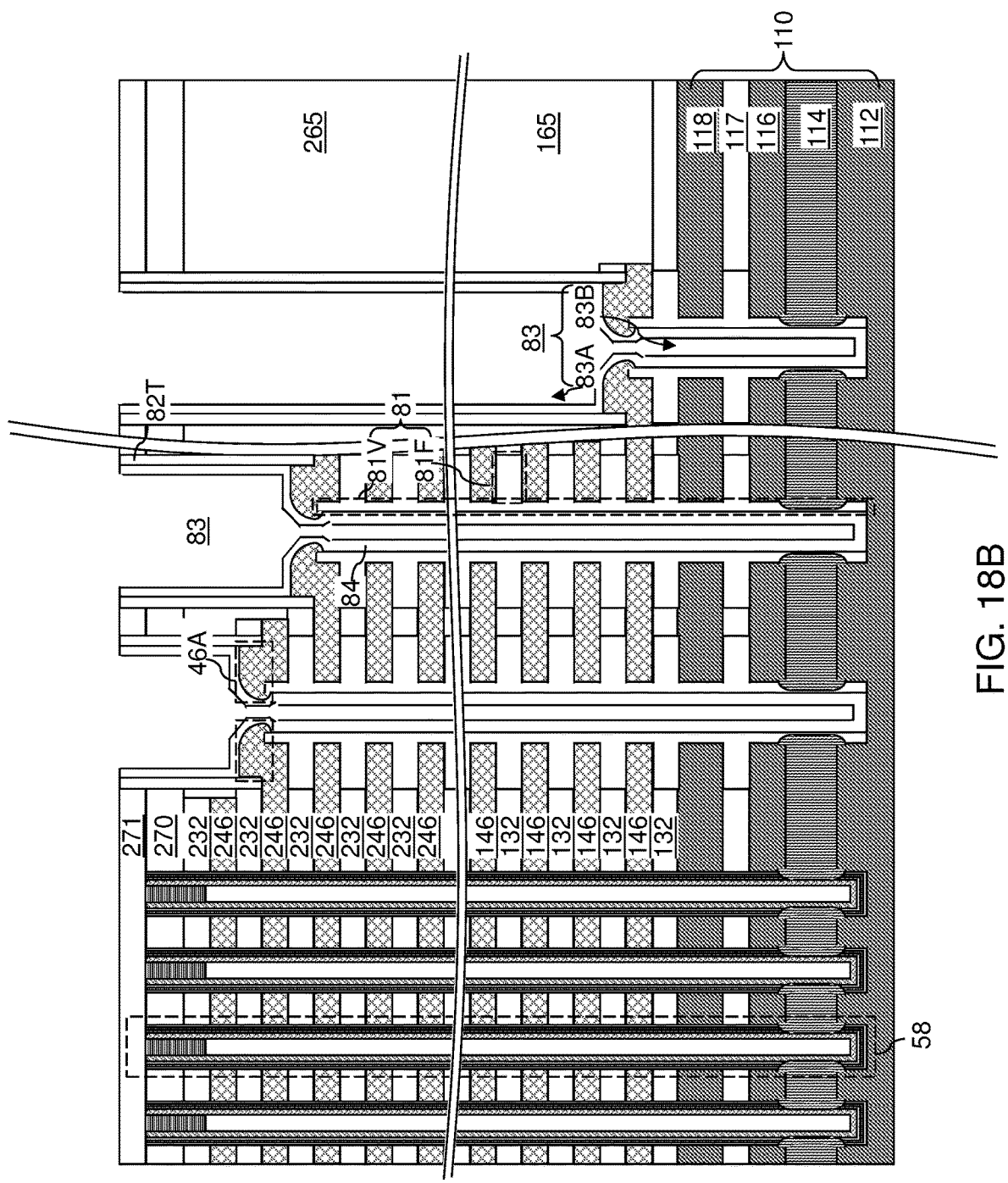

Referring to FIG. 18B, the sacrificial via fill material portions 85 can be removed selective to the material of the dielectric liners 84 to form contact via cavities 83. The contact via cavities 83 may comprise an upper cavity portion 83A having a greater lateral dimension and a lower cavity portion 83B having a lesser lateral dimension. For example, if the sacrificial via fill material portions 85 comprise silicon, then a wet etch process employing hot trimethyl-2 hydroxyethyl ammonium hydroxide ("hot TMY") or tetramethyl ammonium hydroxide (TMAH) may be performed to remove the sacrificial via fill material portions 85. If the sacrificial via fill material portions 85 comprise a carbon-based material, then an ashing process may be performed to remove the sacrificial via fill material portions 85.

Figure 18C:
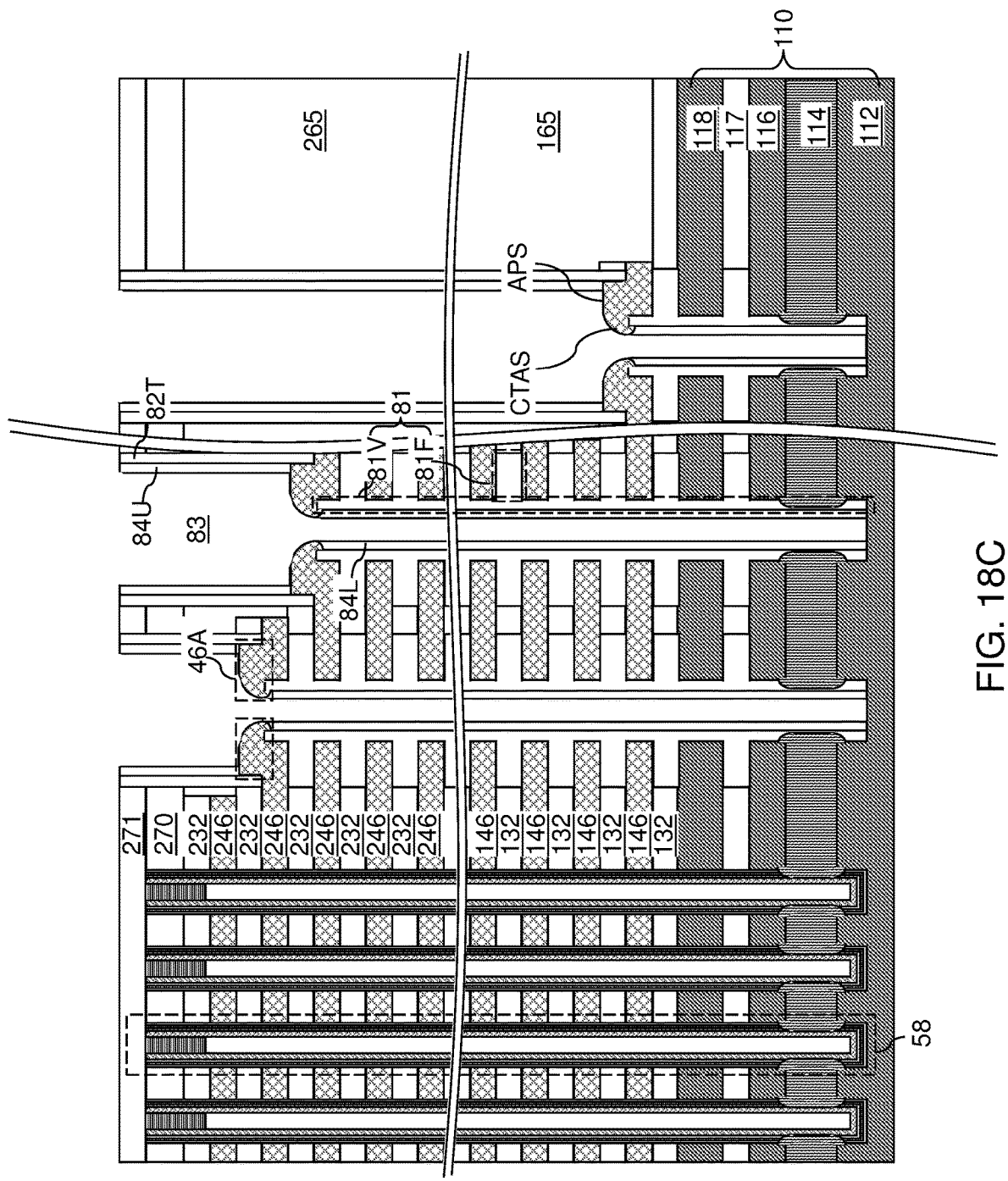

Referring to FIG. 18C, an anisotropic etch process can be performed to remove horizontally-extending portions of the dielectric liner 84. Each dielectric liner 84 around a respective contact via cavity 83 may be divided into a respective upper dielectric liner 84U and a lower dielectric liner 84L. An annular planar surface segment APS and a convex tapered annular surface segment CTAS of each conductive annular pad portion 46A of the electrically conductive layers 46 can be physically exposed after the anisotropic etch process. If the bottom horizontal portion of the dielectric liner 84 at the bottom of the lower cavity portion 83B is also removed during the anisotropic etch, then the lower source-level semiconductor layer 112 may be exposed at the bottom of the lower cavity portion 83B.

Figure 18D:
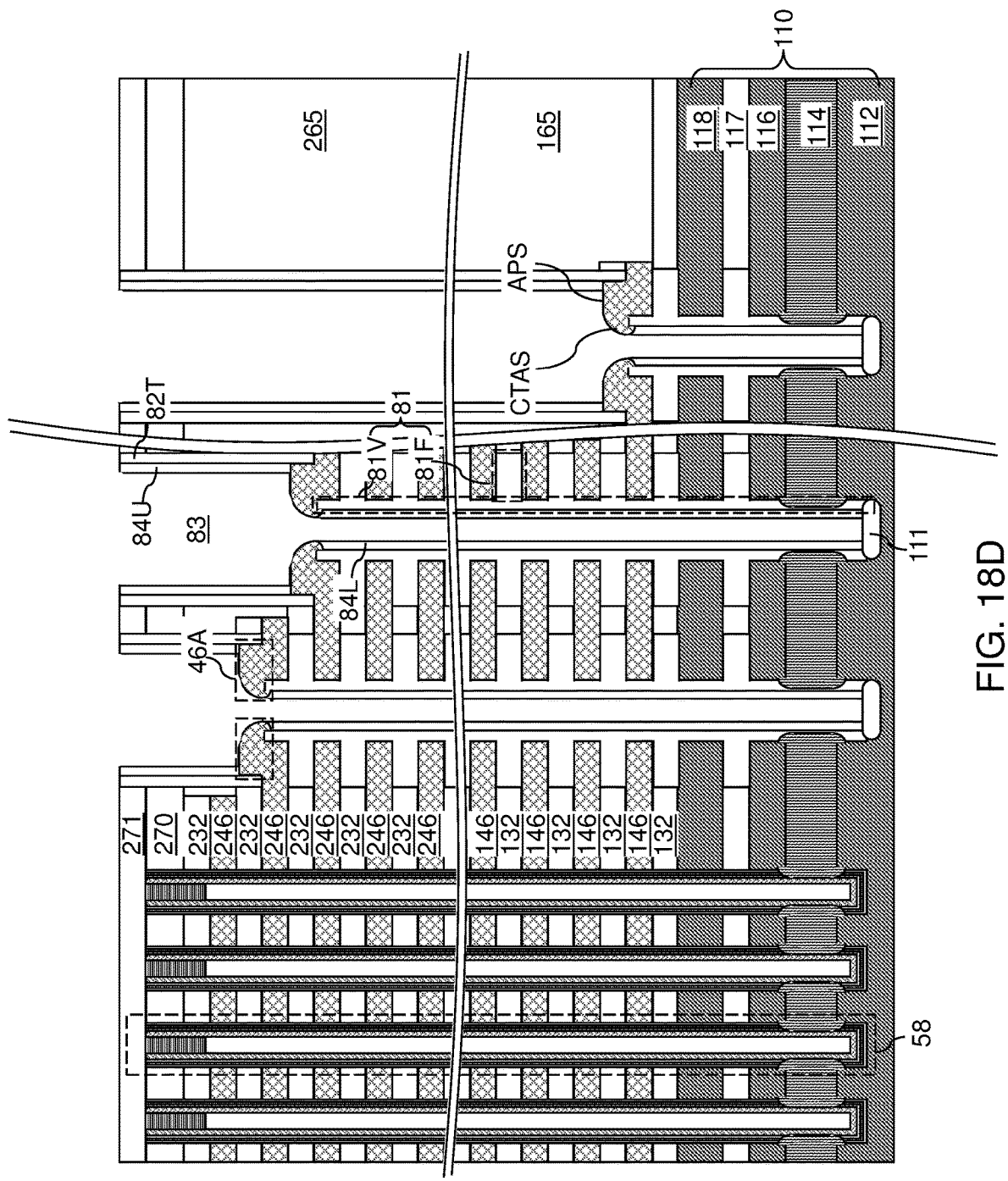

Referring to FIG. 18D, an optional oxidation process (such as a thermal oxidation process or a plasma oxidation process) can be performed to convert physically exposed semiconductor material portions (such as physically exposed surface portions of the lower source-level semiconductor layer 112) into semiconductor oxide portions (e.g., silicon oxide portions) 111. In contrast, if the bottom horizontal portion of the dielectric liner 84 at the bottom of the lower cavity portion 83B is not removed during the anisotropic etch, then the oxidation step of FIG. 18D may be omitted.

Figure 18E:
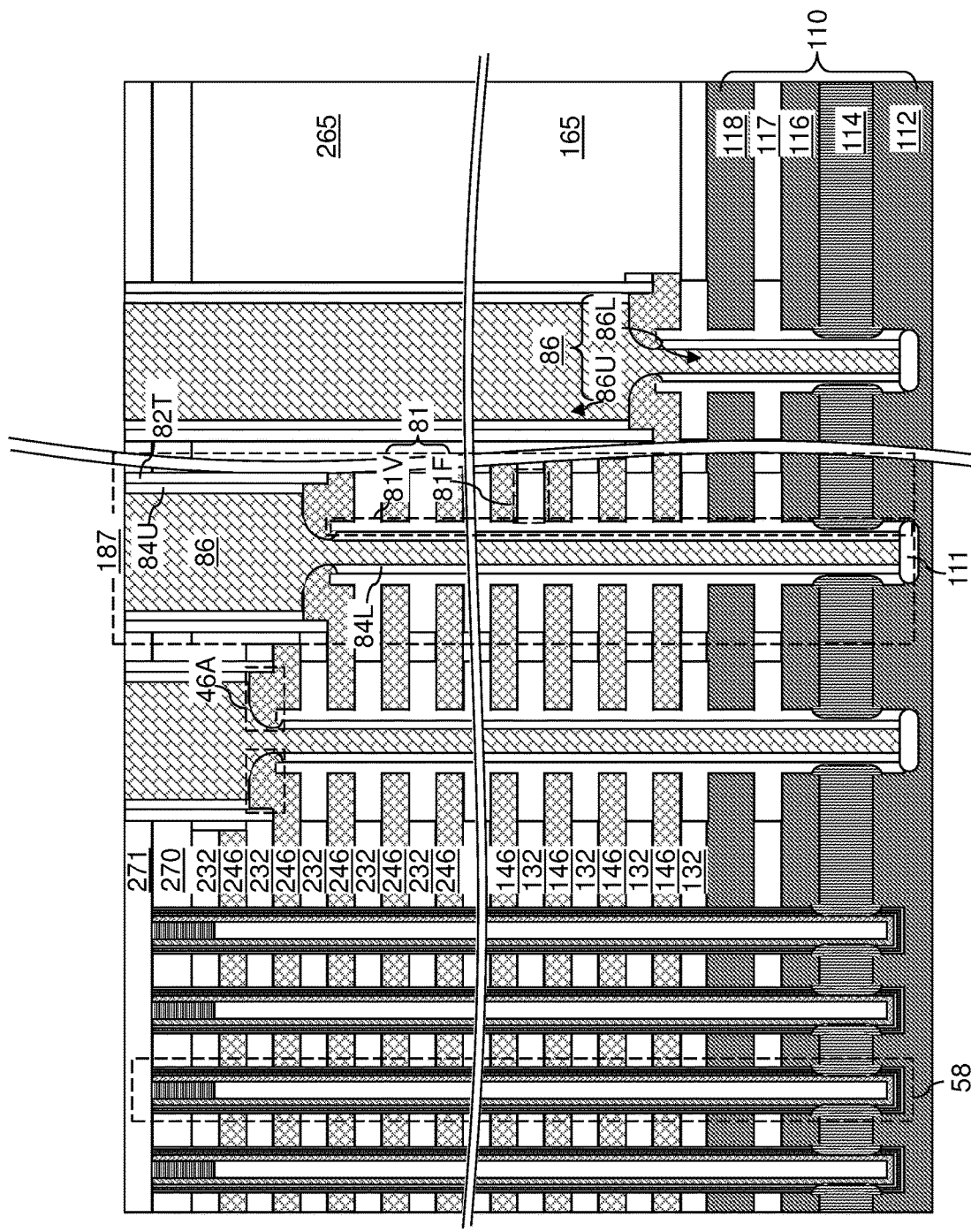

Referring to FIG. 18E, at least one conductive material can be deposited in the contact via cavities 83. The at least one conductive material may comprise a combination of a metallic barrier material (such as TiN, TaN, WN, MoN, TiC, TaC, WC, or a combination thereof) and a metallic fill material (such as W, Ti, Ta, Mo, Ru, Co, Cu, etc.). Excess portions of the at least one conductive material can be removed from above the horizontal plane including the dielectric cover layer 271 by a planarization process, which may comprise a chemical mechanical polishing (CMP) process and/or a recess etch process. Each remaining portion of the at least one conductive material that fills a respective contact via cavity 83 constitutes a conductive layer contact via structure 86. Each conductive layer contact via structure 86 contacts the conductive annular pad portion 46A of a respective electrically conductive layer (146 or 246). Each conductive layer contact via structure 86 may comprise a respective lower portion that vertically extends through openings in at least one pair of an insulating layer (132, 232) and an electrically conductive layer (146, 246). In one embodiment, one, a plurality or each of the conductive layer contact via structures 86 may comprise a respective lower portion that vertically extends at least partially through at least one source-level semiconductor layer (112, 114, 116).

Generally, each sacrificial via fill material portion 85 may be replaced with a respective conductive layer contact via structure (e.g., word line contact via structure or select gate electrode contact via structure) 86. Each in-process integrated contact-and-support assembly 186 is converted into a respective integrated contact-and-support assembly 187. Each integrated contact-and-support assembly 187 comprises a vertical stack of a dielectric support pillar 81 and a conductive layer contact via structure 86. The conductive layer contact via structure 86 contacts a top surface of a respective first electrically conductive layer (146 or 246). The conductive layer contact via structure 86 comprises an upper portion 86U that overlies the dielectric support pillar 81 and a lower portion 86L that is surrounded by the dielectric support pillar 81. The upper portion 86U is wider than the lower portion 86L. The dielectric support pillar 81 separates the lower portion of the respective conductive layer contact via structure 86 from the electrically conductive layers (146, 246) underlying the conductive annular pad portion 46A that contacts the bottom of the upper portion 86U of the respective conductive layer contact via structure 86.

In one embodiment, the alternating stack {(132, 146), (232, 246)} comprises a staircase region 200 in which lateral extents of the electrically conductive layers (146, 246) decrease with a vertical distance from the at least one semiconductor material layer (112, 114, 116). At least one retro-stepped dielectric material potion (165, 265) overlies stepped surfaces of the alternating stack {(132, 146), (232, 246)} that are located in the staircase region 200. Each conductive layer contact via structure 86 vertically extends through the at least one retro-stepped dielectric material portion (165, 265).

Figure 18F:
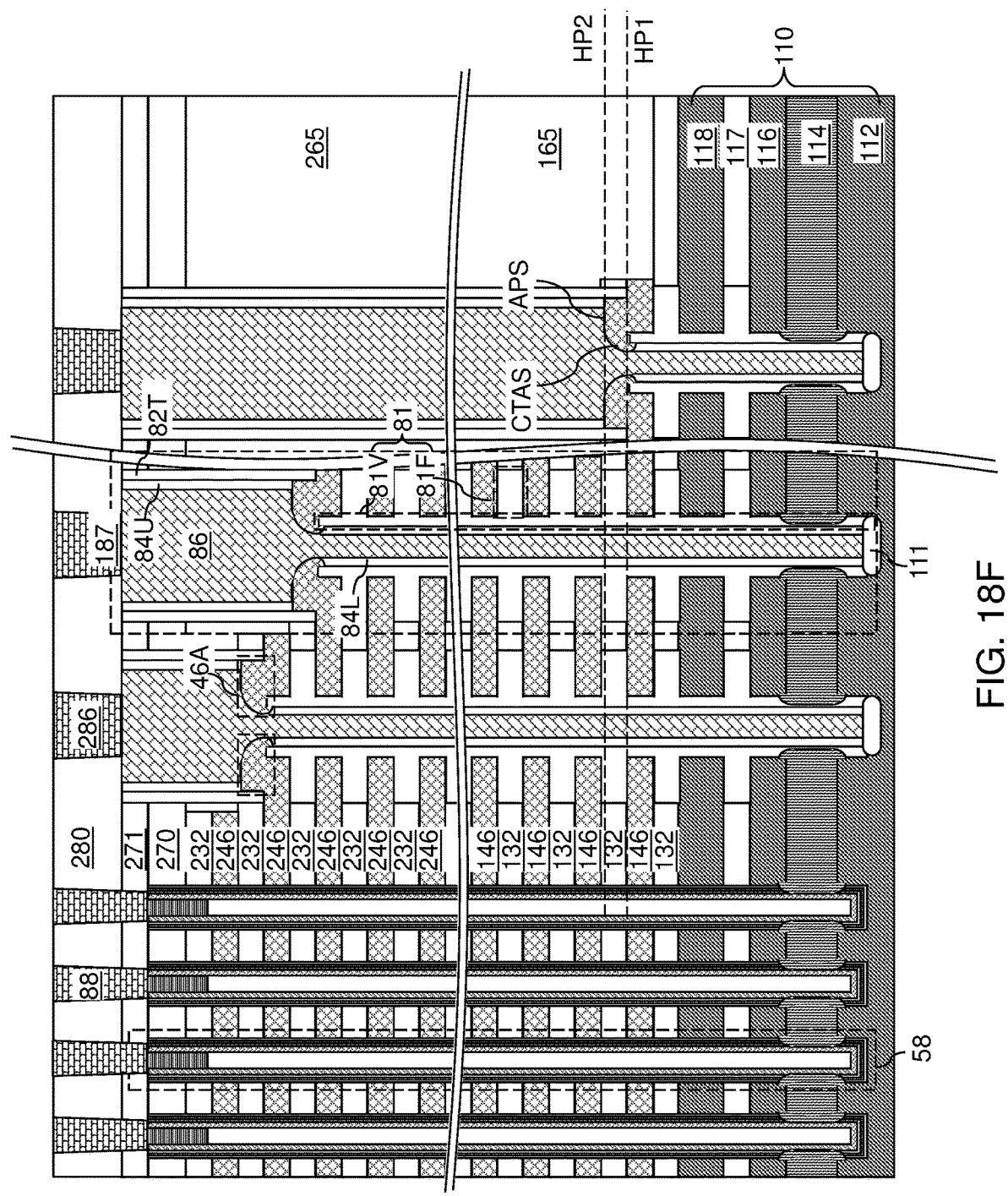

Referring to FIG. 18F, a contact-level dielectric layer 280 can be formed over the dielectric cover layer 271. Drain contact via structures 88 can be formed through the contact-level dielectric layer 280 and the dielectric cover layer 271 on a top surface of a respective drain region 63. Connection via structures 286 can be formed through the contact-level dielectric layer 280 on a top surface of a respective conductive layer contact via structure 86.

Additional dielectric material layers (which are herein referred to as upper-level dielectric material layers), bit lines electrically connected to the drain contact via structures 88, and additional metal interconnect structures (which are herein referred to as upper-level metal interconnect structures) can be formed above the contact-level dielectric layer 280.

Figure 18G:
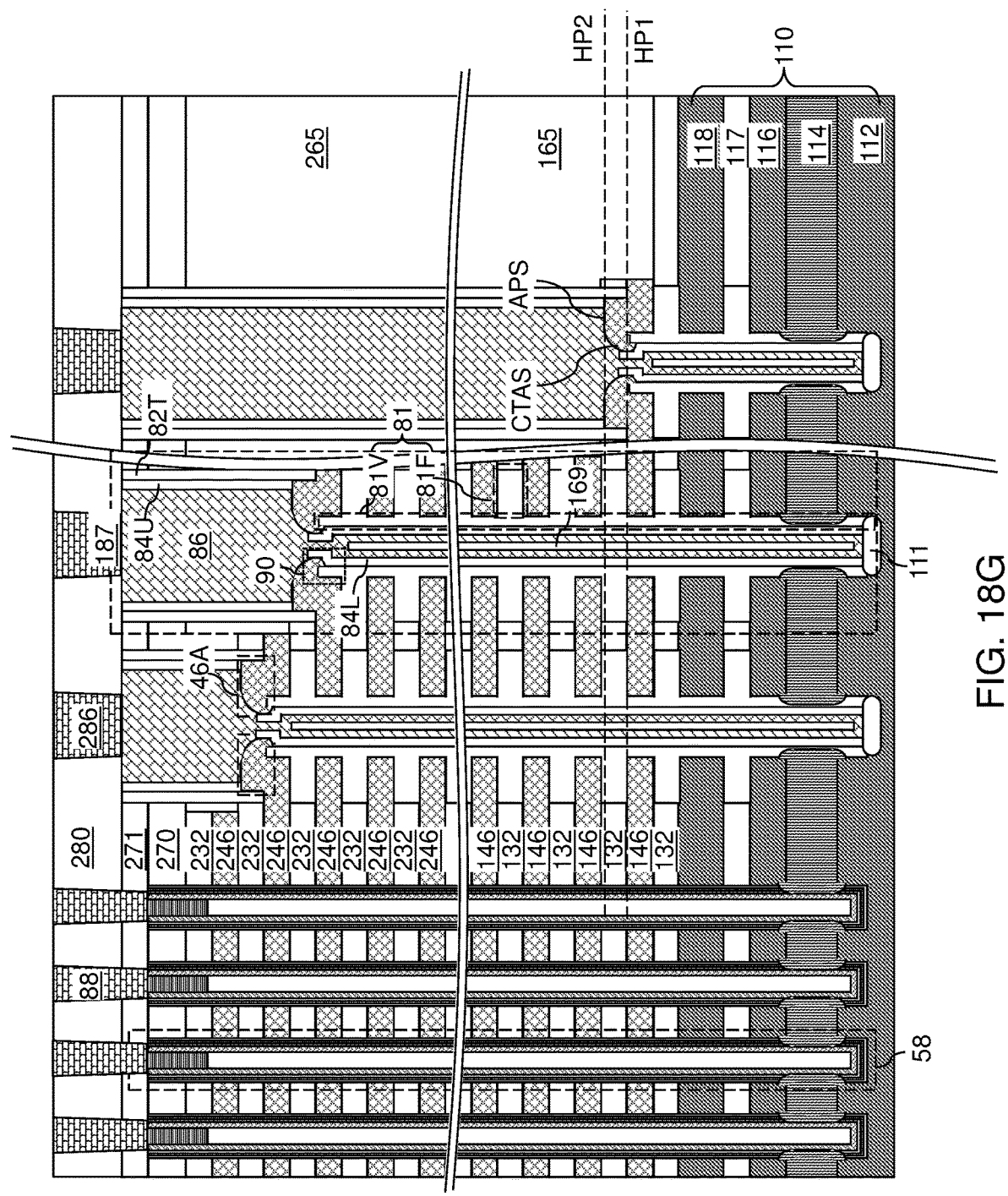
FIG. 18G is a vertical cross-sectional view of the staircase region of an alternative configuration of the first exemplary structure after formation of integrated contact-and-support assemblies, drain contact via structures, and connection via structures according to the first embodiment of the present disclosure.

Referring to FIG. 18G, an alternative configuration of the first exemplary structure is illustrated after formation of integrated contact-and-support assemblies 187, drain contact via structures 88, and connection via structures 286. Generally, the duration of the anisotropic etch process performed to remove horizontally-extending portions of the dielectric liners 84 may be selected such that the lower dielectric liners 84L may or may not contact an inner sidewall surface segment of a conductive annular pad portion 46A of a respective electrically conductive layer (146, 246). Thus, in FIG. 18F, the lower dielectric liners 84L do not contact an inner sidewall surface segment of a conductive annular pad portion 46A. In contrast, in FIG. 18G, the lower dielectric liners 84L do contact an inner sidewall surface segment of a conductive annular pad portion 46A. Furthermore, the encapsulated cavity (i.e., air gap 169) may be present in the lower portions 86L of the conductive layer contact via structures 86 in the alternative configuration of FIG. 18G.

In the first embodiment, a dielectric spacer 90 is located in the contact via cavity 83, covering a sidewall of the first electrically conductive layer (146 or 246) in the contact via cavity 83, and extending above the top surface of the first electrically conductive layer (146 or 246). In the first embodiment, the dielectric spacer 90 may comprise an upper portion of the dielectric support pillar 81 and/or the dielectric liner 84. For example, as shown in FIG. 18G, the dielectric spacer 90 comprises the upper portion of the dielectric liner 84.

Figure 19A:
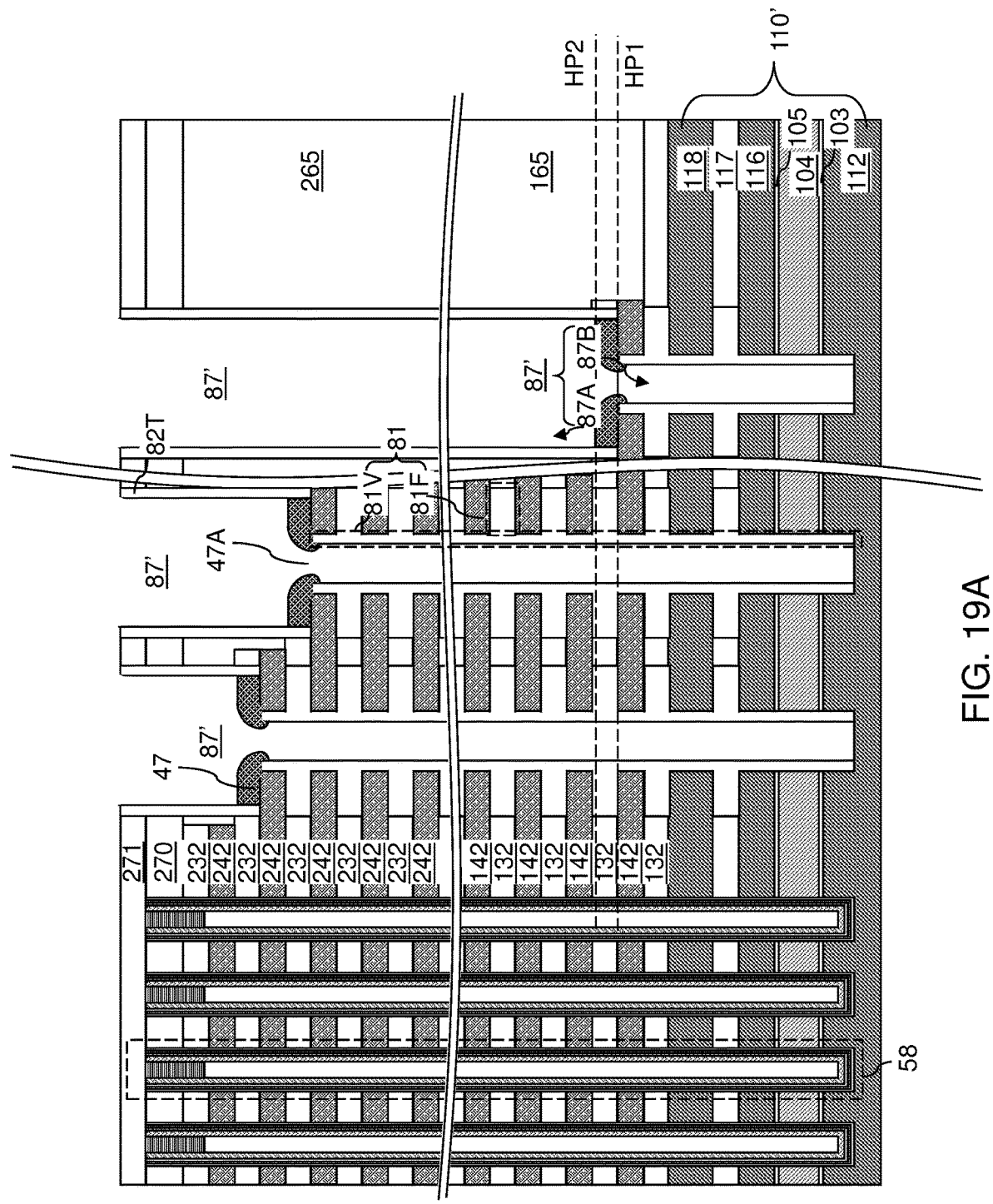
FIGS. 19A and 19B are sequential vertical cross-sectional views of a staircase region of a second exemplary structure during formation of in-process integrated contact-and-support assemblies according to a second embodiment of the present disclosure.
Figure 19B:
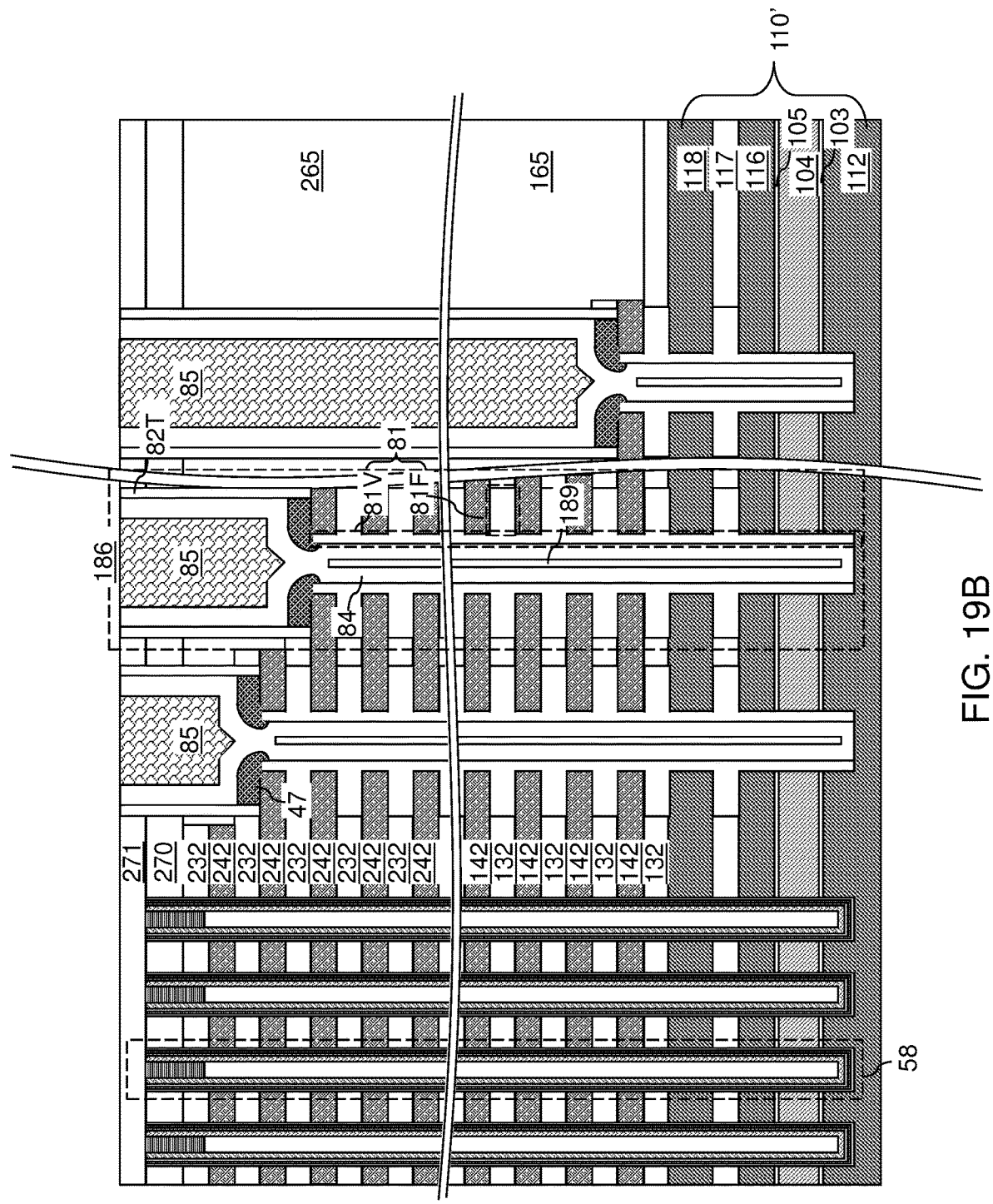

FIGS. 19A and 19B are sequential vertical cross-sectional views of a staircase region 200 of a second exemplary structure during formation of in-process integrated contact-and-support assemblies 186 according to a second embodiment of the present disclosure.

Referring to FIG. 19A, the second exemplary structure according to the second embodiment of the present disclosure can be the same as the first exemplary structure at the processing steps of FIG. 11F. An opening 47A is located in each sacrificial annular plate 47. The lower portion of each stepped via cavity 87' located below the opening 47A comprises the second cylindrical cavity 87B.

Referring to FIG. 19B, the processing steps described with reference to FIG. 11G can be performed with the modification of an increase in the thickness of the dielectric liner 84. In this embodiment, the dielectric liner 84 can plug the opening 47A through the sacrificial annular plate 47 within the same finned via cavity 87. In one embodiment, an encapsulated cavity 169 may be present within a lower portion of the dielectric liner 84 in the second cylindrical cavity 87B of the finned via cavities 87.

The above described sacrificial via fill material can be deposited in the stepped via cavities 87' by a conformal or non-conformal deposition process. The sacrificial via fill material comprises a material that can be removed selective to the material of the dielectric liner 84. The sacrificial via fill material may comprise a semiconductor material (such as amorphous silicon, polysilicon, or a silicon-germanium alloy), a carbon-based material (such as amorphous carbon, diamond-like carbon, or a doped derivative therefrom, an organosilicate glass material, or a polymer material. In the second embodiment, the second cylindrical cavity 87B in the lower portion of each stepped via cavity 87' is not filled with the sacrificial via fill material because the dielectric liner 84 plugs the opening 47A into the second cylindrical cavity 87B.

Portions of the sacrificial via fill material and the dielectric liner 84 that overlie the horizontal plane including the top surface of the dielectric cover layer 271 can be removed by performing a planarization process. The planarization process may comprise a chemical mechanical polishing (CMP) process and/or a recess etch process. Each remaining portion of the sacrificial via fill material is herein referred to as a sacrificial via fill material potion 85.

Each combination of all material portions filling a respective finned via cavity 87 is herein referred to as an in-process integrated contact-and-support assembly 186. Each in-process integrated contact-and-support assembly 186 comprises a dielectric support pillar 81, a tubular dielectric liner 82T, a sacrificial via fill material portion 85, a dielectric liner 84, and an optional encapsulated cavity 169.

Subsequently, the processing steps described with reference to FIGS. 12A-17 can be performed.

FIGS. 20A-20E are sequential vertical cross-sectional views of the staircase region of the second exemplary structure during formation of integrated contact-and-support assemblies, drain contact via structures, and connection via structures according to the second embodiment of the present disclosure.

Figure 20A:
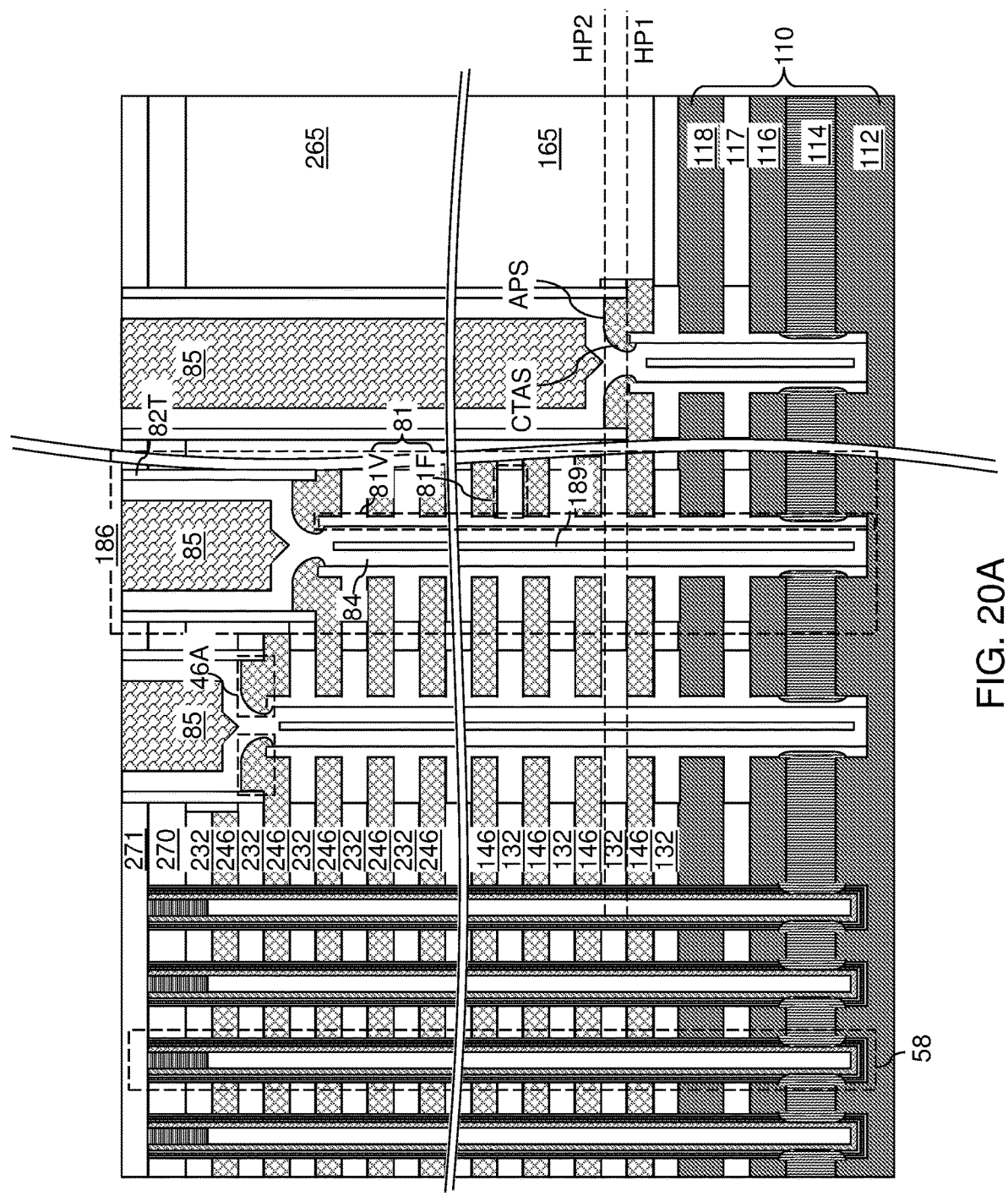
FIGS. 20A-20E are sequential vertical cross-sectional views of the staircase region of the second exemplary structure during formation of integrated contact-and-support assemblies, drain contact via structures, and connection via structures according to the second embodiment of the present disclosure.

Referring to FIG. 20A, the second exemplary structure is illustrated at a processing step that corresponds to the processing steps of FIG. 17 with a difference that the sacrificial via fill material portion 85 does not extend into the second cylindrical cavity 87B in the lower portion of each stepped via cavity 87'.

Figure 20B:
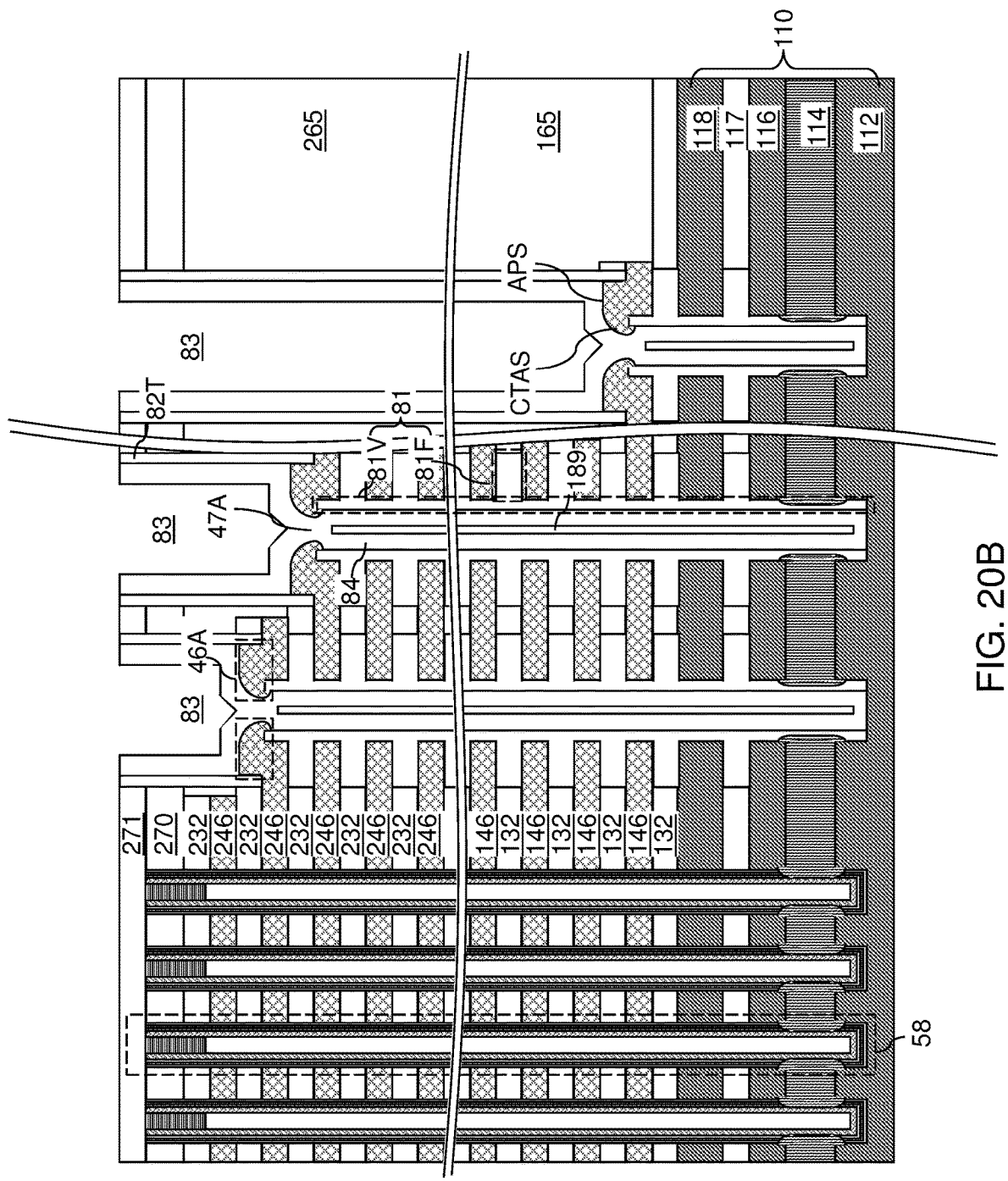

Referring to FIG. 20B, the sacrificial via fill material portions 85 can be removed selective to the material of the dielectric liners 84 to form contact via cavities 83. The contact via cavities 83 lack the lower cavity portion 83B described above with respect to FIG. 18B of the first embodiment because the dielectric liner 84 plugs the opening 47A.

Figure 20C:
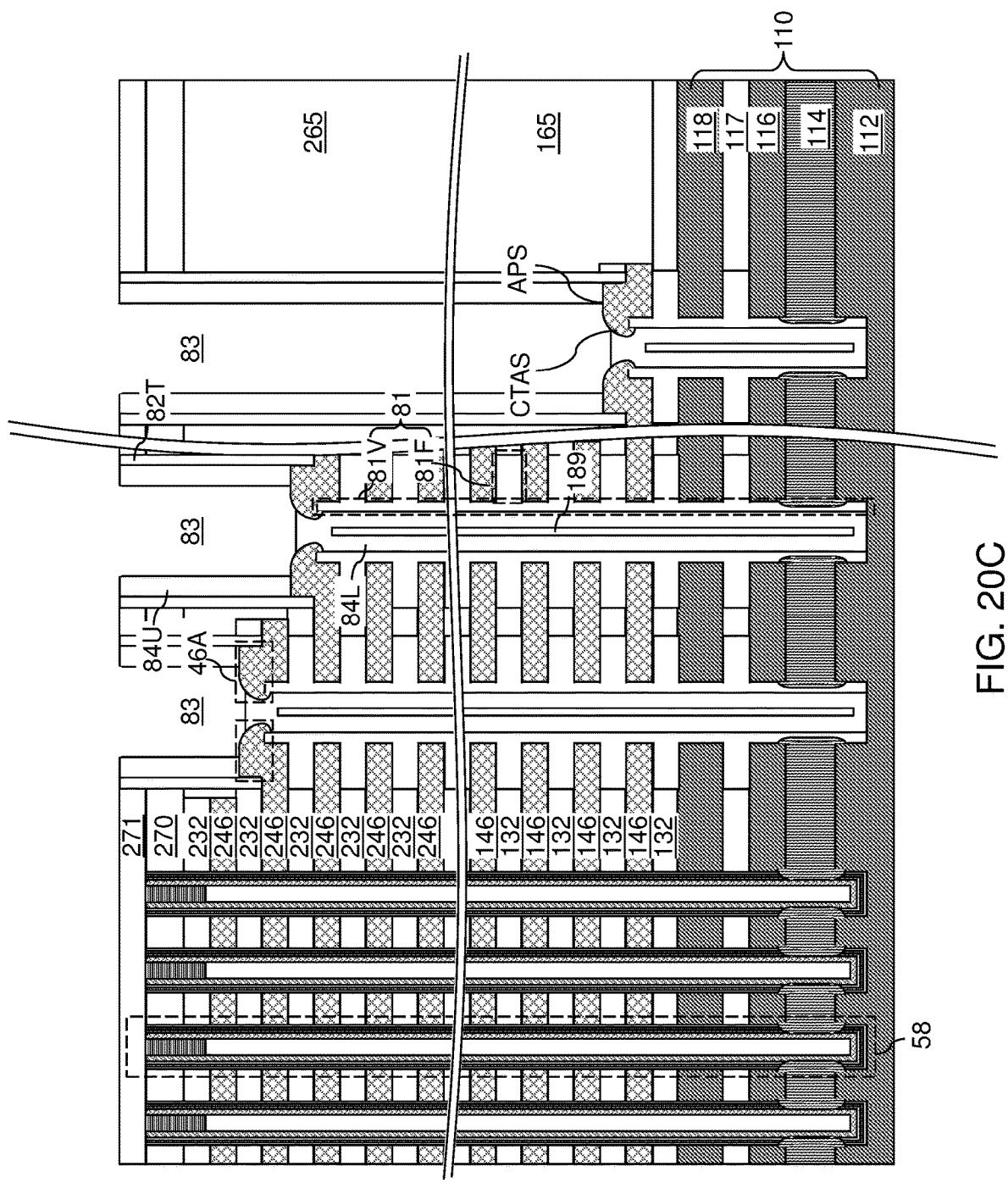

Referring to FIG. 20C, an anisotropic etch process can be performed to remove horizontally-extending portions of the dielectric liner 84. Each dielectric liner 84 around a respective contact via cavity 83 may be divided into a respective upper dielectric liner 84U and a lower dielectric liner 84L. The top part of the lower dielectric liner 84L fills the opening 47A between the pad portions 46A. An annular planar surface segment APS and a convex tapered annular surface segment CTAS of each conductive annular pad portion 46A of the electrically conductive layers 46 can be physically exposed after the anisotropic etch process.

Figure 20D:
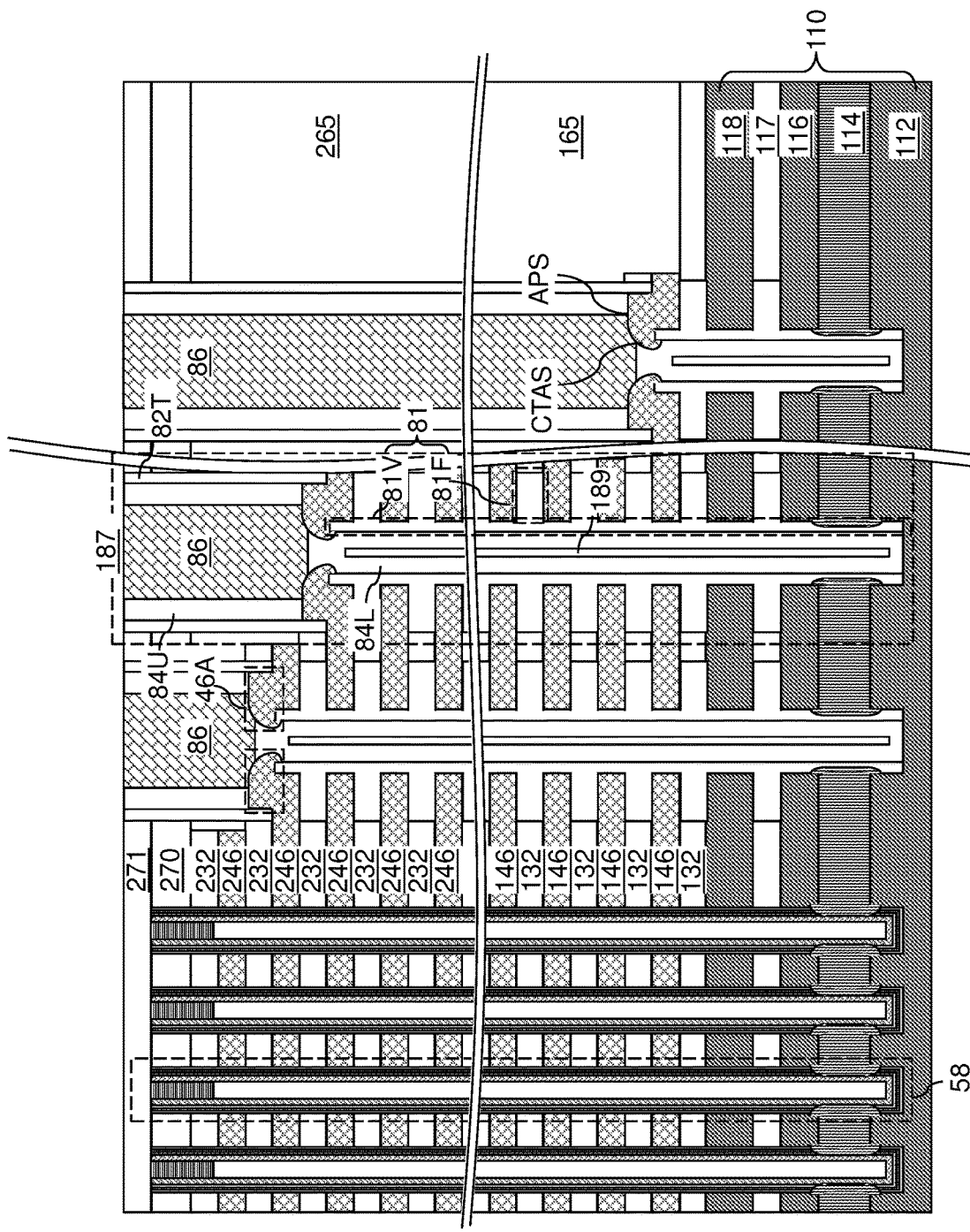

Referring to FIG. 20D, at least one conductive material can be deposited in the contact via cavities 83. The at least one conductive material may comprise a combination of a metallic barrier material (such as TiN, TaN, WN, MoN, TiC, TaC, WC, or a combination thereof) and a metallic fill material (such as W, Ti, Ta, Mo, Ru, Co, Cu, etc.). Excess portions of the at least one conductive material can be removed from above the horizontal plane including the dielectric cover layer 271 by a planarization process, which may comprise a chemical mechanical polishing (CMP) process and/or a recess etch process. Each remaining portion of the at least one conductive material that fills a respective contact via cavity 83 constitutes a conductive layer contact via structure 86. Each conductive layer contact via structure 86 contacts the conductive annular pad portion 46A of a respective electrically conductive layer (146 or 246). Each conductive layer contact via structure 86 may comprise a bottommost surface that contacts a topmost surface of a respective lower dielectric liner 84L that fills the opening 47A.

Thus, unlike the first embodiment, in the second embodiment, the conductive layer contact via structure 86 does not extend into the second cylindrical cavity 87B in the lower portion of each stepped via cavity 87'. Instead, only the respective lower dielectric liner 84L, the dielectric support pillar 81 and optional air gap 169 are located in the second cylindrical cavity 87B in the lower portion of each stepped via cavity 87'.

Generally, each sacrificial via fill material portion 85 may be replaced with a respective conductive layer contact via structure 86. Each in-process integrated contact-and-support assembly 186 is converted into a respective integrated contact-and-support assembly 187. Each integrated contact-and-support assembly 187 comprises a vertical stack of a dielectric support pillar 81 and a conductive layer contact via structure 86. The conductive layer contact via structure 86 contacts a top surface of a respective first electrically conductive layer (146 or 246) among the electrically conductive layers (146, 246). The conductive layer contact via structure 86 comprises a portion that overlies the dielectric support pillar 81.

Figure 20E:
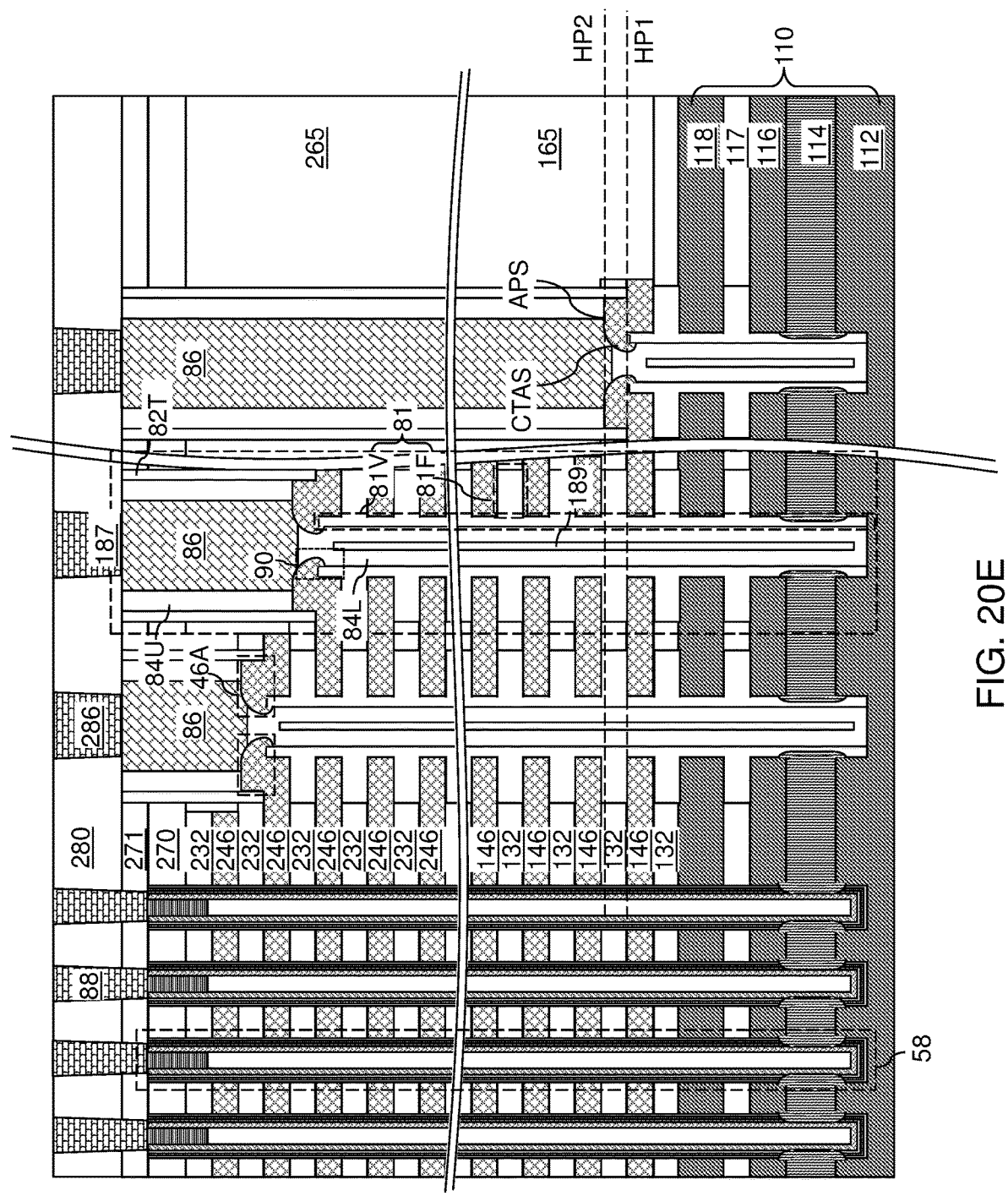

Referring to FIG. 20E, a contact-level dielectric layer 280 can be formed over the dielectric cover layer 271. Drain contact via structures 88 can be formed through the contact-level dielectric layer 280 and the dielectric cover layer 271 on a top surface of a respective drain region 63. Connection via structures 286 can be formed through the contact-level dielectric layer 280 on a top surface of a respective conductive layer contact via structure 86. The upper-level dielectric material layers and additional metal interconnect structures can be formed above the contact-level dielectric layer 280 as described above.

In the second embodiment, the dielectric spacer 90 comprises the upper portion of the dielectric liner 84.

FIGS. 21A-21G are sequential vertical cross-sectional views of a staircase region 200 of a third exemplary structure during formation of in-process integrated contact-and-support assemblies 186 according to a third embodiment of the present disclosure.

Figure 21A:
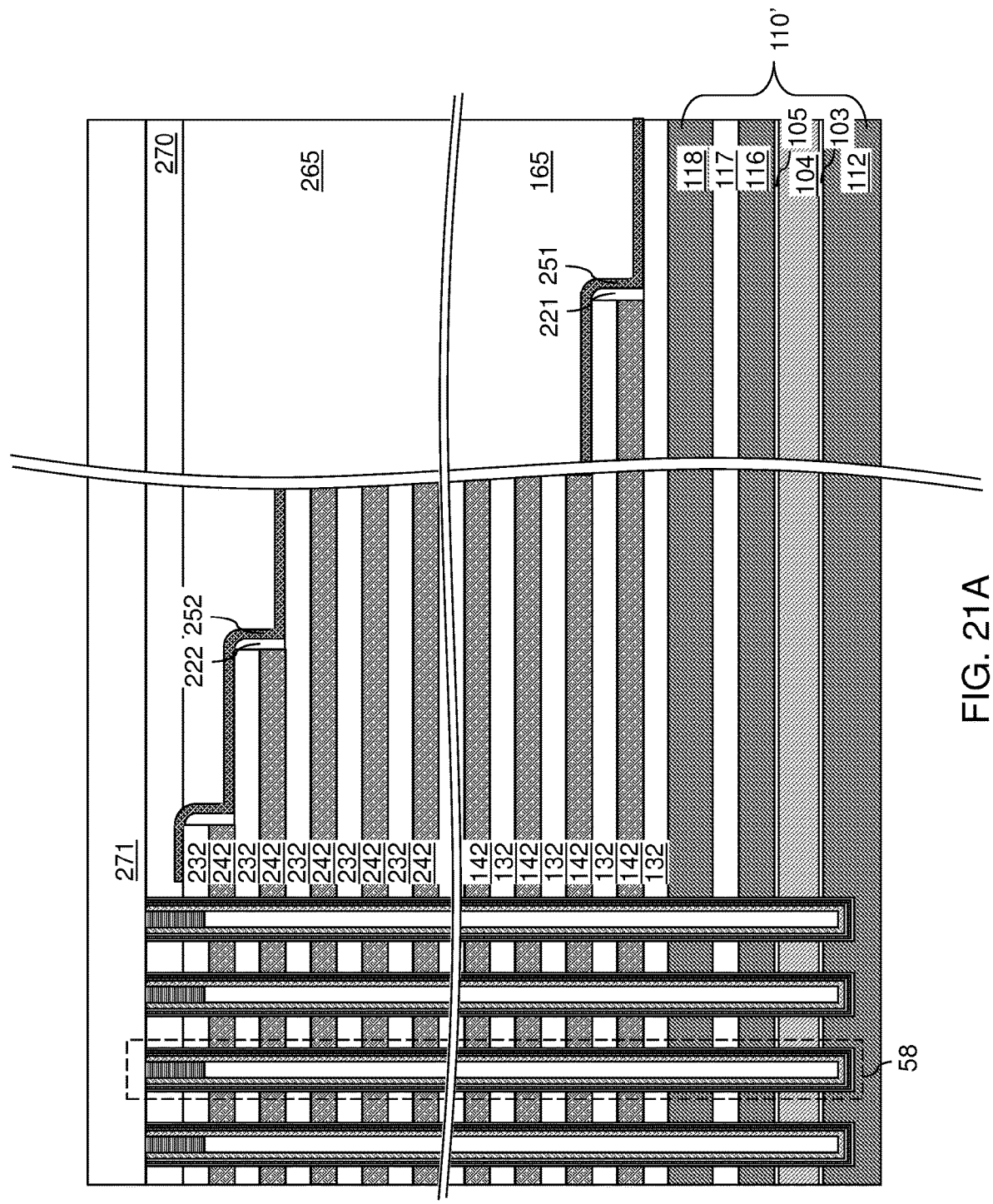
FIGS. 21A-21G are sequential vertical cross-sectional views of a staircase region of a third exemplary structure during formation of in-process integrated contact-and-support assemblies according to a third embodiment of the present disclosure.

Referring to FIG. 21A, a third exemplary structure is illustrated at a processing step that corresponds to the processing step illustrated in FIG. 18A. The third exemplary structure can be derived from the first exemplary structure by forming insulating spacers (221, 222) on vertically-extending surface segments of the stepped surfaces, and by forming an etch stop layer (251, 252) over horizontally-extending surface segments of the stepped surfaces and over the insulating spacers (221, 222). The third exemplary structure can be derived from the first exemplary structure by performing a first set of additional processing steps after formation of the first stepped surfaces on the first vertically alternating sequence (132, 142) and prior to formation of the first retro-stepped dielectric material portion 165, and by performing a second set of additional processing steps after formation of the second stepped surfaces on the second vertically alternating sequence (232, 242) and prior to formation of the second retro-stepped dielectric material portion 265.

Each set of addition processing steps may comprise an insulating material layer deposition step that deposits an insulating material over respective stepped surfaces, an anisotropic etch step (e.g., sidewall spacer etch step) that removes horizontally-extending portions of the insulating material and forms a respective set of insulating spacers (221, 222), and a conformal deposition step that deposits a respective etch stop layer (251, 252) over a respective set of horizontally-extending surface segments of the respective stepped surfaces and over the respective set of insulating spacers (221, 222). The insulating spacers (221, 222) may comprise first insulating spacers 221 that are formed on first stepped surfaces, and second insulating spacers 222 that are formed on second stepped surfaces. The etch stop layers (251, 252) may comprise a first etch stop layer 251 that is formed over the first insulating spacers 221 and a second etch stop layer 222 that is formed over the second insulating spacers 222.

The insulating spacers (221, 222) can be formed on vertically-extending surface segments of a respective set of stepped surfaces. The insulating spacers (221, 222) comprise an insulating material that is different from the materials of the sacrificial material layers (142, 242). The insulating spacers (221, 222) may comprise a silicon oxide material (such as undoped silicate glass or a doped silicate glass) or a dielectric metal oxide material (such as aluminum oxide, hafnium oxide, tantalum oxide, titanium oxide, lanthanum oxide, etc.). The lateral thickness of the insulating spacers (221, 222) may be in a range from 3 nm to 50 nm, such as from 6 nm to 30 nm, although lesser and greater thicknesses may also be employed.

Each etch stop layer (251, 252) comprises a material that is etch-resistant to the etch chemistry that is employed to form fin cavities 87F around through-stack via cavities to be subsequently formed. For example, the etch stop layers (251, 252) may comprise silicon nitride or a dielectric metal oxide material. In one embodiment, the etch stop layers (251, 252) may comprise the same material as the sacrificial material layers (142, 242). The thickness of each etch stop layer (251, 252) may be in a range from 20 nm to 100 nm, such as from 30 nm to 60 nm, although lesser and greater thicknesses may also be employed.

In case the etch stop layers (251, 252) comprise the same material (e.g., silicon nitride) as the sacrificial material layers (142, 242), the etch stop layers (251, 252) may be patterned such that the etch stop layers (251, 252) are not exposed to backside trenches upon formation of the backside trenches 79 during subsequent processing steps. In other words, the etch stop layers (251, 252) are laterally offset from the backside trenches 79 along the second horizontal direction.

Figure 21B:
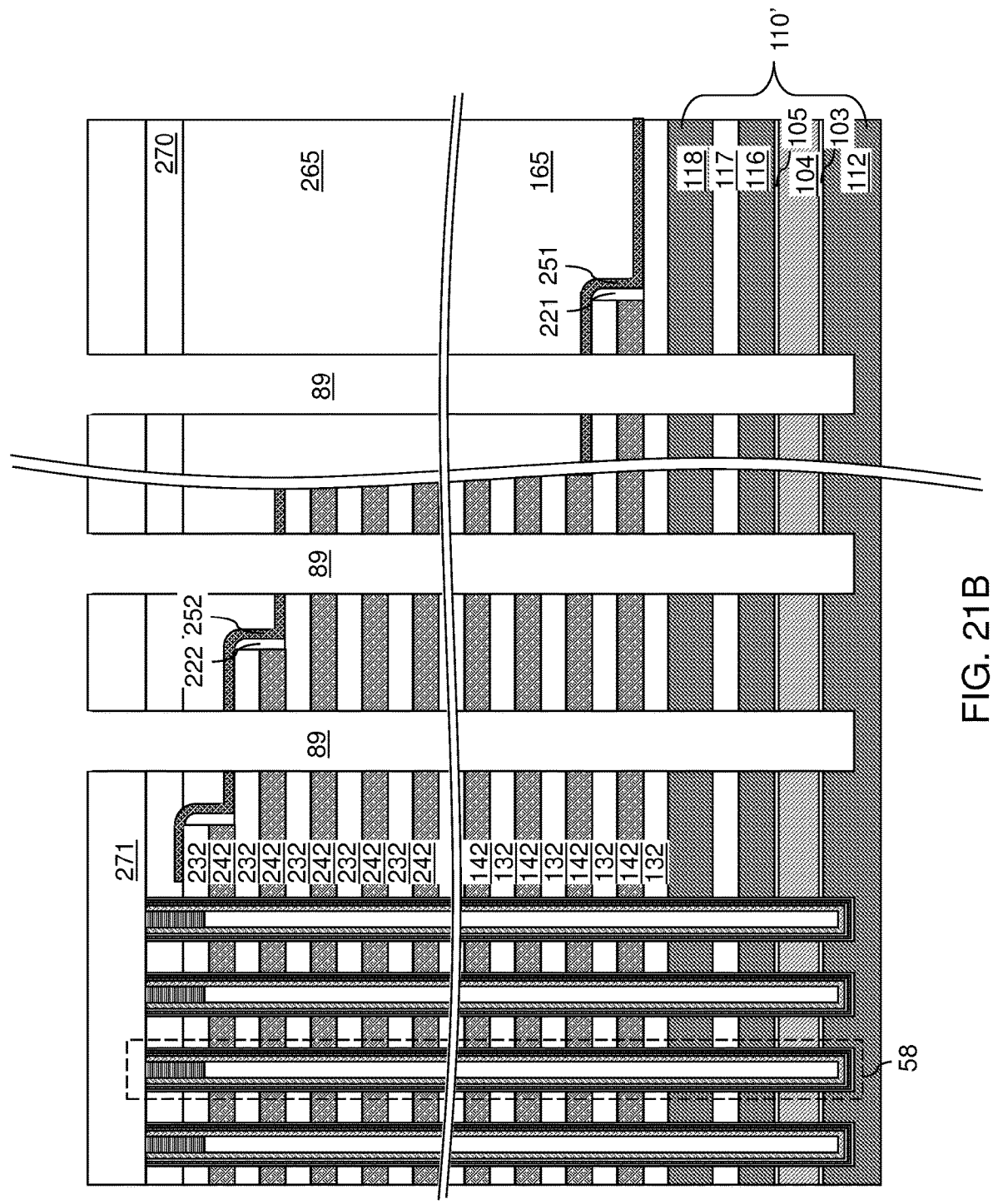

Referring to FIG. 21B, the anisotropic etch process can be performed to form the above described through-stack via cavities 89 through the optional dielectric cover layer 271, the second insulating cap layer 270, the retro-stepped dielectric material portions (165, 265), the etch stop layers (251, 252), and the alternating stacks {(132, 142), (232, 242)}, and at least partially into the in-process sacrificial material layers 110'.

Figure 21C:
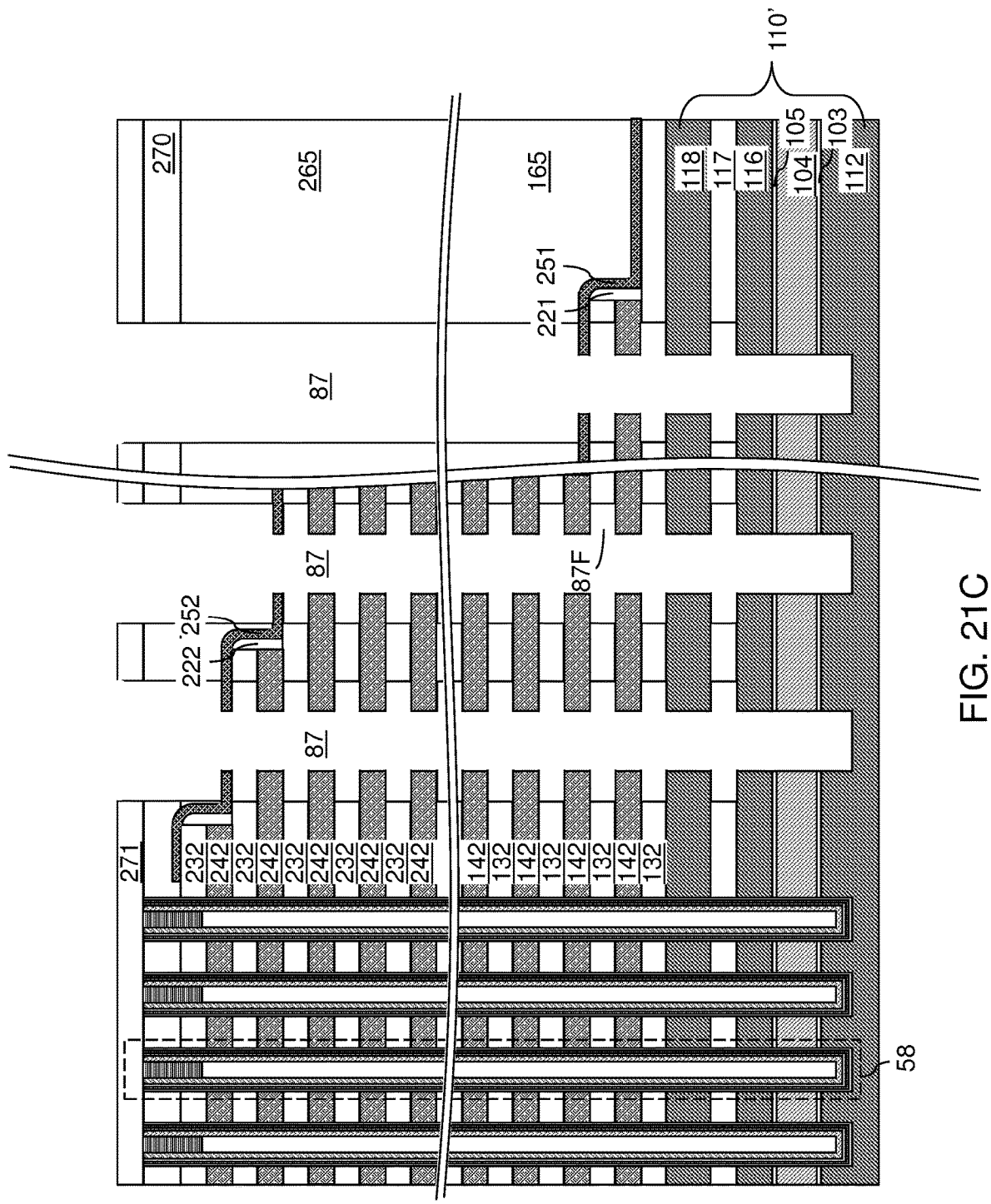

Referring to FIG. 21C, the above described isotropic recess etch process can be performed to isotropically recess the materials of the insulating layers (132, 232), the source-level insulating layer 117, the retro-stepped material portions (165, 265), the insulating cap layers (170, 270), the inter-tier dielectric layer 180, and the optional dielectric cover layer 271 selective to the materials of the sacrificial material layers (142, 242), the etch stop layers (251, 252), and various semiconductor material layers (112, 104, 116, 118).

The through-stack via cavities 89 are laterally expanded at levels of the insulating layers (132, 232) and the source-level insulating layer 117, and above a respective horizontally-extending surface segment of the stepped surfaces, i.e., at levels of the retro-stepped dielectric material portions (165, 265), the insulating cap layers (170, 270), and the optional dielectric cover layer 271. The optional dielectric cover layer 271 may be collaterally thinned by the isotropic recess etch process. Each through-stack via cavity 89 is converted into the respective finned via cavity 87 including at least one fin cavity 87F formed at the level(s) of a respective set of at least one insulating layer (132, 232) and an optional additional fin cavity formed at the level of the source-level insulating layer 117 (if present), as described above.

Figure 21D:
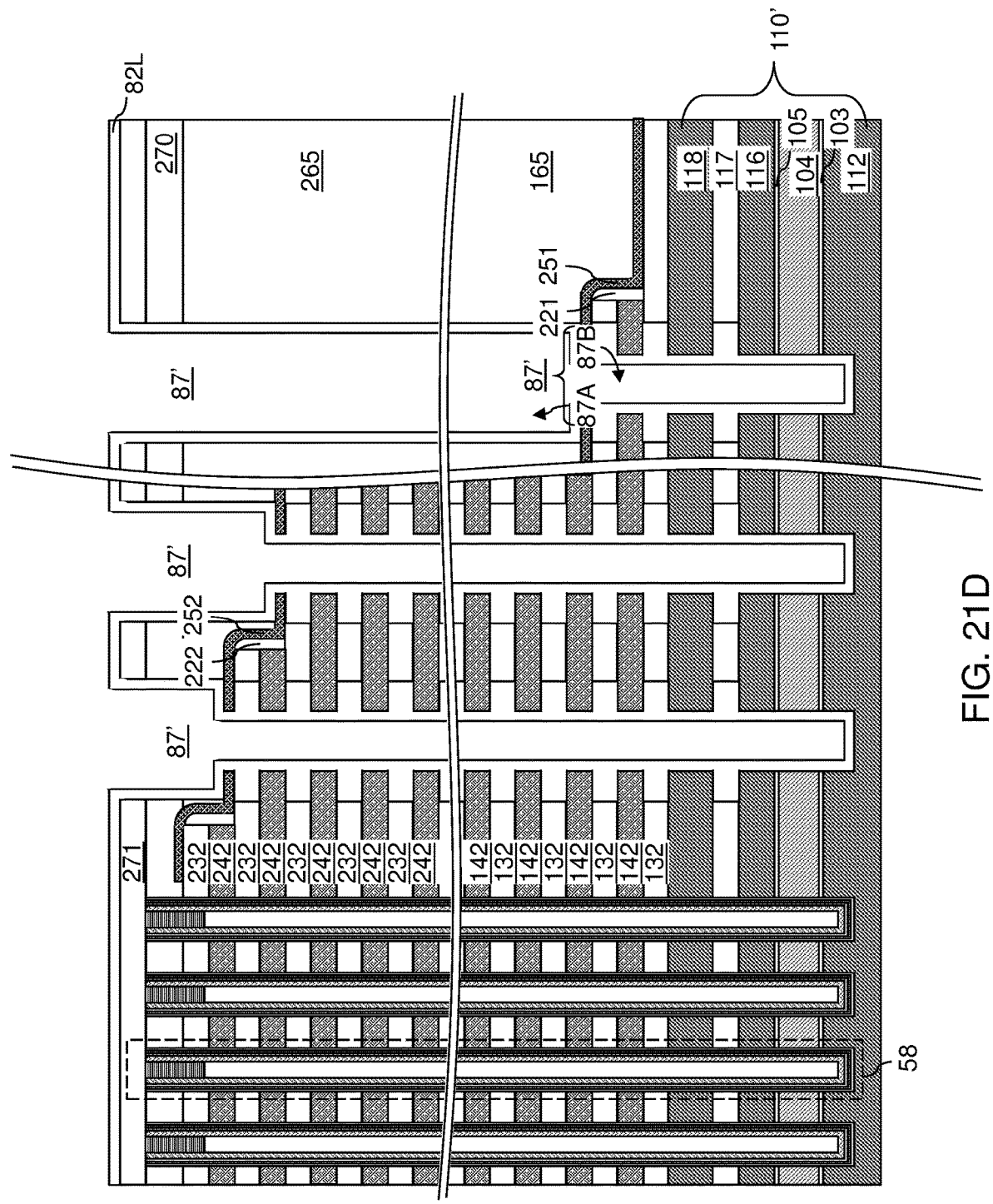

Referring to FIG. 21D, a dielectric material, such as silicon oxide can be conformally deposited to form the dielectric material layer 82L, as described above. The dielectric material layer 82L can fill peripheral portions of the finned via cavities 87 including the entire volumes of the fin cavities 87F. Each unfilled volume of the finned via cavities 87 constitutes a stepped via cavity 87' including an upper portion having a greater lateral extent and a lower portion having a lesser lateral extent. The upper portion of each stepped via cavity 87' may comprise a first cylindrical cavity 87A, and the lower portion of each stepped via cavity 87' may comprise a second cylindrical cavity 87B, as described above.

Figure 21E:
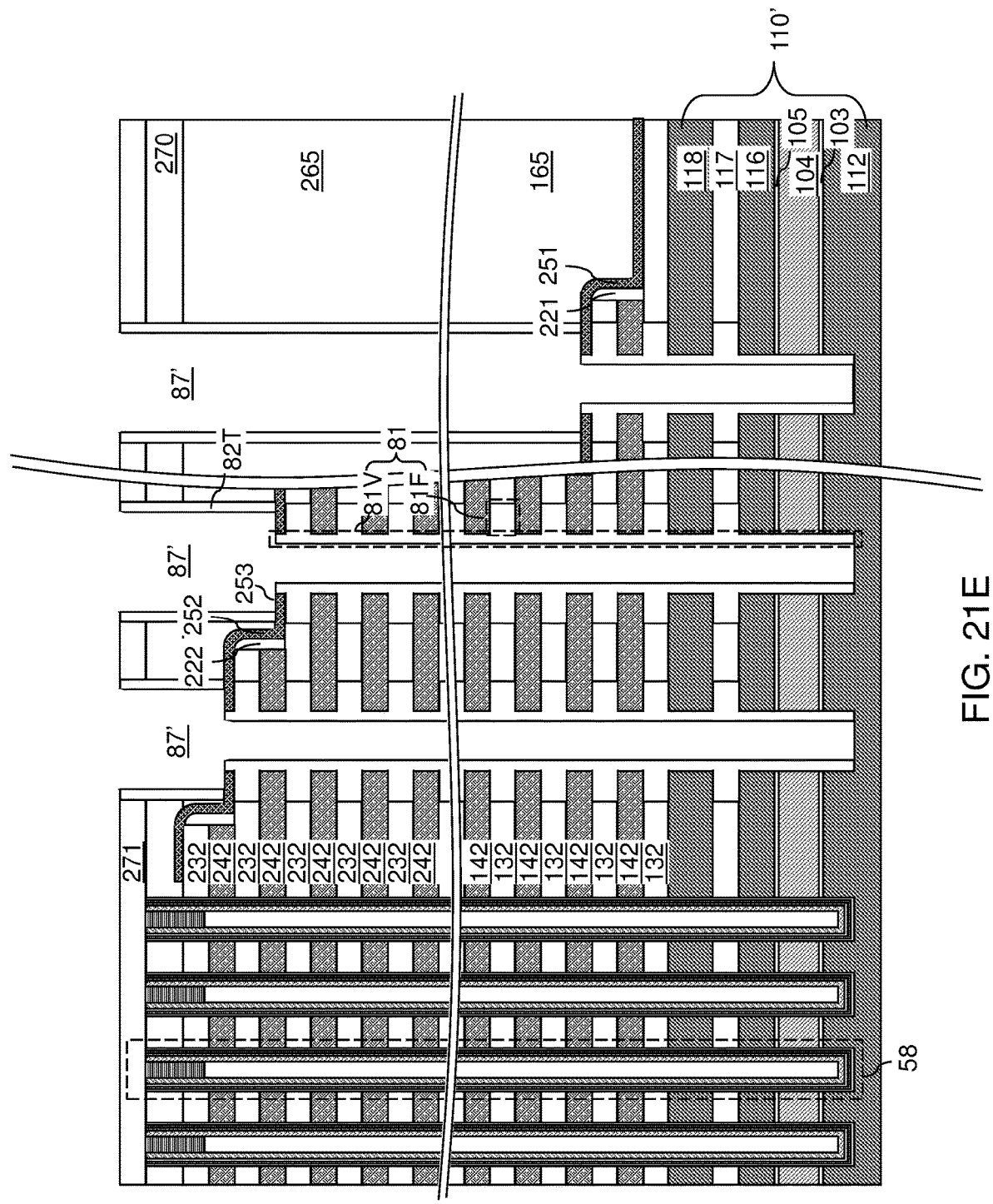

Referring to FIG. 21E, the anisotropic etch process can be performed to remove horizontally-extending portions of the dielectric material layer 82L. Each remaining portion of the dielectric material layer 82L that overlies a respective horizontally-extending surface segment 253 of the stepped surfaces (e.g., the exposed top surfaces of the etch stop layer 251) may have a tubular configuration, and is herein referred to as a tubular dielectric liner 82T. Each remaining portion of the dielectric material layer 82L that underlies the horizontally-extending surface segment of the stepped surfaces the above described dielectric support pillar 81.

Figure 21F:
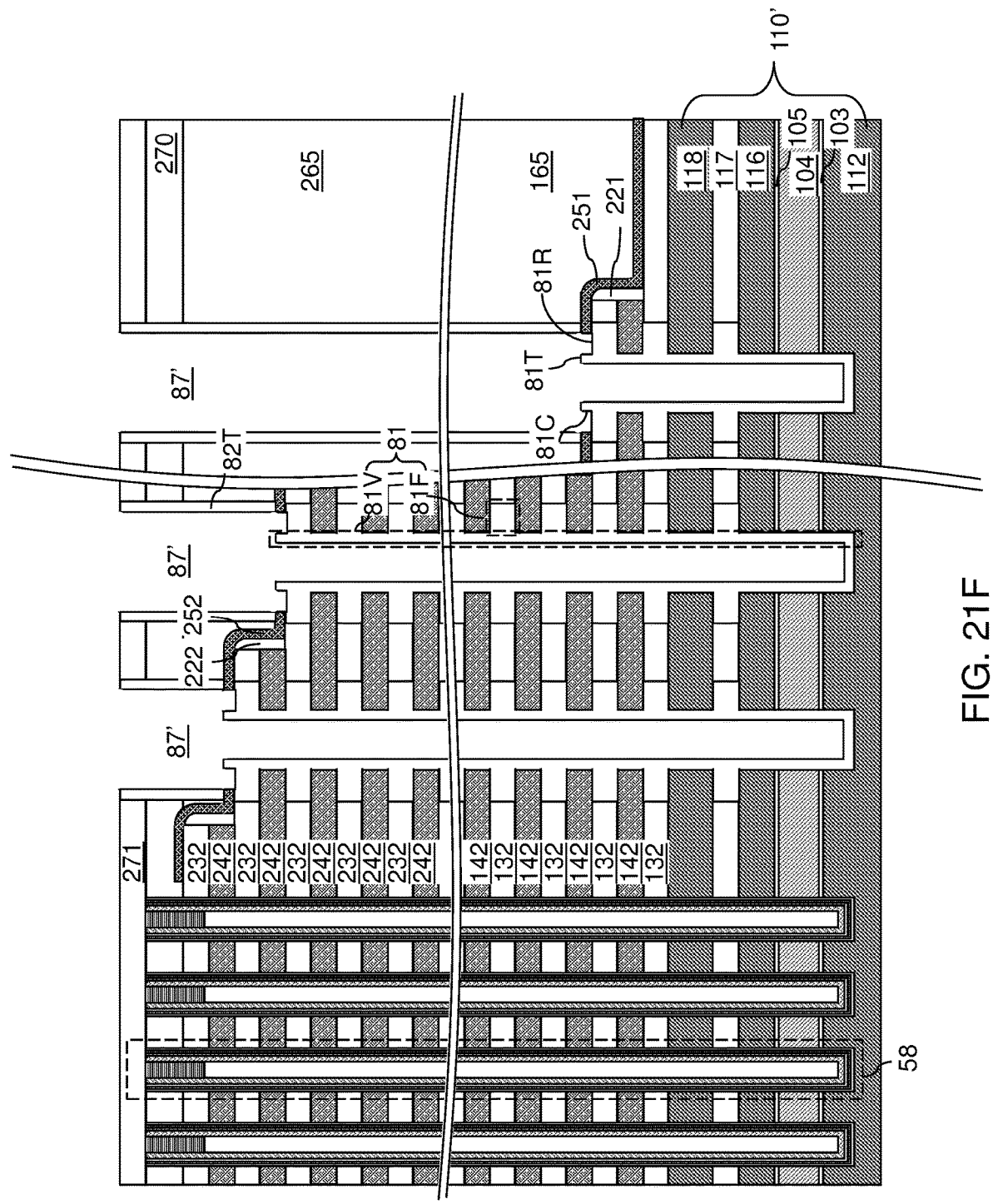

Referring to FIG. 21F, an anisotropic etch process may be performed to remove unmasked portions of the etch stop layers (251, 252) within each stepped via cavity 87'. Thus, each portion of the etch stop layers (251, 252) that are not masked by a respective overlying retro-stepped dielectric material portion (165, 265) can be removed after formation of the finned via cavities 87 and subsequent formation of the stepped via cavities 87'. A contoured top surface of a dielectric support pillar 81 can be physically exposed within each stepped via cavity 87'. Each contoured top surface may comprise an annular topmost surface segment 81T, a cylindrical surface segment 81C having a top periphery that is adjoined to an outer periphery of the annular top surface segment 81T, and a recessed annular surface segment 81R that is adjoined to a bottom periphery of the cylindrical surface segment 81C. Generally, at least an annular top surface of dielectric support pillar 81 can be physically exposed around each stepped via cavity 87'.

Figure 21G:
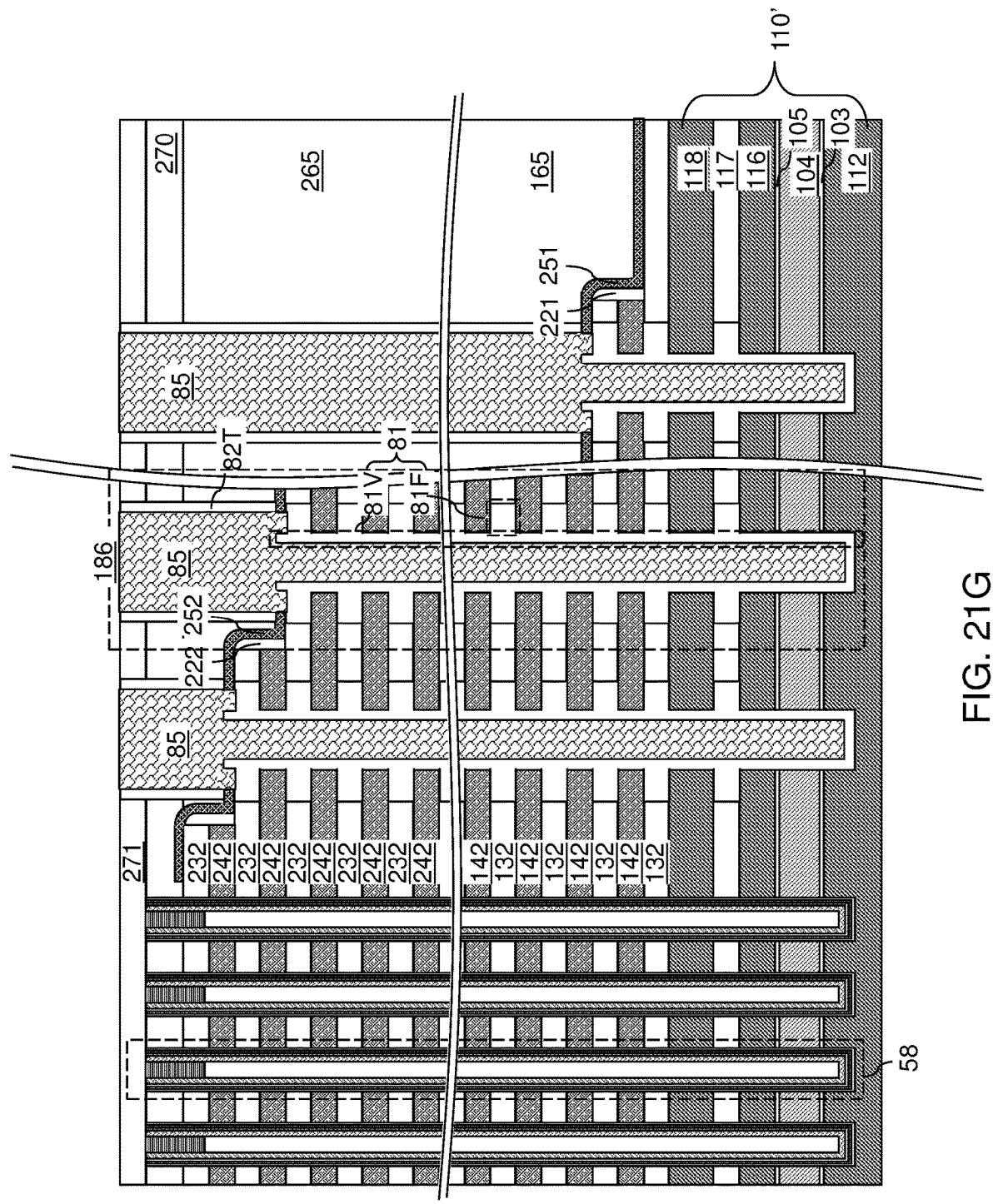

Referring to FIG. 21G, the sacrificial via fill material can be deposited in the stepped via cavities 87' by a conformal or non-conformal deposition process. The sacrificial via fill material comprises a material that can be removed selective to the material of the tubular dielectric liners 82T and the dielectric support pillars 81. The sacrificial via fill material may comprise a semiconductor material (such as amorphous silicon, polysilicon, or a silicon-germanium alloy), a carbon-based material (such as amorphous carbon, diamond-like carbon, or a doped derivative therefrom), an organosilicate glass material, or a polymer material.

Portions of the sacrificial via fill material that overlie the horizontal plane including the top surface of the dielectric cover layer 271 can be removed by performing a planarization process. The planarization process may comprise a chemical mechanical polishing (CMP) process and/or a recess etch process. Each remaining portion of the sacrificial via fill material is herein referred to as the sacrificial via fill material potion 85. Each combination of all material portions filling a respective finned via cavity 87 is herein referred to as an in-process integrated contact-and-support assembly 186. Each in-process integrated contact-and-support assembly 186 comprises a dielectric support pillar 81, a tubular dielectric liner 82T, and a sacrificial via fill material portion 85.

Subsequently, the processing steps described with reference to FIGS. 12A-17 can be performed.

FIGS. 22A-22F are sequential vertical cross-sectional views of the staircase region 200 of the third exemplary structure during formation of integrated contact-and-support assemblies 187, drain contact via structures 88, and connection via structures 286 according to the third embodiment of the present disclosure.

Figure 22A:
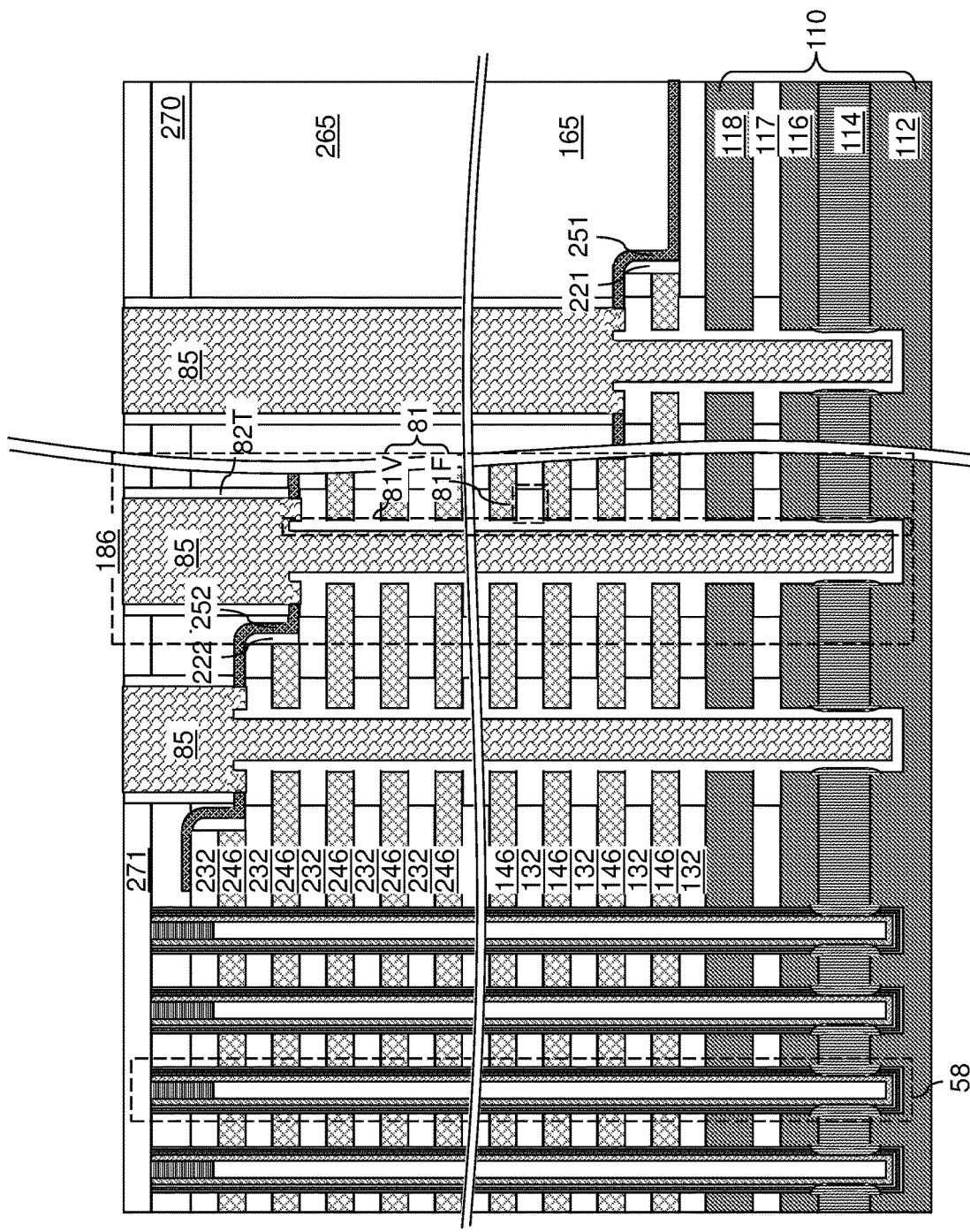
FIGS. 22A-22F are sequential vertical cross-sectional views of the staircase region of the third exemplary structure during formation of integrated contact-and-support assemblies, drain contact via structures, and connection via structures according to the third embodiment of the present disclosure.

Referring to FIG. 22A, the third exemplary structure is illustrated at a processing step that corresponds to the processing steps of FIG. 17.

Figure 22B:
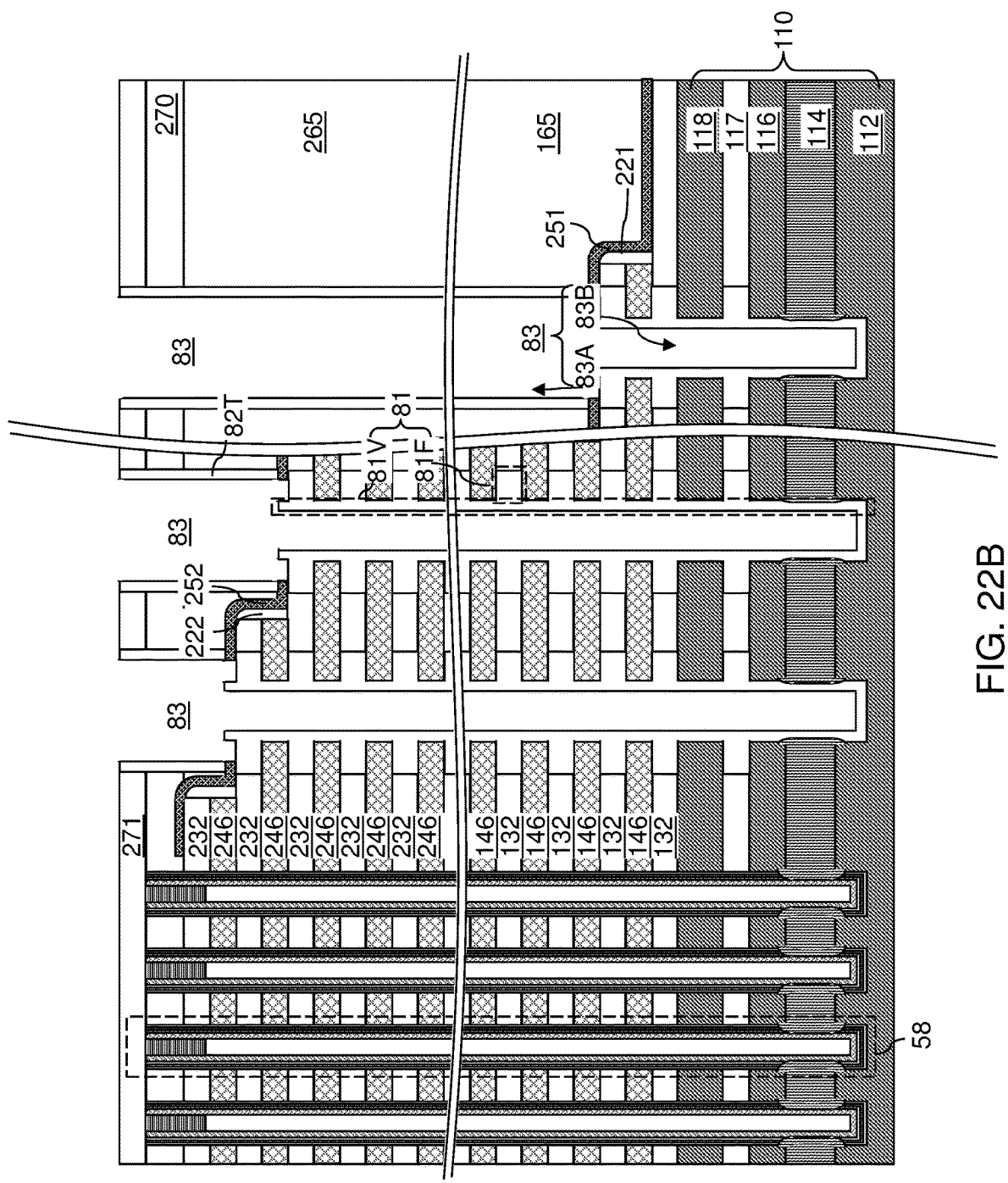

Referring to FIG. 22B, the sacrificial via fill material portions 85 is removed selective to the material of the dielectric support pillars 81 and the tubular dielectric liners 82T to form the above-described contact via cavities 83. The contact via cavities 83 may comprise an upper cavity portion 83A having a greater lateral dimension and a lower cavity portion 83B having a lesser lateral dimension.

Figure 22C:
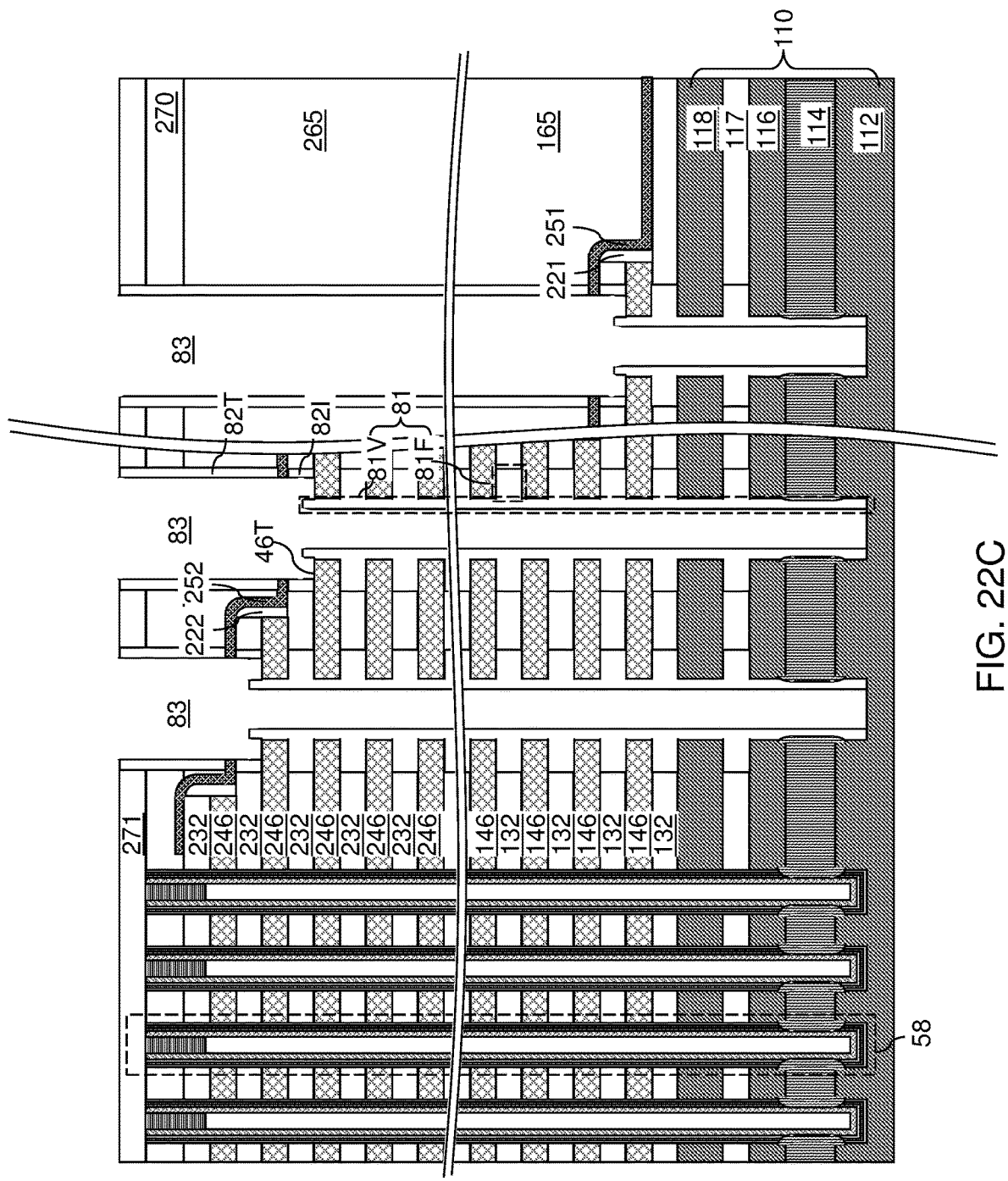

Referring to FIG. 22C, an anisotropic etch process can be performed to vertically recess unmasked portions of the dielectric support pillars 81. The duration of the anisotropic etch process can be selected such that an annular top surface 46T of a respective electrically conductive layer (146, 246) is physically exposed by the anisotropic etch process, while a sidewall of the respective electrically conductive layer (146, 246) that adjoined to the annular top surface is covered by a remaining portion of a respective dielectric support pillar 81.

Figure 22D:
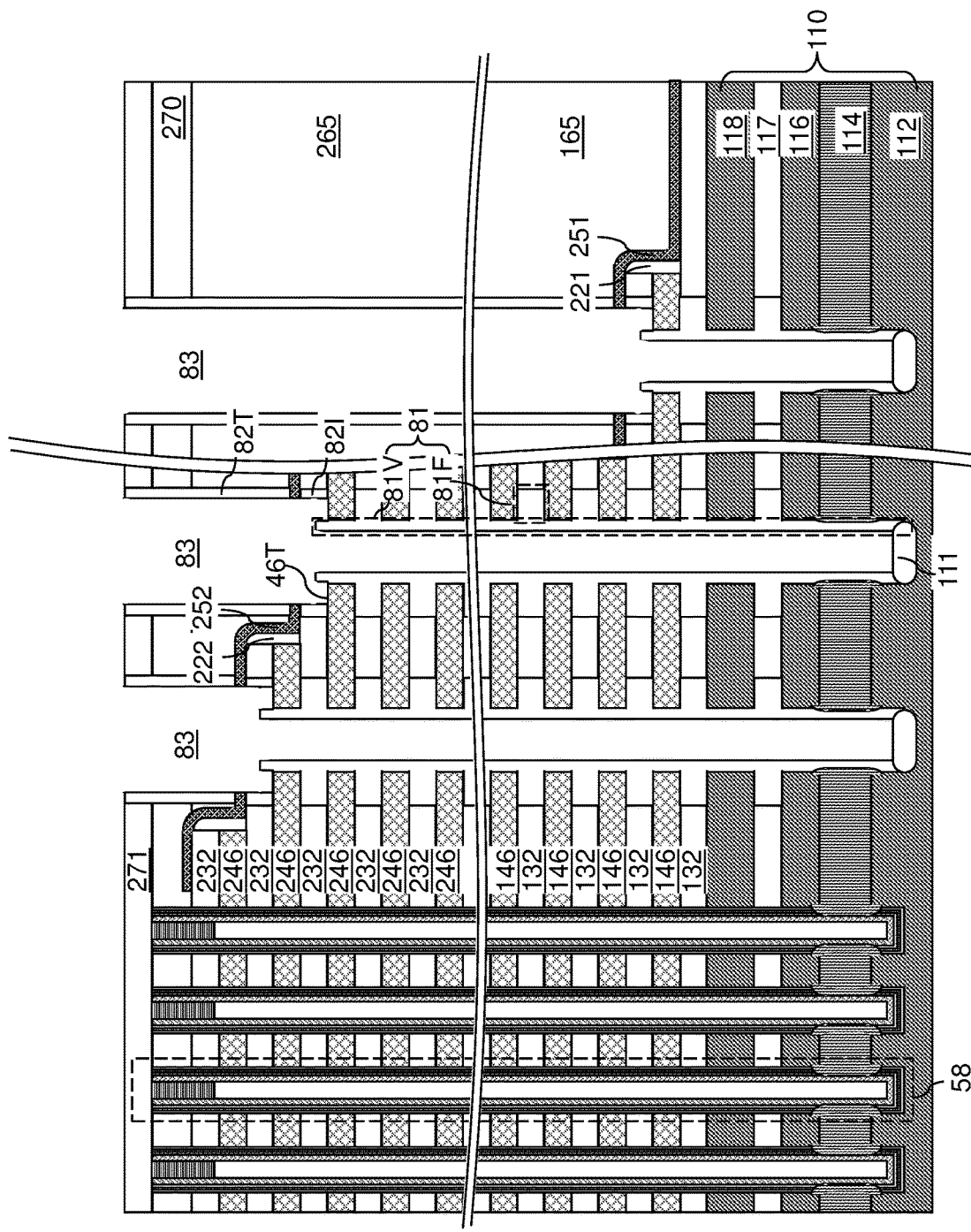

Referring to FIG. 22D, the optional oxidation process (such as a thermal oxidation process or a plasma oxidation process) can be performed to convert physically exposed semiconductor material portions (such as physically exposed surface portions of the lower source-level semiconductor layer 112) into semiconductor oxide portions 111.

Figure 22E:
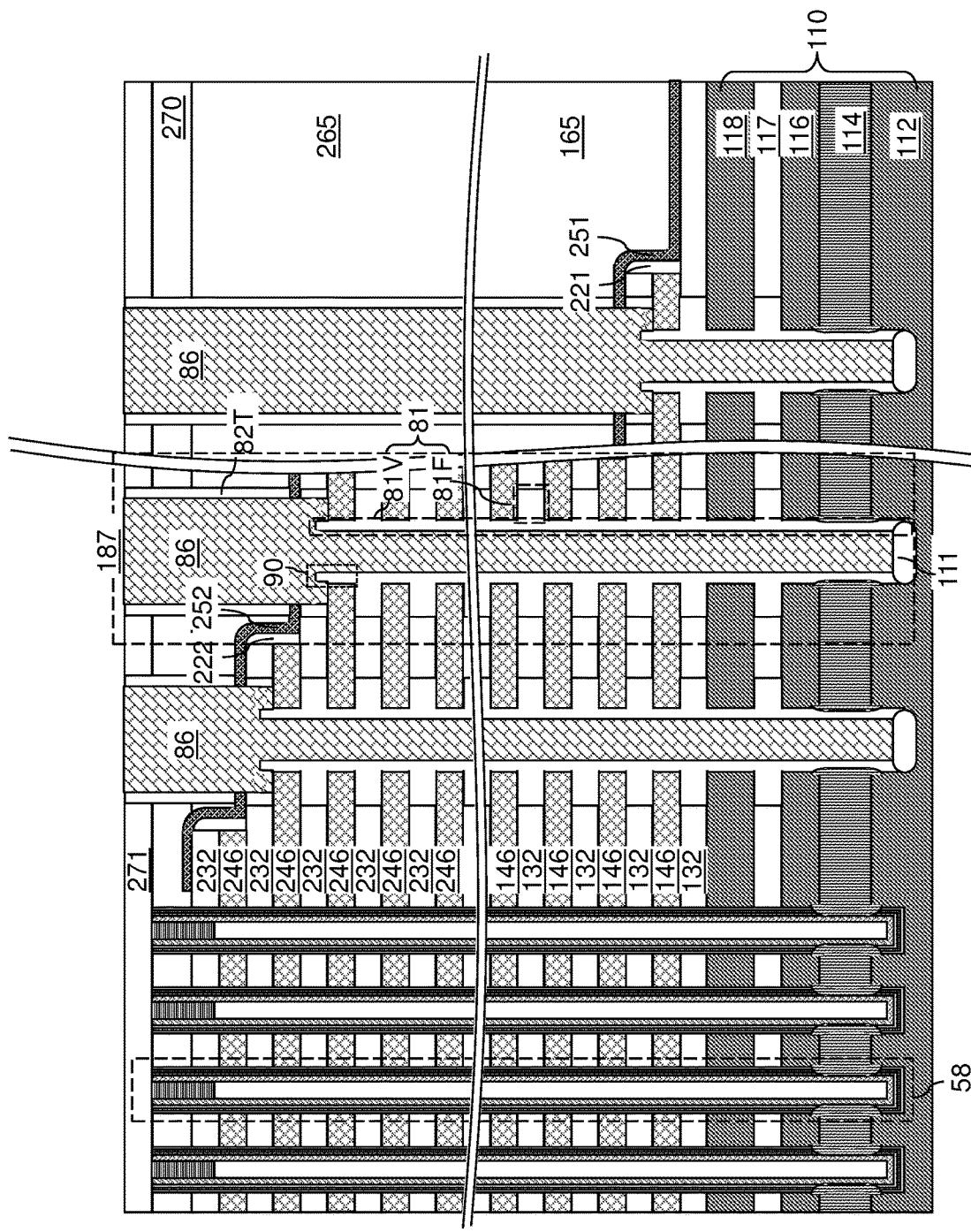

Referring to FIG. 22E, at least one conductive material can be deposited in the contact via cavities 83. The at least one conductive material may comprise a combination of a metallic barrier material (such as TiN, TaN, WN, MoN, TiC, TaC, WC, or a combination thereof) and a metallic fill material (such as W, Ti, Ta, Mo, Ru, Co, Cu, etc.). Excess portions of the at least one conductive material can be removed from above the horizontal plane including the dielectric cover layer 271 by a planarization process, which may comprise a chemical mechanical polishing (CMP) process and/or a recess etch process. Each remaining portion of the at least one conductive material that fills a respective contact via cavity 83 constitutes a conductive layer contact via structure 86. Each conductive layer contact via structure 86 contacts the annular surface segment 46T of a respective electrically conductive layer (146 or 246). Each conductive layer contact via structure 86 may comprise a bottommost surface that contacts a topmost surface of a respective semiconductor oxide portion 111.

Generally, each sacrificial via fill material portion 85 may be replaced with a respective conductive layer contact via structure 86. Each in-process integrated contact-and-support assembly 186 is converted into a respective integrated contact-and-support assembly 187. Each integrated contact-and-support assembly 187 comprises a vertical stack of a dielectric support pillar 81 and a conductive layer contact via structure 86. The conductive layer contact via structure 86 contacts a top surface 46T of a respective first electrically conductive layer (146 or 246).

Figure 22F:
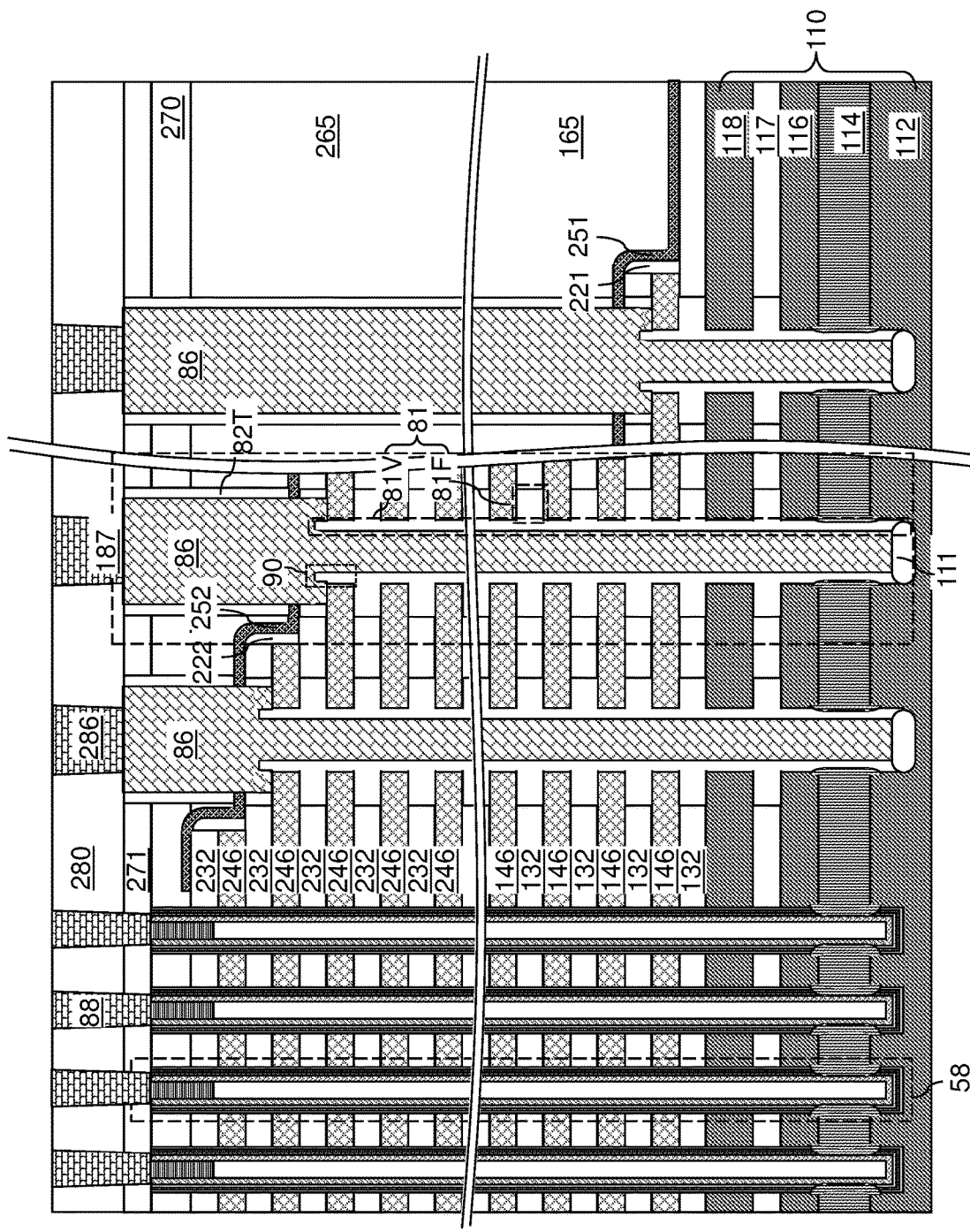

Referring to FIG. 22F, a contact-level dielectric layer 280 can be formed over the dielectric cover layer 271. Drain contact via structures 88 can be formed through the contact-level dielectric layer 280 and the dielectric cover layer 271 on a top surface of a respective drain region 63. Connection via structures 286 can be formed through the contact-level dielectric layer 280 on a top surface of a respective conductive layer contact via structure 86. Additional dielectric material layers and additional metal interconnect can be formed above the contact-level dielectric layer 280 as described above.

In the third embodiment, the dielectric spacer 90 comprises the upper portion of the dielectric support pillar 81.

FIGS. 23A-23D are sequential vertical cross-sectional views of a staircase region 200 of a fourth exemplary structure during formation of in-process integrated contact-and-support assemblies 186 according to a fourth embodiment of the present disclosure.

Figure 23A:
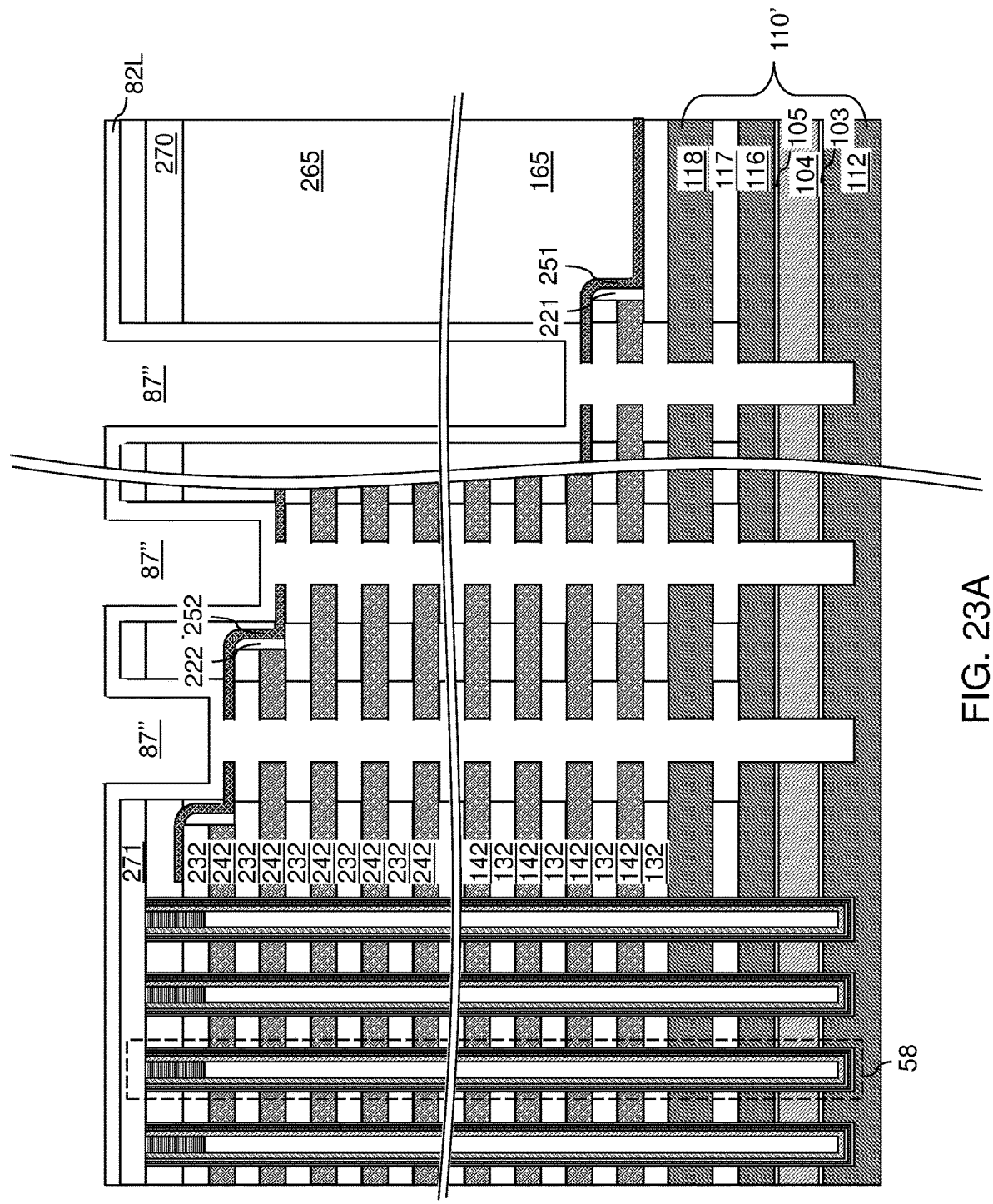
FIGS. 23A-23D are sequential vertical cross-sectional views of a staircase region of a fourth exemplary structure during formation of in-process integrated contact-and-support assemblies according to a fourth embodiment of the present disclosure.

Referring to FIG. 23A, the fourth exemplary structure according to the fourth embodiment of the present disclosure can be derived from the third exemplary structure described with reference to FIG. 21D by increasing the thickness of the dielectric liner 82L. In one embodiment, the thickness of the dielectric liner 82L can be increased such that the lower portion of each finned via cavity 87 that underlies a respective portion of an etch stop layer (251, 252) is completely filled with the dielectric material of the dielectric liner 82L.

Figure 23B:
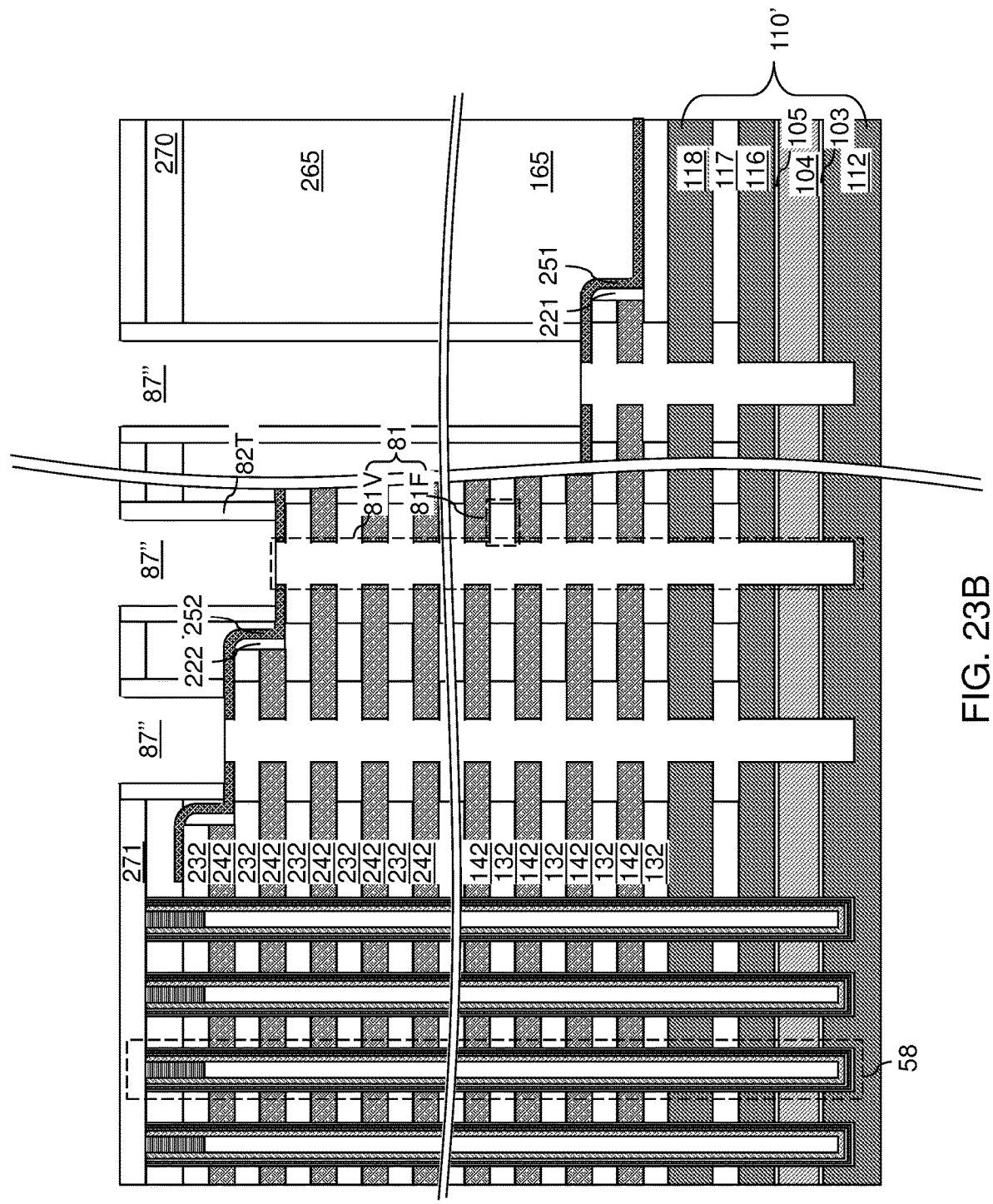

Referring to FIG. 23B, the anisotropic etch process can be performed to remove horizontally-extending portions of the dielectric material layer 82L. Each remaining portion of the dielectric material layer 82L that overlies a respective horizontally-extending portion of an etch stop layer (251, 252) may have a tubular configuration, and is herein referred to as a tubular dielectric liner 82T. Each remaining portion of the dielectric material layer 82L that underlies the respective horizontally-extending portion of an etch stop layer (251, 252) constitutes a dielectric support pillar 81. Underneath each via cavity 87", an annular surface segment of a respective etch stop layer (251, 252) is physically exposed after anisotropically etching the dielectric material layer 82L.

Figure 23C:
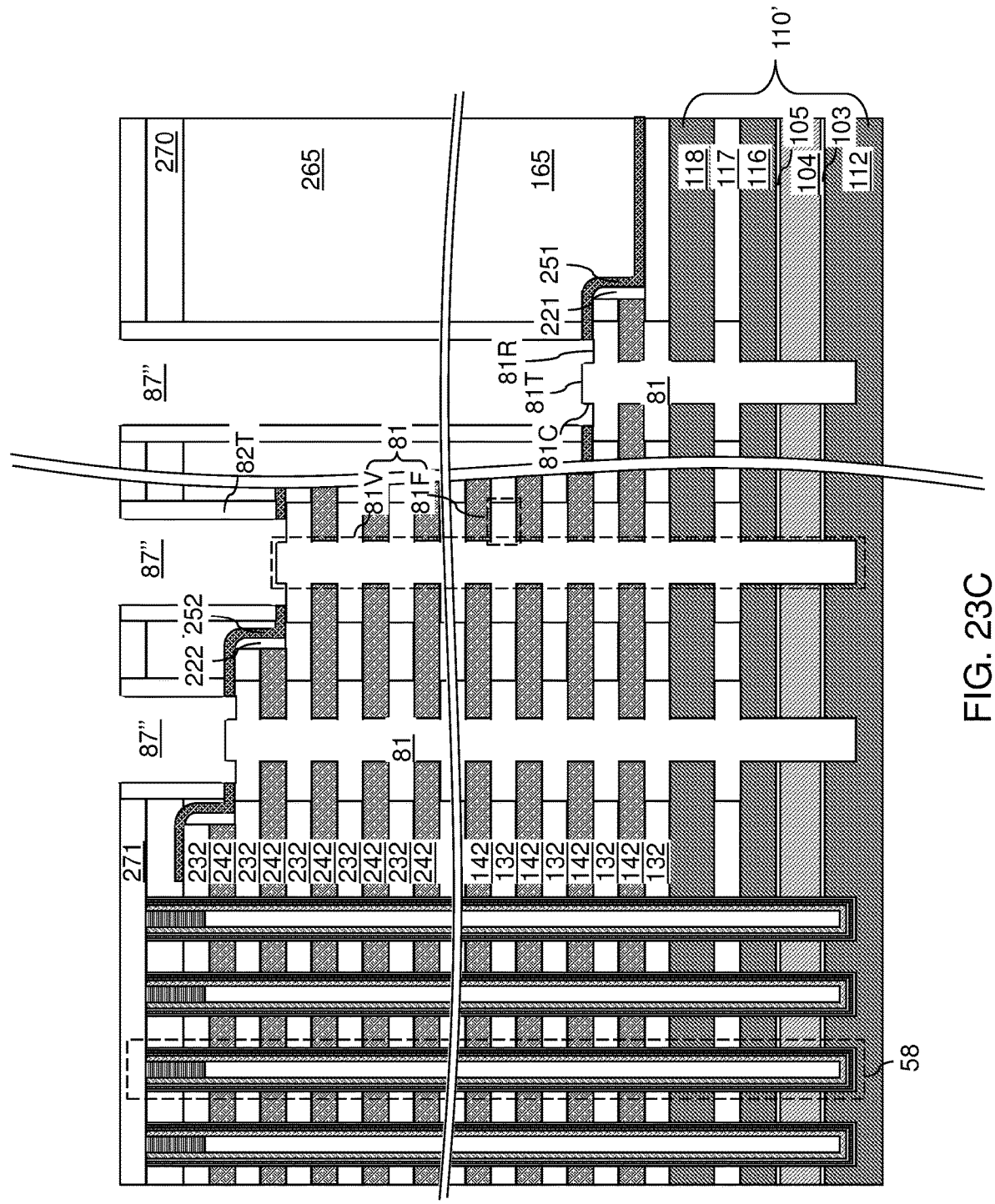

Referring to FIG. 23C, an anisotropic etch process may be performed to remove unmasked portions of the etch stop layers (251, 252) within each via cavity 87". Thus, each portion of the etch stop layers (251, 252) that are not masked by a respective overlying retro-stepped dielectric material portion (165, 265) can be removed after formation of the finned via cavities 87 and subsequent formation of the via cavities 87". A contoured top surface of a dielectric support pillar 81 can be physically exposed within each via cavity 87". Each contoured top surface may comprise a central topmost surface segment 81T, a cylindrical surface segment 81C having a top periphery that is adjoined to a periphery of the central top surface segment 81T, and a recessed annular surface segment 81R that is adjoined to a bottom periphery of the cylindrical surface segment. Generally, at least an annular top surface of dielectric support pillar 81 can be physically exposed around each via cavity 87" which now comprises a stepped via cavity due to the step between segments 81R and 81T. The contoured top surface of the dielectric support pillar 81 of the fourth embodiment different from that of the third embodiment in that there is no opening through the central top surface segment 81T in the fourth embodiment.

Figure 23D:
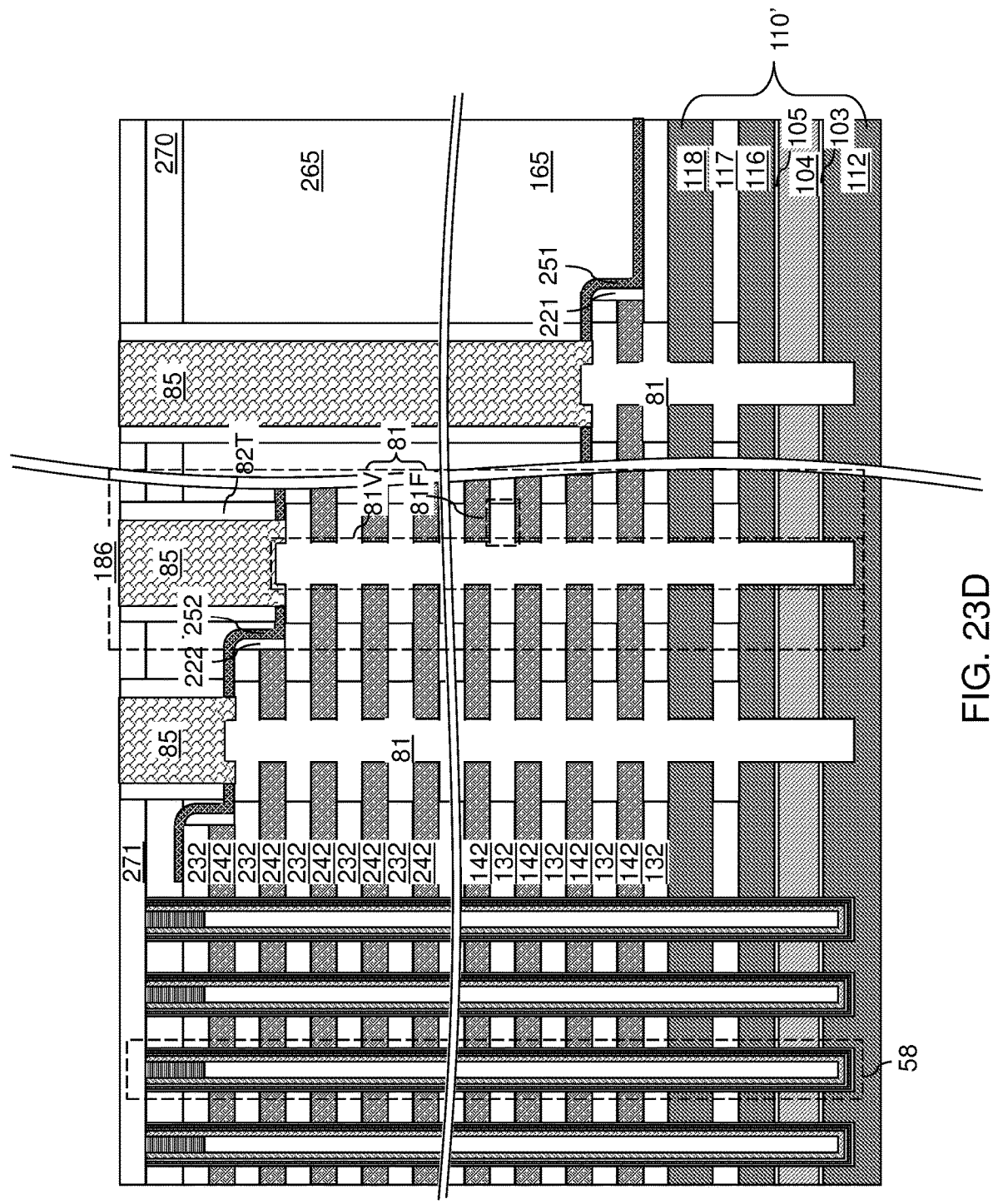

Referring to FIG. 23D, the sacrificial via fill material potions 85 are formed in the cavities 87" as described above. Each combination of all material portions filling a respective finned via cavity 87 is herein referred to as an in-process integrated contact-and-support assembly 186. Each in-process integrated contact-and-support assembly 186 comprises a dielectric support pillar 81, a tubular dielectric liner 82T, and a sacrificial via fill material portion 85.

Subsequently, the processing steps described with reference to FIGS. 12A-17 can be performed.

FIGS. 24A-24E are sequential vertical cross-sectional views of the staircase region of the third exemplary structure during formation of integrated contact-and-support assemblies 187, drain contact via structures 88, and connection via structures 286 according to the fourth embodiment of the present disclosure.

Figure 24A:
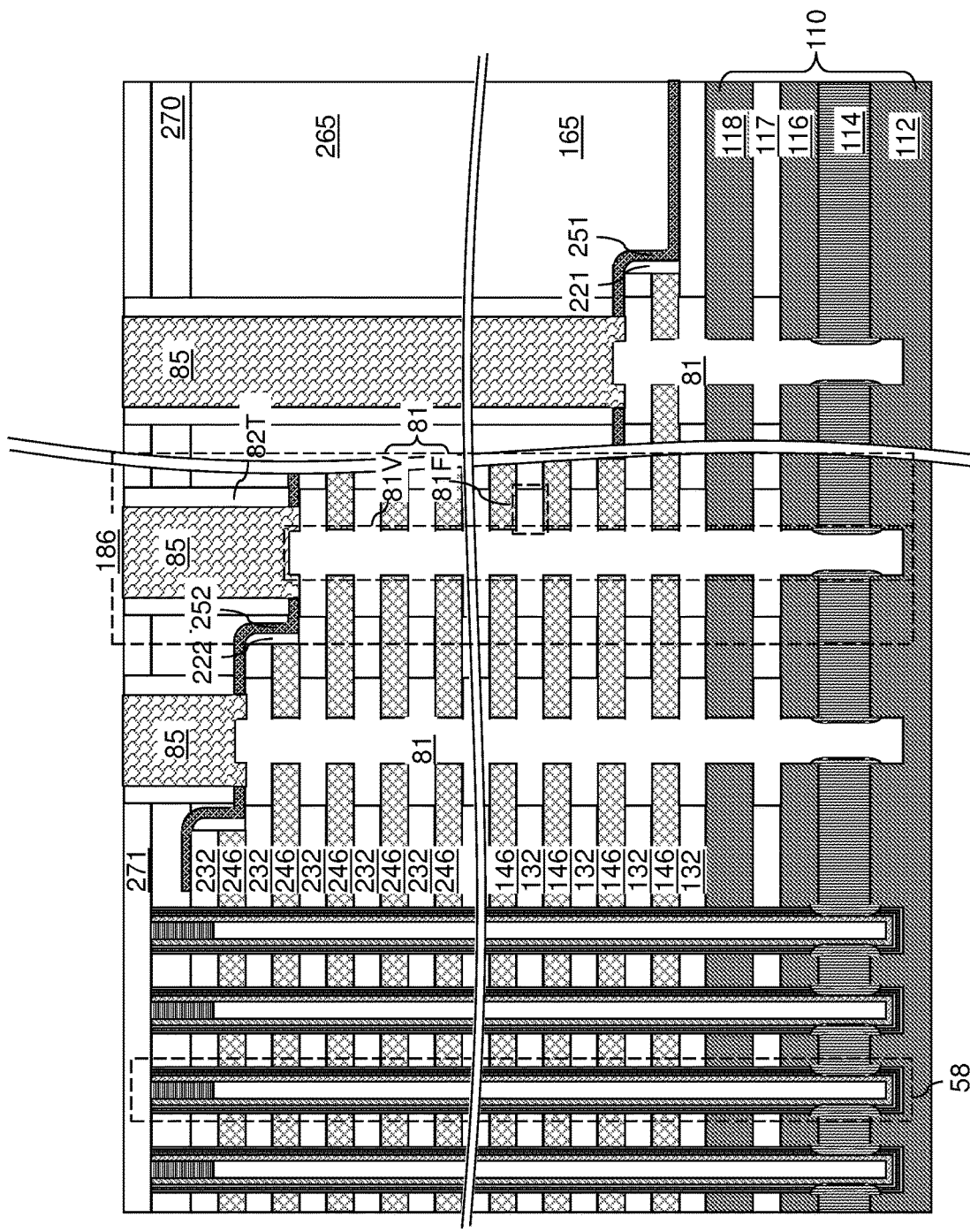
FIGS. 24A-24E are sequential vertical cross-sectional views of the staircase region of the fourth exemplary structure during formation of integrated contact-and-support assemblies, drain contact via structures, and connection via structures according to the fourth embodiment of the present disclosure.

Referring to FIG. 24A, the fourth exemplary structure is illustrated at a processing step that corresponds to the processing steps of FIG. 17.

Figure 24B:
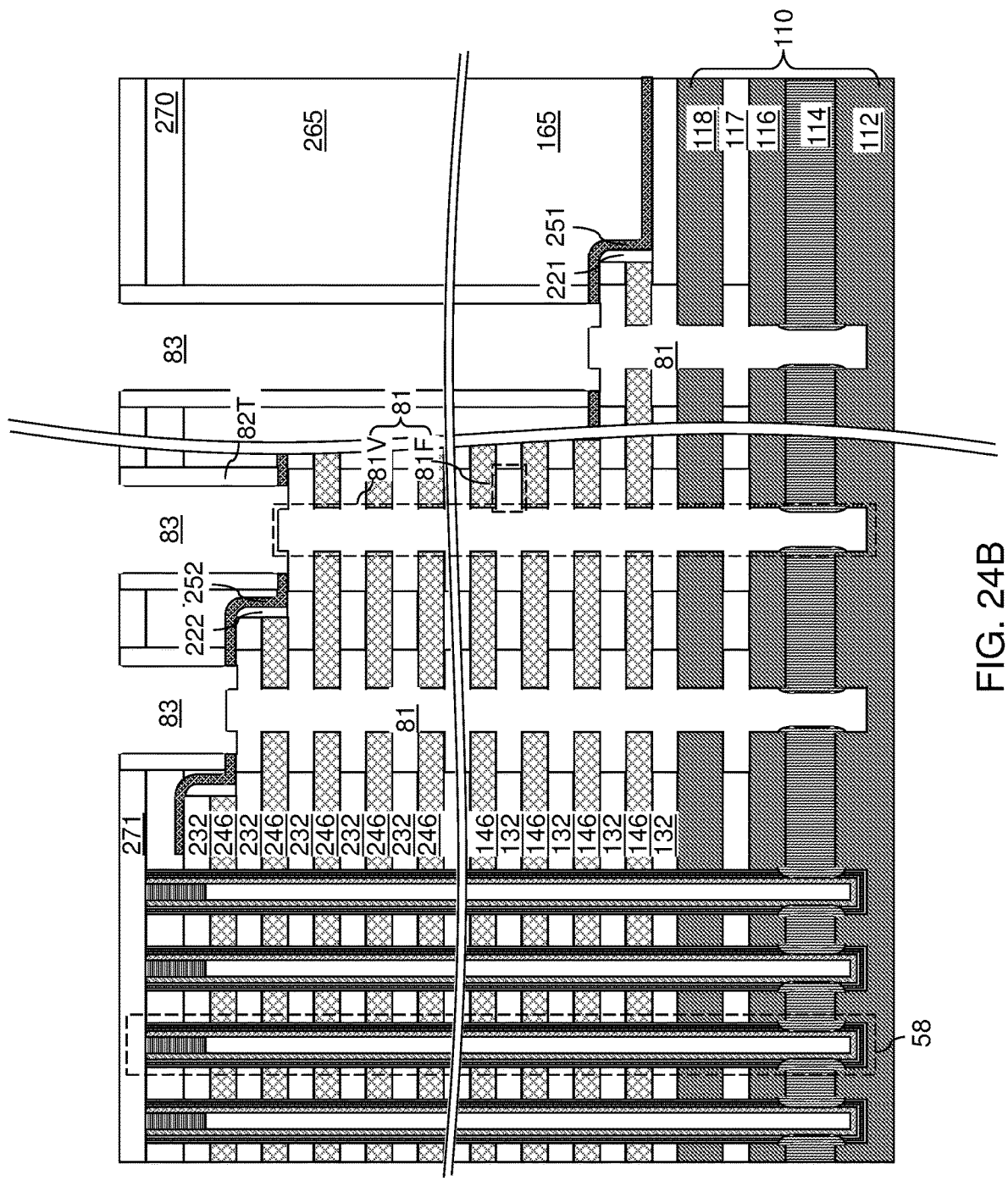

Referring to FIG. 24B, the sacrificial via fill material portions 85 can be removed selective to the material of the dielectric support pillars 81 and the tubular dielectric liners 82T to form contact via cavities 83, as described above.

Figure 24C:
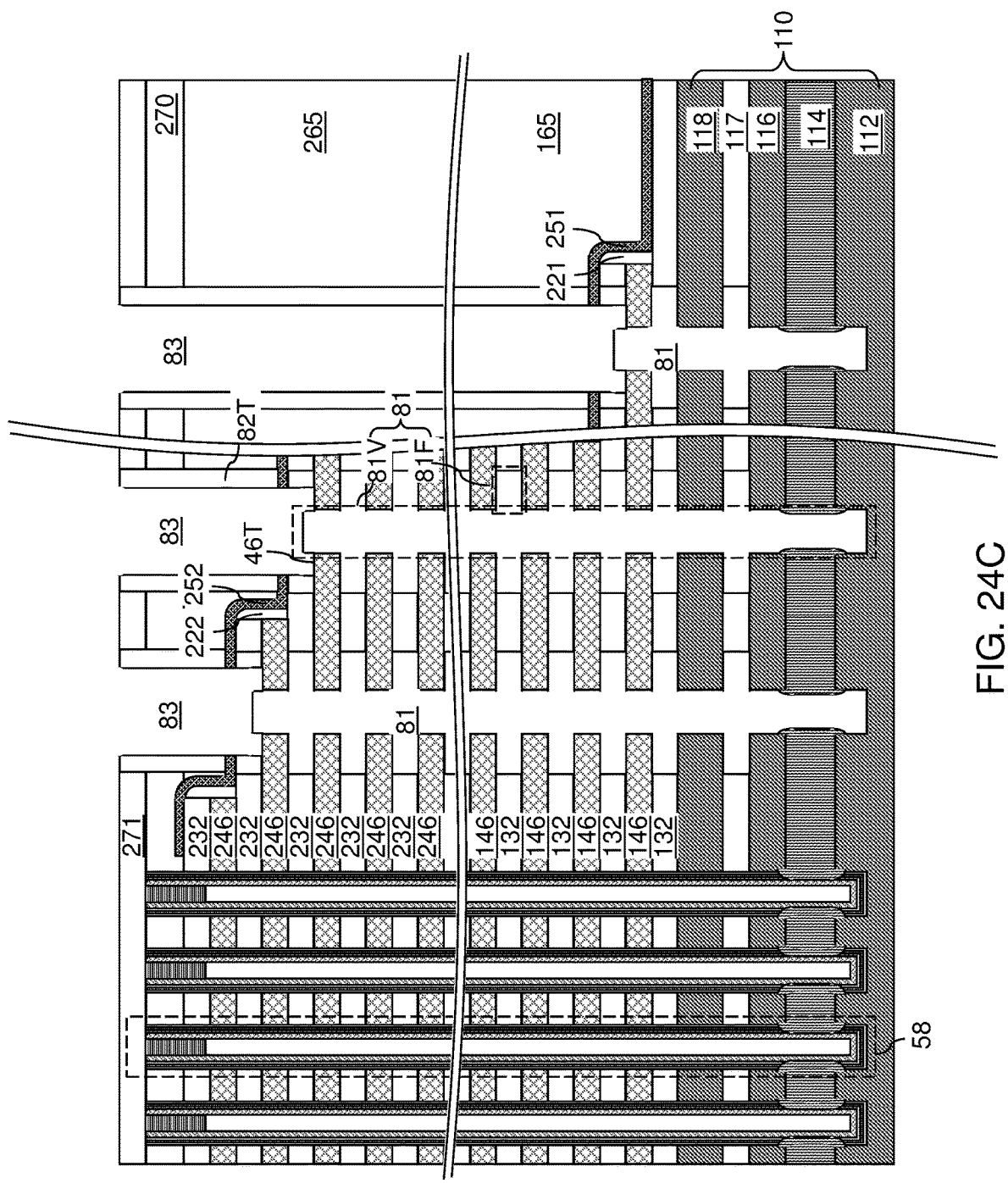

Referring to FIG. 24C, an anisotropic etch process can be performed to vertically recess unmasked portions of the dielectric support pillars 81. The duration of the anisotropic etch process can be selected such that an annular top surface 46T of a respective electrically conductive layer (146, 246) is physically exposed by the anisotropic etch process, while a sidewall of the respective electrically conductive layer (146, 246) that adjoined to the annular top surface is covered by a remaining portion of a respective dielectric support pillar 81.

Figure 24D:
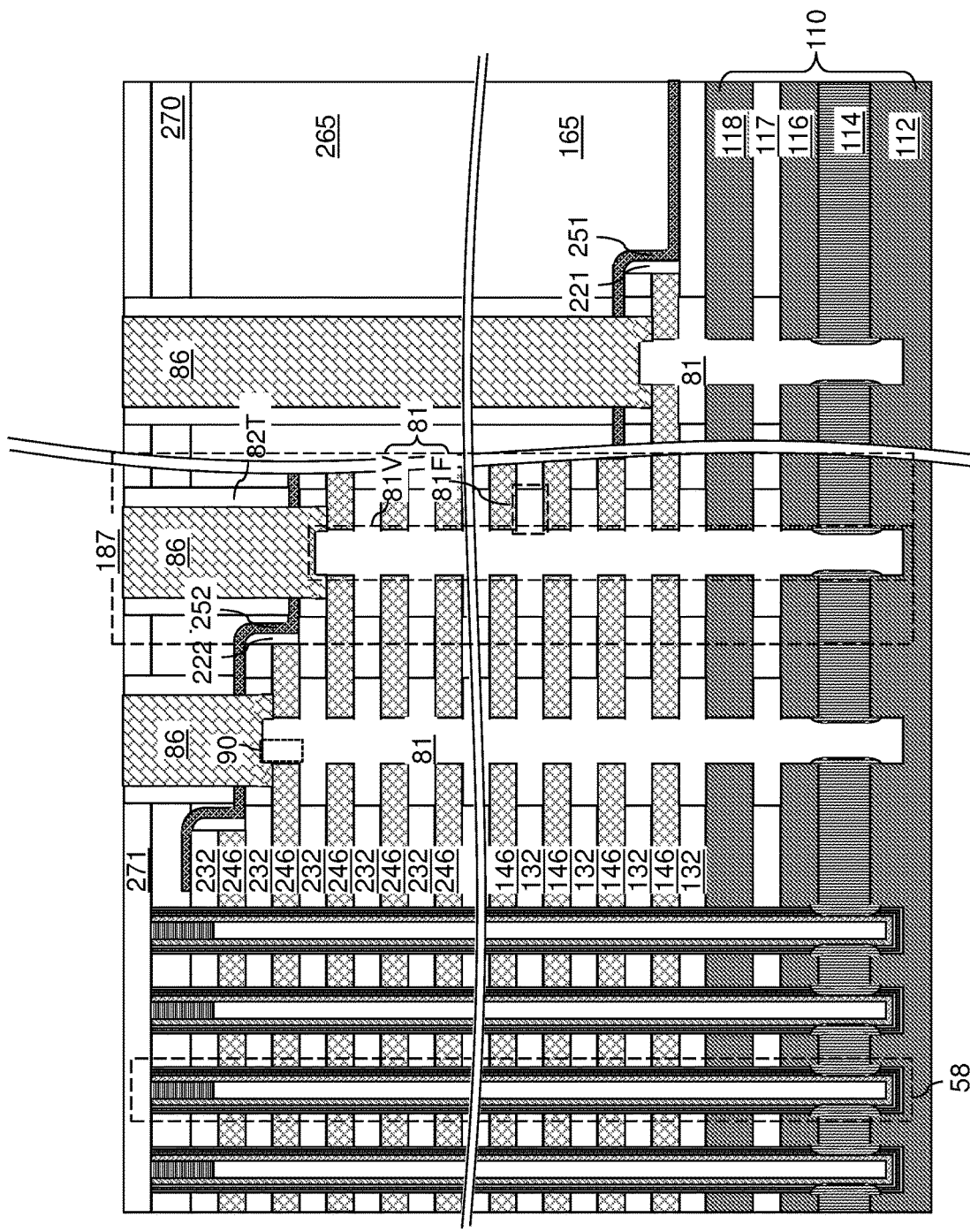

Referring to FIG. 24D, the conductive layer contact via structures 86 are formed in the contact via cavities 83, as described above. Each conductive layer contact via structure 86 contacts the annular surface segment 46T of a respective electrically conductive layer (146 or 246). In one embodiment, an entirety of each conductive layer contact via structure 86 may be located above an interface between the conductive layer contact via structure 86 and a respective electrically conductive layer (146, 246). In one embodiment, a bottom portion of the conductive layer contact via structure 86 contacts a top portion of the vertically-extending dielectric material portion 81V.

Generally, each sacrificial via fill material portion 85 may be replaced with a respective conductive layer contact via structure 86. Each in-process integrated contact-and-support assembly 186 is converted into a respective integrated contact-and-support assembly 187. Each integrated contact-and-support assembly 187 comprises a vertical stack of a dielectric support pillar 81 and a conductive layer contact via structure 86. The conductive layer contact via structure 86 contacts a top surface 46T of a respective first electrically conductive layer (146 or 246). The entirety of the conductive layer contact via structure 86 overlies a respective dielectric support pillar 81.

Figure 24E:
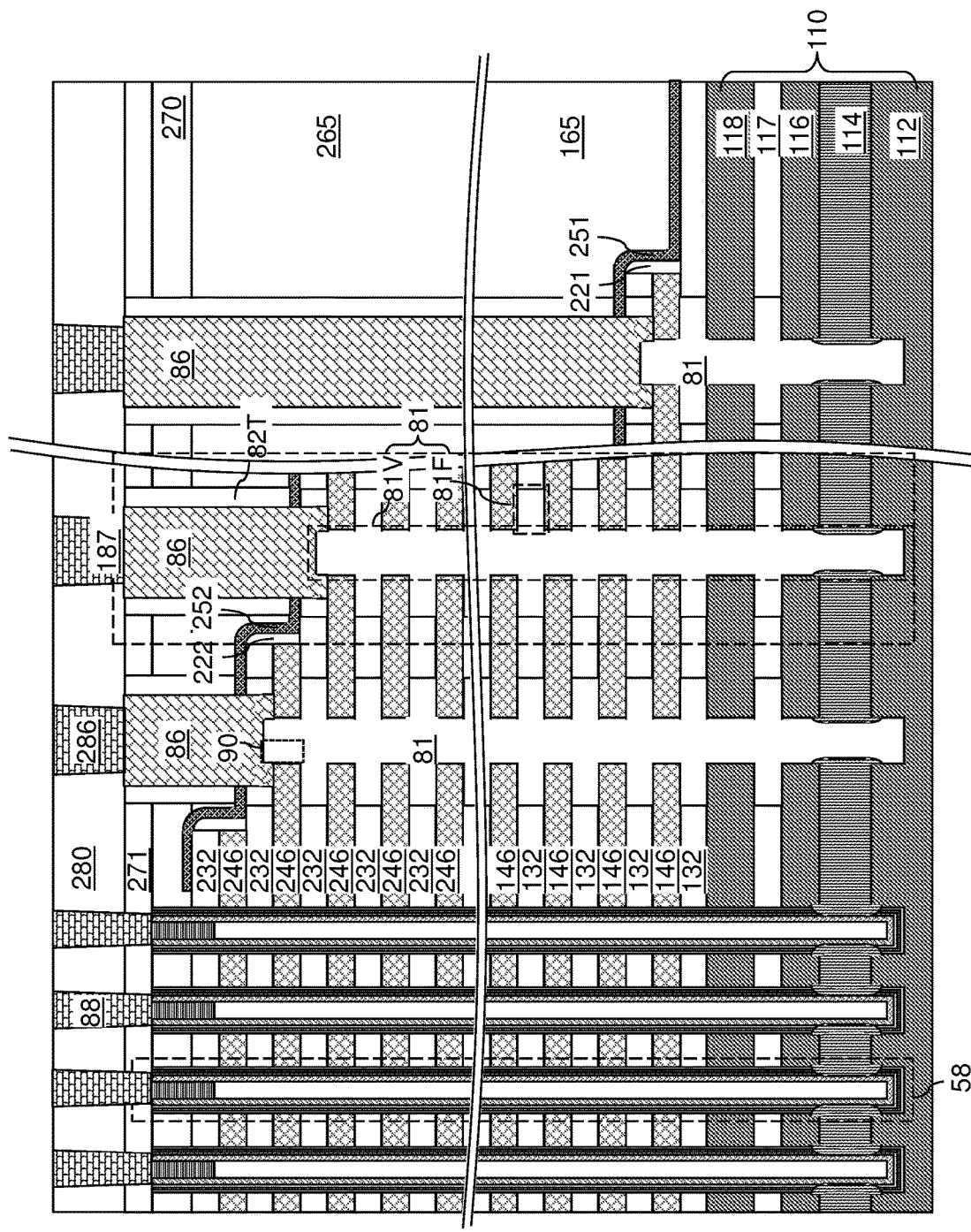

Referring to FIG. 24E, a contact-level dielectric layer 280 can be formed over the dielectric cover layer 271. Drain contact via structures 88 can be formed through the contact-level dielectric layer 280 and the dielectric cover layer 271 on a top surface of a respective drain region 63. Connection via structures 286 can be formed through the contact-level dielectric layer 280 on a top surface of a respective conductive layer contact via structure 86. Additional dielectric material layers and additional metal interconnect structures can be formed above the contact-level dielectric layer 280.

In the fourth embodiment, the dielectric spacer 90 comprises the upper portion of the dielectric support pillar 81.

Referring to all drawings and according to various embodiments of the present disclosure, a semiconductor structure is provided, which comprises: an alternating stack {(132, 146), (232, 246)} of insulating layers (132, 232) and electrically conductive layers (146, 246); memory openings 49 vertically extending through the alternating stack {(132, 146), (232, 246)}; memory opening fill structures 58 located in the memory openings 49, wherein each of the memory stack structures 55 comprises a respective vertical semiconductor channel 60 and a respective vertical stack of memory elements (e.g., portions of the memory film 50) located at levels of the electrically conductive layers (146, 246); a contact via cavity 83 vertically extending through the alternating stack, and an integrated contact-and-support assembly 187 located in the contact via cavity 83. The integrated contact-and-support assembly 187 includes a dielectric support pillar 81 and a conductive layer contact via structure 86 electrically contacting a top surface of a first electrically conductive layer (146 or 246) of the electrically conductive layers (146, 246) that surrounds the contact via cavity 83. A dielectric spacer 90 is located in the contact via cavity 83, covering a sidewall of the first electrically conductive layer (146 or 246) in the contact via cavity 83, and extending above the top surface of the first electrically conductive layer (146 or 246).

In one embodiment, the dielectric support pillar 81 comprises: a vertically-extending dielectric material portion 81V that extends through a first subset of the electrically conductive layers (146, 246) the underlie the first electrically conductive layer (146 or 246); and a plurality of annular dielectric fin portions 81F laterally protruding outward from the vertically-extending dielectric material portion 81V and located at levels of a subset of the insulating layers (132, 232) that underlie the first electrically conductive layer (146 or 246).

In the first and second embodiments, the vertically-extending dielectric material portion 81V comprises a tubular material portion having an inner cylindrical sidewall that vertically extends continuously through a plurality of electrically conductive layers (146, 246). In one embodiment, the integrated contact-and-support assembly 187 further comprises a dielectric liner 84 (such as a lower dielectric liner 84L portion) having an outer cylindrical sidewall that contacts the inner cylindrical sidewall of the vertically-extending dielectric material portion 81V of the dielectric support pillar 81. The dielectric spacer 90 comprises an upper portion of the dielectric liner 84.

In the first embodiment, the conductive layer contact via structure 86 also comprises an a lower portion that is laterally surrounded by the dielectric liner (such as the lower dielectric liner 84L) and vertically extends continuously through the first subset of the electrically conductive layers (146, 246).

In the first and second embodiments, the vertically-extending dielectric material portion 81V and the dielectric liner 84 vertically extend through the contact via opening 83 opening in the first electrically conductive layer (146 or 246). The first electrically conductive layer (146 or 246) has a uniform vertical thickness; a conductive annular pad 46A is located on and protrudes above an annular portion of the top surface of the first electrically conductive layer (146 or 246) that laterally surrounds the contact via opening 83; and the conductive layer contact via structure 86 directly physically contacts the conductive annular pad 46A.

In the first and second embodiments, the conductive annular pad portion 46A comprises a contoured top surface including an annular planar surface segment APS and a convex tapered annular surface segment CTAS that is adjoined to an inner periphery of the annular planar surface segment APS and having a convex vertical cross-sectional profile and an annular top-down profile.

In the second embodiment, the dielectric liner 84 completely fills the contact via cavity 83 at a level of the conductive annular pad 46, and embeds an air gap 189 below the first electrically conductive layer (146 or 246); and a bottommost surface segment of the conductive layer contact via structure 86 contacts a top surface of the dielectric liner 84.

In some embodiments, such as the third and fourth embodiments, the dielectric spacer 90 comprises an upper portion of the dielectric support pillar 81.

In the third embodiment, the upper portion of the dielectric support pillar 81 comprises a contoured top surface which comprises an annular topmost surface segment 81T, a cylindrical surface segment 81C having a top periphery that is adjoined to an outer periphery of the annular top surface segment 81T, and a recessed annular surface segment 81R that is adjoined to a bottom periphery of the cylindrical surface segment 81C.

In the third and fourth embodiment, the dielectric spacer protrudes 84 into a recess in a bottom portion of the conductive layer contact via structure 86.

In the third and fourth embodiments, insulating spacers (121, 122) are located on vertically-extending surface segments of stepped surfaces of the alternating stack; and a dielectric etch stop layer (151, 152) is located over horizontally-extending surface segments of the stepped surfaces and over the insulating spacers.

In various embodiments, the alternating stack {(132, 146), (232, 246)} comprises a staircase region 200 in which lateral extents of the electrically conductive layers (146, 246) decrease with a vertical distance from a substrate 8 which underlies the alternating stack; a retro-stepped dielectric material potion (165, 265) overlies stepped surfaces of the alternating stack {(132, 146), (232, 246)} that are located in the staircase region 200; and the conductive layer contact via structure 86 vertically extends through the retro-stepped dielectric material portion (165, 265).

The dielectric spacer 90 of various embodiments covers a sidewall of the first electrically conductive layer (146 or 246) in the contact via cavity 83 and prevents or reduces a short circuit between the conductive layer contact via structure 86 and a second electrically conductive layer which underlies the first electrically conductive layer. Without the dielectric spacer 90, the dielectric layers located in the contact via cavity 83 may be over-etched during formation of the stepped via cavity 87' and expose both the first and second electrically conductive layers in the contact via cavity 83. This may cause a short circuit between the conductive layer contact via structure 86 which is deposited in the contact via cavity 83 and a second electrically conductive layer having an exposed surface in the contact via cavity 83.

The in-process integrated contact-and-support assemblies 186 of the embodiments of the present disclosure can be employed as support structures during replacement of the sacrificial material layers (142, 242) with electrically conductive layers (146, 246). Further, the integrated contact-and-support assemblies 187 of the present disclosure comprise a respective conductive layer contact via structure 86 that contacts a respective one of the electrically conductive layers 46. Thus, the in-process integrated contact-and-support assemblies 186 and the integrated contact-and-support assemblies 187 of the present disclosure can be employed to provide structural support and electrical contact for word lines in a three-dimensional memory device of the present disclosure.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure, comprising:
an alternating stack of insulating layers and electrically conductive layers;
memory openings vertically extending through the alternating stack;
memory opening fill structures located in the memory openings, wherein each of the memory stack structures comprises a respective vertical semiconductor channel and a respective vertical stack of memory elements located at levels of the electrically conductive layers;
a contact via cavity vertically extending through the alternating stack; and
an integrated contact-and-support assembly located in the contact via cavity,
wherein:
the integrated contact-and-support assembly comprises a dielectric support pillar and a conductive layer contact via structure electrically contacting a top surface of a first electrically conductive layer of the electrically conductive layers that surrounds the contact via cavity; and
a dielectric spacer located in the contact via cavity, covering a sidewall of the first electrically conductive layer in the contact via cavity, and extending above the top surface of the first electrically conductive layer.

2. The semiconductor structure of claim 1, wherein the dielectric support pillar comprises:
a vertically-extending dielectric material portion that extends through a first subset of the electrically conductive layers that underlie the first electrically conductive layer; and
a plurality of annular dielectric fin portions laterally protruding outward from the vertically-extending dielectric material portion and located at levels of a subset of the insulating layers that underlie the first electrically conductive layer.

3. The semiconductor structure of claim 2, wherein:
the vertically-extending dielectric material portion comprises a tubular material portion having an inner cylindrical sidewall that vertically extends continuously through a plurality of electrically conductive layers;
the integrated contact-and-support assembly further comprises a dielectric liner having an outer cylindrical sidewall that contacts the inner cylindrical sidewall of the vertically-extending dielectric material portion of the dielectric support pillar; and
the dielectric spacer comprises an upper portion of the dielectric liner.

4. The semiconductor structure of claim 3, wherein the conductive layer contact via structure further comprises a lower portion that is laterally surrounded by the dielectric liner and vertically extends continuously through the first subset of the electrically conductive layers.

5. The semiconductor structure of claim 3, wherein:
the vertically-extending dielectric material portion and the dielectric liner vertically extend through the contact via opening in the first electrically conductive layer;
the first electrically conductive layer has a uniform vertical thickness;
a conductive annular pad is located on and protrudes above an annular portion of the top surface of the first electrically conductive layer that laterally surrounds the contact via opening; and
the conductive layer contact via structure directly physically contacts the conductive annular pad.

6. The semiconductor structure of claim 5, wherein the conductive annular pad comprises a contoured top surface including an annular planar surface segment and a convex tapered annular surface segment that is adjoined to an inner periphery of the annular planar surface segment and having a convex vertical cross-sectional profile and an annular top-down profile.

7. The semiconductor structure of claim 3, wherein:
the dielectric liner completely fills the contact via cavity at a level of the conductive annular pad, and embeds an air gap below the first electrically conductive layer; and
a bottommost surface segment of the conductive layer contact via structure contacts a top surface of the dielectric liner.

8. The semiconductor structure of claim 2, wherein the dielectric spacer comprises an upper portion of the dielectric support pillar.

9. The semiconductor structure of claim 8, wherein the upper portion of the dielectric support pillar comprises a contoured top surface which comprises an annular topmost surface segment, a cylindrical surface segment having a top periphery that is adjoined to an outer periphery of the annular top surface segment, and a recessed annular surface segment that is adjoined to a bottom periphery of the cylindrical surface segment.

10. The semiconductor structure of claim 8, wherein the dielectric spacer protrudes into a recess in a bottom portion of the conductive layer contact via structure.

11. The semiconductor structure of claim 8, further comprising:
insulating spacers located on vertically-extending surface segments of stepped surfaces of the alternating stack; and
a dielectric etch stop layer located over horizontally-extending surface segments of the stepped surfaces and over the insulating spacers.

12. The semiconductor structure of claim 1, wherein:
the alternating stack comprises a staircase region in which lateral extents of the electrically conductive layers decrease with a vertical distance from a substrate underlying the alternating stack;
a retro-stepped dielectric material potion overlies stepped surfaces of the alternating stack that are located in the staircase region; and
the conductive layer contact via structure vertically extends through the retro-stepped dielectric material portion.

13. A method of forming a semiconductor structure, comprising:
forming an alternating stack of insulating layers and sacrificial material layers;
forming memory stack structures through the alternating stack, wherein each of the memory stack structures comprises a respective vertical semiconductor channel and a respective vertical stack of memory elements formed at levels of the sacrificial material layers;
forming a stepped via cavity through the alternating stack such that an annular surface of a first sacrificial material layer of the sacrificial material layers around the stepped via cavity is physically exposed;

forming a sacrificial annular plate by selectively growing a sacrificial plate material from the physically exposed annular surface of the first sacrificial material layer;

replacing the sacrificial material layers with electrically conductive layers and replacing the sacrificial annular plate with a conductive annular pad located on a first electrically conductive layer; and forming a conductive layer contact via structure that contacts the conductive annular pad.

14. The method of claim 13, further comprising:

forming an in-process integrated contact-and-support assembly in the stepped via cavity, wherein the in-process integrated contact-and-support assembly comprises a dielectric support pillar and a sacrificial via fill material portion; and replacing the sacrificial via fill material portion with the conductive layer contact via structure to form an integrated contact-and-support assembly comprising the dielectric support pillar and the conductive layer contact via structure.

15. The method of claim 14, further comprising:

forming stepped surfaces by patterning the alternating stack;

forming a retro-stepped dielectric material portion over the stepped surfaces of the alternating stack;

forming a via cavity through the retro-stepped dielectric material portion and the alternating stack;

isotropically expanding the via cavity by laterally recessing the retro-stepped dielectric material portion and the insulating layers selective to the sacrificial material layers to form a finned via cavity;

conformally depositing a dielectric material at peripheral portions of the finned via cavity; and anisotropically etching the dielectric material to form the stepped via cavity, wherein a remaining portion of the dielectric material comprises the dielectric support pillar.

16. The method of claim 15, further comprising:

forming a dielectric liner over the dielectric support pillar; and forming the sacrificial via fill material portion over the dielectric support pillar.

17. A method of forming a semiconductor structure, comprising:

forming an alternating stack of insulating layers and sacrificial material layers;

forming memory stack structures through the alternating stack, wherein each of the memory stack structures comprises a respective vertical semiconductor channel and a respective vertical stack of memory elements formed at levels of the sacrificial material layers;

forming stepped surfaces by patterning the alternating stack;

forming insulating spacers on vertically-extending surface segments of the stepped surfaces;

forming an etch stop layer over the insulating spacers and horizontal surface segments of the stepped surfaces;

forming a retro-stepped dielectric material portion over the etch stop layer;

forming a via cavity through the retro-stepped dielectric material portion, the etch stop layer, and the alternating stack;

isotropically expanding the via cavity by laterally recessing the retro-stepped dielectric material portion and the insulating layers selective to the sacrificial material layers to form a finned via cavity;

conformally depositing a dielectric material at peripheral portions of the finned via cavity;

anisotropically etching the dielectric material to form a stepped via cavity, wherein a remaining portion of the dielectric material comprises a finned dielectric support pillar;

replacing the sacrificial material layers with electrically conductive layers; and forming a conductive layer contact via structure that contacts a top surface of a first electrically conductive layer of the electrically conductive layers.

18. The method of claim 17, further comprising:

forming a sacrificial via fill material portion on a top surface of the finned dielectric support pillar prior to the replacing the sacrificial material layers with electrically conductive layers;

removing the sacrificial via fill material portion after the replacing the sacrificial material layers with electrically conductive layers;

anisotropically etching a portion of the finned dielectric support pillar after the removing the sacrificial via fill material portion to expose the top surface of the first electrically conductive layer, wherein the conductive layer contact via structure is formed on the annular top surface of the first electrically conductive layer.

19. The method of claim 17, wherein:

the finned dielectric support pillar partially fills a lower portion of the stepped via cavity; and a lower portion of the conductive layer contact via structure is located in the lower portion of the stepped via cavity and is surrounded by the finned dielectric support pillar.

20. The method of claim 17, wherein:

the finned dielectric support pillar completely fills a lower portion of the stepped via cavity; and the conductive layer contact via structure is located on the finned dielectric support pillar.

\* \* \* \* \*